US009206307B2

(12) United States Patent
Matsumiya et al.

(10) Patent No.: US 9,206,307 B2
(45) Date of Patent: Dec. 8, 2015

(54) METHOD OF PRODUCING STRUCTURE CONTAINING PHASE-SEPARATED STRUCTURE, METHOD OF FORMING PATTERN AND METHOD OF FORMING FINE PATTERN

(71) Applicant: Tokyo Ohka Kogyo Co., Ltd., Kawasaki-shi (JP)

(72) Inventors: Tasuku Matsumiya, Kawasaki (JP); Takehiro Seshimo, Kawasaki (JP); Ken Miyagi, Kawasaki (JP); Takaya Maehashi, Kawasaki (JP); Takahiro Dazai, Kawasaki (JP); Yoshiyuki Utsumi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/447,376

(22) Filed: Jul. 30, 2014

(65) Prior Publication Data

US 2015/0034593 A1 Feb. 5, 2015

(30) Foreign Application Priority Data

Jul. 31, 2013 (JP) .................................. 2013-159898

(51) Int. Cl.
*B05D 3/10* (2006.01)
*B44C 1/22* (2006.01)
(Continued)

(52) U.S. Cl.
CPC . *C08L 53/00* (2013.01); *B82B 3/00* (2013.01); *C09D 153/00* (2013.01); *B05D 1/185* (2013.01)

(58) Field of Classification Search
CPC ........ B05D 1/36; B05D 3/0254; B05D 3/107; B05D 3/145
USPC .......................... 216/41, 47, 58; 427/261, 264
See application file for complete search history.

(56) References Cited

U.S. PATENT DOCUMENTS 6,565,763 B1 * 5/2003 Asakawa et al. ................ 216/56
2009/0189317 A1 7/2009 Sato et al.
(Continued)

FOREIGN PATENT DOCUMENTS

JP A-2007-072374 3/2007
JP A-2007-329276 12/2007
(Continued)

OTHER PUBLICATIONS

Hinsberg et al., "Self-Assembling Material for Lithographic Patterning: Overview, Status and Moving Forward," Proceedings of SPIE, vol. 7637, 76370G-1 (2010).

*Primary Examiner* — Shamim Ahmed
(74) *Attorney, Agent, or Firm* — Knobbe Martens Olson & Bear LLP

(57) ABSTRACT

A method of producing a structure containing a phase-separated structure, including: forming a layer including a neutralization film on a substrate; forming a layer containing a block copolymer on the layer including the neutralization film, the $P_A$ block and $P_B$ block being mutually bonded in the block copolymer, and the $P_B$ block including a structural unit other than a structural unit constituting the $P_A$ block; and subjecting the layer containing the block copolymer to an annealing treatment, such that, in the case where a surface free energy of the $P_A$ block, a surface free energy of the $P_B$ block and a surface free energy of the neutralization film are represented by a coordinate point A of the $P_A$ block, a coordinate point B of the $P_B$ block and a coordinate point N of the neutralization film, respectively in the plane of coordinates, the coordinate point N of the neutralization film is within the predetermined range.

17 Claims, 9 Drawing Sheets

(51) Int. Cl.
  *C08L 53/00* (2006.01)
  *B82B 3/00* (2006.01)
  *C09D 153/00* (2006.01)
  *B05D 1/18* (2006.01)

(56) References Cited

U.S. PATENT DOCUMENTS

| | | | |
|---|---|---|---|
| 2009/0263631 A1 | 10/2009 | Sakamoto et al. | |
| 2014/0113236 A1* | 4/2014 | Senzaki et al. | 430/325 |
| 2014/0127626 A1 | 5/2014 | Senzaki et al. | |
| 2014/0127910 A1* | 5/2014 | Hieno et al. | 438/703 |
| 2014/0238954 A1* | 8/2014 | Matsumiya et al. | 216/67 |
| 2015/0031210 A1* | 1/2015 | Ban et al. | 438/703 |

FOREIGN PATENT DOCUMENTS

| | | |
|---|---|---|
| JP | A-2008-036491 | 2/2008 |
| JP | A-2008-246876 | 10/2008 |
| JP | B-5225555 | 7/2013 |
| JP | B-5227846 | 7/2013 |
| WO | WO 2012/046770 A1 | 4/2012 |
| WO | WO 2012/169620 A1 | 12/2012 |

\* cited by examiner

US 9,206,307 B2

METHOD OF PRODUCING STRUCTURE CONTAINING PHASE-SEPARATED STRUCTURE, METHOD OF FORMING PATTERN AND METHOD OF FORMING FINE PATTERN

TECHNICAL FIELD

The present invention relates to a method of producing a structure containing a phase-separated structure, a method of forming a pattern and a method of forming a fine pattern.

Priority is claimed on Japanese Patent Application No. 2013-159898, filed on Jul. 31, 2013, the content of which is incorporated herein by reference.

BACKGROUND ART

Recently, as further miniaturization of large scale integrated circuits (LSI) proceeds, a technology for processing a more delicate structure is demanded. In response to such demand, an attempt has already been started in which a fine pattern is formed using a phase-separated structure formed by self-assembly in a block copolymer containing two or more blocks are independent each other and are mutually bonded (see for example, Patent Document 1).

For using a phase separation structure of a block copolymer, it is necessary to form a self-assembly nano structure through a microphase separation only in desired regions, and arrange the nano structure in a desired direction. To achieve a desired structure having desired position and orientation, graphoepitaxy to achieve desired phase-separated pattern by a guide pattern and chemical epitaxy to achieve desired phase-separated pattern by difference in the chemical state of the substrate are proposed (see, for example, Non-Patent Document 1).

In chemical epitaxy process, a neutralization film having a predetermined pattern is disposed on the surface of a substrate, the neutralization film has affinity to any of the blocks constituting the block copolymer and contains a surface treatment agent. By virtue of the pattern of the neutralization film (i.e., guide pattern) on the surface of the substrate, the orientation of each phase of the phase-separated structure is controlled. Therefore, to form a predetermined phase-separated structure, it is important that the neutralization film is disposed in accordance with the period of a block copolymer.

As the block copolymer, a block copolymer (PS-b-PMMA) containing a block composed of a repeating unit of styrene and a block composed of a repeating unit of methyl methacrylate have been widely studied. It is considered that the PS-b-PMMA is a material applicable to the formation of the fine pattern of about 13 nm.

Recently, research is also being conducted into a method of forming a pattern in which an Si-containing block copolymer is used as a material capable of forming a pattern having a further micro dimension. The block copolymer layer formed from the Si-containing block copolymer has a low surface energy. Therefore, for the self-assembly technique in the block copolymer, it is important to optimize the surface condition of the block copolymer layer.

DOCUMENTS OF RELATED ART

Patent Document

[Patent Document 1] Japanese Unexamined Patent Application, First Publication No. 2008-36491

Non-Patent Documents

[Non-Patent Document 1] Proceedings of SPIE (U.S.), vol. 7637, pp. 76370G-1 (2010)

SUMMARY OF THE INVENTION

The present invention has an object of providing a method of producing a phase-separated structure, which may conduct good phase separation in a layer containing an Si-containing block copolymer and may form a favorable pattern.

A first aspect of the present invention is a method of producing a structure containing a phase-separated structure, including: a step in which a layer composed of a neutralization film is formed on a substrate; a step in which a layer containing a block copolymer is formed on the layer composed of the neutralization film, in the block copolymer, a $P_A$ block and a $P_B$ block are mutually bonded, and the $P_B$ block is composed of a structural unit other than a structural unit constituting the $P_A$ block; and a step in which the layer containing the block copolymer is subjected to an annealing treatment to form a structure containing a phase-separated structure, wherein, in the case where a surface free energy of the $P_A$ block, a surface free energy of the $P_B$ block and a surface free energy of the neutralization film are represented by a coordinate point A of the $P_A$ block (square root of the dispersive component $(dP_A)^{0.5}$, square root of the polar component $(pP_A)^{0.5}$), a coordinate point B of the $P_B$ block (square root of the dispersive component $(dP_B)^{0.5}$, square root of the polar component $(pP_B)^{0.5}$) and a coordinate point N of the neutralization film (square root of the dispersive component $(dP_N)^{0.5}$, square root of the polar component $(pP_N)^{0.5}$) in a plane of coordinates (square root of the dispersive component $(d)^{0.5}$, square root of the polar component $(p)^{0.5}$), when the phase-separated structure is a $P_A$ matrix cylindrical structure, the coordinate point N of the neutralization film is within the range of an ellipse $E_A$, wherein a point $O_A$ is a center of the ellipse $E_B$, the point $O_A$ divides a line segment AB in the ratio of 3:7, the line segment AB is on a minor axis of the ellipse $E_A$, and a minor radius of the ellipse $E_A$ is 0.4 times the length of the line segment AB, and a major radius of the ellipse $E_A$ is 3 times the length of the line segment AB;

when the phase-separated structure is a lamellar structure, the coordinate point N of the neutralization film is within the range of an ellipse E, wherein a point O is the center of an ellipse E, the point O divides the line segment AB in the ratio of 5:5, the line segment AB is on a minor axis of the ellipse E, and a minor radius is 0.6 times the length of the line segment AB, and a major radius is 3 times the length of the line segment AB; and when the phase-separated structure is a $P_B$ matrix cylindrical structure, the coordinate point N of the neutralization film is within the range of an ellipse $E_B$, wherein a point OB is a center of an ellipse $E_B$, the point $O_A$ divides the line segment AB in the ratio of 7:3, the line segment AB is on a minor axis of the ellipse $E_B$, and a minor radius is 0.4 times the length of the line segment AB, and a major radius is 3 times the length of the line segment AB.

A second aspect of the present invention is a method of forming a pattern including: a step in which a phase comprising at least one block is selectively removed from a structure containing a phase-separated structure to form a pattern, the structure is produced by a method of the first aspect of the present invention.

A third aspect of the present invention is a method of forming a fine pattern including: a step in which a substrate is subjected to etching treatment using a pattern as a mask, the pattern is formed by the method of forming a pattern according to the second aspect.

According to the present invention, there is provided a method of producing a phase-separated structure, which can conduct desirable phase separation in a layer containing an Si-containing block copolymer and can form a desirable pattern.

In the present description and claims, the term "aliphatic" is a relative concept used in relation to the term "aromatic", and defines a group or compound that has no aromaticity.

The term "alkyl group" refers to linear, branched or cyclic, monovalent saturated hydrocarbon, unless otherwise specified. The same applies for the alkyl group within an alkoxy group.

The term "alkylene group" refers to linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the hydrogen atom of the carboxy group in acrylic acid ($CH_2$=CH—COOH) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or an organic group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereinafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene having a substituent other than a hydroxy group bonded to the benzene ring, which may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid having a substituent other than a hydroxy group and a carboxy group bonded to the benzene ring, which may have a substituent for substituting the hydrogen atom on the α-position. Here, the α-position (carbon atom on the α-position) refers to the carbon atom having the benzene ring bonded thereto, unless specified otherwise.

The term "styrene" includes styrene itself and compounds in which the hydrogen atom at the α-position of styrene has been substituted with another substituent such as an alkyl group or a halogenated alkyl group.

A "structural unit derived from styrene or a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The term "exposure" is used as a general concept that includes irradiation with any form of radiation.

An "organic group" refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

MODE FOR CARRYING OUT THE INVENTION

<<Method of Producing Structure Containing Phase-Separated Structure>>

The method of producing a structure containing a phase-separated structure according to the first aspect of the present invention including: a step in which a layer composed of the neutralization film is formed on a substrate; a step in which a layer containing a block copolymer is formed on the layer composed of the neutralization film, in the block copolymer, $P_A$ block and $P_B$ block being mutually bonded, and the $P_B$ block being composed of a structural unit other than structural unit constituting the $P_A$ block; and a step in which the layer containing the block copolymer is subjected to an annealing treatment.

A method of producing a structure containing a phase-separated structure according to the first aspect of the present invention will be specifically explained with reference to FIG. 9. However, the present invention is not limited to these embodiments.

[Step in Which Layer Composed of Neutralization Film is Formed on Substrate]

In the method of producing a structure containing a phase-separated structure according to the first aspect of the present invention, a layer composed of a neutralization film (hereinafter, sometimes referred to as "neutralization film" or "layer composed of the undercoat agent") is formed on a substrate.

<Substrate>

Figure 9:
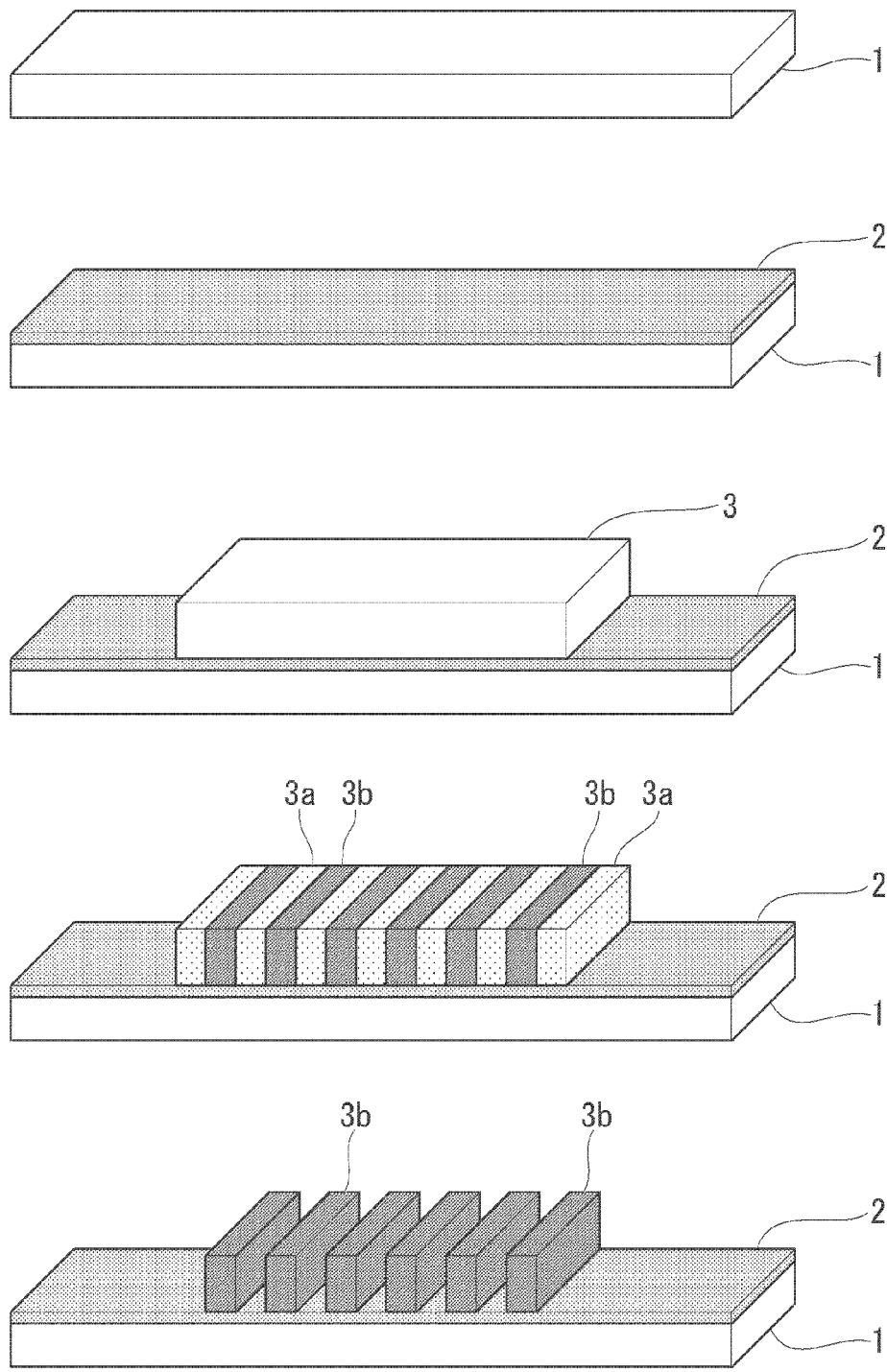
FIG. 9 is a diagram showing an example of one embodiment of the first aspect of the present invention.

In FIG. 9, the substrate 1 is not particularly limited, as long as a solution containing a block copolymer can be applied to the surface of the substrate. Examples of the substrate include a substrate constituted of an inorganic substance such as a metal (e.g., silicon, copper, chromium, iron or aluminum), glass, titanium oxide, silica or mica; and a substrate composed of an organic substance such as an acrylic plate, polystyrene, cellulose, cellulose acetate or phenol resin.

Further, the size and the shape of the substrate 1 used in the present invention is not particularly limited. The substrate 1 does not necessarily have a smooth surface, and a substrate made of various materials and having various shapes can be appropriately selected for use. For example, a multitude of shapes can be used, such as a substrate having a curved surface, a plate having a concavo-convex surface, and a thin sheet.

Further, on the surface of the substrate 1, an inorganic and/or organic film may be provided. As the inorganic film, an inorganic anti-reflection film (inorganic BARC) can be used. As the organic film, an organic anti-reflection film (organic BARC) can be used.

An inorganic film can be formed, for example, by coating an in organic anti-reflection film composition such as a silicon-based material on a substrate, followed by baking.

An organic film can be formed, for example, by dissolving a resin component and the like for forming the film in an organic solvent to obtain an organic film-forming material, coating the organic film-forming material on a substrate using a spinner or the like, and baking under heating conditions preferably in the range of 200 to 300° C. for 30 to 300 seconds, more preferably for 60 to 180 seconds. The organic film-forming material does not need to have susceptibility to light or electron beam, like as a resist film, and the organic film-forming material may or may not have such a susceptibility. More specifically, a resist or a resin generally used in the production of a semiconductor device or a liquid crystal display device can be used.

Further, it is preferable that the organic film-forming material can be subjected to etching treatment, particularly dry etching, so that, by etching treatment of the organic film using a pattern composed of a block copolymer, the pattern can be transferred to the organic film, and an organic film pattern can be formed. It is particularly desirable to use an organic film-forming material which can be subjected to oxygen plasma etching treatment or the like. As such an organic film-forming material, a material conventionally used for forming an organic film such as an organic BARC can be used. Examples of the organic film-forming material include the ARC series manufactured by Brewer Science Ltd., the AR series manufactured by Rohm and Haas Company, and the SWK series manufactured by Tokyo Ohka Kogyo Co., Ltd.

Before forming a layer 2 composed of a neutralization film on the substrate, the surface of the substrate 1 may be washed in advance. By washing the surface of the substrate, the application of an undercoat agent may be effectively performed.

As the washing treatment, a conventional method may be used, and examples thereof include an oxygen plasma treatment, an ozone oxidation treatment, an acid alkali treatment, and a chemical modification treatment.

<Layer Composed of Neutralization Film (Neutralization Film)>

With respect to the neutralization film used in the present invention, when a surface free energy of the $P_A$ block, a surface free energy of the $P_B$ block and a surface free energy of the neutralization film are respectively represented by a coordinate point A of the $P_A$ block (square root of the dispersive component $(dP_A)^{0.5}$, square root of the polar component $(pP_A)^{0.5}$), a coordinate point B of the $P_B$ block (square root of the dispersive component $(dP_B)^{0.5}$, square root of the polar component $(pP_B)^{0.5}$) and a coordinate point N of the neutralization film (square root of the dispersive component $(dP_N)^{0.5}$, square root of the polar component $(pP_N)^{0.5}$) in the plane of coordinates (square root of the dispersive component $(d)^{0.5}$, square root of the polar component $(p)^{0.5}$), the coordinate point N of the neutralization film is within the predetermined range as described below.

In the present invention, the measurement method of surface free energy (hereinafter, sometimes referred to as "SFE") is not particularly limited. As a measurement method of SFE, a method can be mentioned, in which contact angle when using ultrapure water, diiodomethane, formamide, glycerol or the like is measured to calculate surface free energy.

Figure 8:
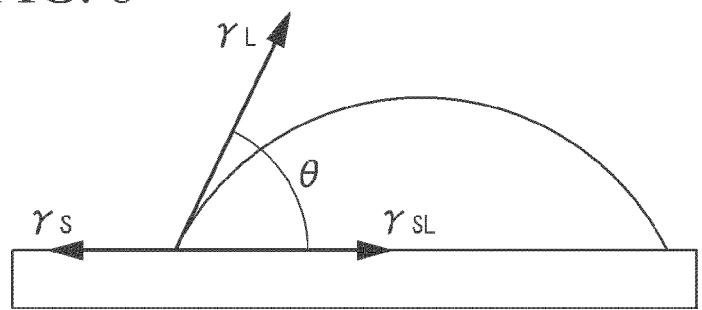
FIG. 8 is a diagram showing an explanation of a contact angle.

In the present invention, the contact angle refers to an angle between tangential line drawn to a droplet and solid surface of the neutralization film, when the droplet is disposed on the surface of the neutralization film. The angle of the side surrounding the droplet is referred to "contact angle". When the surface of the neutralization film is wet with liquid, an interface between the solid and the liquid is newly formed. When the contact angle formed by the liquid on the surface of the solid is represented by θ as shown in FIG. 8, the relationship of the surface tension of the solid $\gamma_S$, the surface tension of the liquid $\gamma_L$ and the interface tension between the solid and the liquid $\gamma_{SL}$ is represented by Young's equation.

$$\gamma_S = \gamma_{SL} + \gamma_L \cos \theta \quad (1)$$

In accordance with Dupre's equation, when work of adhesion (free energy) between liquid and solid represents $W_{SL}$, the surface free energy can be represented by the following equation (2).

$$W_{SL} = \gamma_S + \gamma_L - \gamma_{SL} \quad (2)$$

By substituting the equation (1) into the equation (2), Young-Dupre's equation (3) shown below can be derived.

$$W_{SL} = \gamma_L(1 + \cos \theta) \quad (3)$$

The wettability becomes larger as the $W_{SL}$ becomes larger. When θ is 0, wettability is enhanced, and liquid is spread on the solid surface completely. There are several equations for calculating the surface energy of solid based on the aforementioned principle.

When a dispersive component of the surface free energy of the solid is represented by $\gamma_S^d$, a polar component of the surface free energy of the solid is represented by $\gamma_S^p$, a dispersive component of the surface free energy of the liquid is represented by $\gamma_L^d$ and a liquid component of the surface free energy of the liquid is represented by $\gamma_L^p$, the interface tension between the solid and the liquid can be represented by Wu's equation as follows.

$$\gamma_{SL} = \gamma_S + \gamma_L - 4\gamma_S^d \gamma_L^d/(\gamma_S^d + \gamma_L^d) - 4\gamma_S^p \gamma_L^p/(\gamma_S^p + \gamma_L^p)$$

When a hydrogen bond component of the surface free energy of the solid is represented by $\gamma_S^h$ and a hydrogen bond component of the surface free energy of the liquid is represented by $\gamma_L^h$, the interface tension between the solid and the liquid can be represented by Kitazaki-Hata's equation as follows, $\gamma_{SL} = \gamma_S + \gamma_L - 2(\gamma_S^d \gamma_L^d)^{1/2} - 2(\gamma_S^p \gamma_L^p)^{1/2} - 2(\gamma_S^h \gamma_L^h)^{1/2}$. As described above, each component of the surface energy of the solid can be determined by measuring the contact angle using two type of liquids having a different surface tensions from each other.

In the present invention, a measurement method based on Young-Dupre's equation, a measurement method based on Wu's theory, a measurement method based on Kitazaki-Hata's equation, a measurement method based on Kaelble, Owen and Kitazaki's theory and a measurement method based on acid-base theory can be employed.

In the present invention, among these, the method for calculating the surface free energy in accordance with the measuring method based on Wu's theory is preferably used.

The surface free energy of the $P_A$ block and the surface free energy of the $P_B$ block can be calculated in accordance with the same protocol, and are respectively represented by a coordinate point A of the $P_A$ block (square root of the dispersive component $(dP_A)^{0.5}$, square root of the polar component $(pP_A)^{0.5}$) and a coordinate point B of the $P_B$ block (square root of the dispersive component $(dP_B)^{0.5}$, square root of the polar component $(pP_B)^{0.5}$) in the plane of coordinates (square root of the dispersive component $(d)^{0.5}$, square root of the polar component $(p)^{0.5}$). In the case, the contact angle refers to "angle at the crossed point of the solid surface and the tangent line drawn on the droplet, and determined from the liquid side surrounding the liquid at the intersection point of the surface of the homopolymer film and the surface of the droplets placed on the homopolymer film. The homopolymer is used for measurement of contact angle. The homopolymer refers to a polymer that is composed of the structural unit constituting the $P_A$ block, or a polymer that is composed of the structural unit constituting the $P_B$ block. The weight average molecular weight of the homopolymer contained in homopolymer film used for measuring contact angle can be appropriately determined in accordance with the molecular weight of the block copolymer or the molecular weight of the block to be used, and can be, for example, 1000 or more.

When the contact angle of the neutralization film or homopolymer film is measured, the film thickness is not particularly limited, and can be, for example, 25 nm to 50 nm.

The method of forming a layer 2 composed of the neutralization film is not particularly limited, and the layer 2 can be formed by a conventional method.

For example, the undercoat agent to form the neutralization film is applied to the substrate 1 by a conventional method such as spin coating or a method using a spinner or the like to form a coating film on the substrate 1, followed by drying, thereby forming a layer 2 composed of the neutralization film. The undercoat agent will be described later.

The neutralization film can be dried to volatilize the organic solvent contained in the neutralization film, and examples of the method for drying the neutralization film include a method of baking.

The baking temperature is preferably 80 to 300° C., more preferably 100 to 270° C., and still more preferably 120 to 250° C. The baking time is preferably 30 to 500 seconds, and more preferably 60 to 240 seconds.

When a layer 2 composed of the neutralization film is formed on the surface of a substrate 1, the surface of the substrate 1 is neutralized. As a result, when the layer 3 composed of a block copolymer is formed on the layer 2, a structure in which a specific phase composed of a specific block is attached to the surface of the substrate is not formed. As a result, by a phase separation of the layer 3 containing the block copolymer, a cylindrical structure, lamellar structure, dot structure, gyroid structure or dispersed sphere structure can be formed. These structure are multidirectionally oriented on the surface of the substrate.

After baking the layer composed of the neutralization film, if required, a step in which uncrosslinked portions in the undercoat layer (substrate non-interaction portions) is washed out by rinsing using a rinse solution such as a solvent may be employed. By the washing step, the uncrosslinked portions can be removed and therefore, a phase separation structure having a lamellar structure or a cylindrical structure oriented in the perpendicular direction to the surface of the substrate can be more reliably formed. As a rinse solution, any rinse solution can be used as long as it dissolves the uncrosslinked portions, and solvents such as PGMEA, PGME, EL and the like and a commercially available thinner solution may be used. Further, after washing step, post bake can be conducted at 80 to 150° C., so as to volatilize the rinse solution.

[Step in Which Layer Containing Block Copolymer is Formed on Layer Composed of Neutralization Film, Wherein, in the Block Copolymer, $P_A$ Block and $P_B$ Block are Mutually Bonded, and the $P_B$ Block Contains Structural Unit Other than the Structural Unit Constituting $P_A$ Block]

The method of producing a structure containing a phase-separated structure according to the first aspect of the present invention includes a step in which layer containing block copolymer is formed on layer composed of neutralization film, wherein, in the block copolymer, $P_A$ block and $P_B$ block are mutually bonded, and the $P_B$ block contains structural unit other than the structural unit constituting $P_A$ block.

<Block Copolymer>

In the present invention, as the block copolymer, a copolymer is used, in which $P_A$ block and $P_B$ block are mutually bonded, and the $P_B$ block contains structural unit other than the structural unit constituting $P_A$ block. The block constitutes a part of the block copolymer, and is composed one type of structural unit. As the blocks constituting the block copolymer, 2 types of blocks is preferably used.

In the present invention, the blocks ($P_A$ block and $P_B$ block) constituting the block copolymer are not particularly limited, as long as they are combinations to ensure phase separation. However, it is preferable to employ a combination of blocks which are mutually incompatible. Further, it is preferable to employ a combination in which a phase of at least one block ($P_A$ block or $P_B$ block) constituting the block copolymer may be selectively removed, and other block is remained. As a combination of the blocks, such that at least one phase of block can be selectively removed, a block copolymer (in which one or more blocks have been mutually bonded) that has an etching selection ratio of 1 or more can be mentioned.

In the present invention, a "period of a block copolymer" refers to a period of a phase structure which is observed when a phase-separated structure is formed, and the period is a sum of the lengths of the phases which are mutually incompatible. The period of a block copolymer corresponds to the length of one molecule of the block copolymer.

The period of a block polymer is determined by intrinsic polymerization properties such as the polymerization degree N and the Flory-Huggins interaction parameter $\chi$. Specifically, the repulsive interaction between each block in a block copolymer becomes larger as the "$\chi N$" becomes larger. Therefore, when $\chi N > 10$ (hereinafter, referred to as "strong segregation limit"), a phase separation is more likely to proceed between different blocks in the block copolymer. At the strong segregation limit, the period of the block copolymer is approximately $N^{2/3}\chi^{1/6}$. That is, the period of the block copolymer is in proportion to the polymerization degree N which correlates with the molecular weight Mn and molecular weight ratio of blocks. Therefore, by adjusting the composition and the total molecular weight of the block copolymer to be used, the block copolymer having a desirable period may be achieved.

Examples of the block copolymers include a block copolymer having a block of a structural unit containing an aromatic group and a block of a structural unit derived from (α-substituted) acrylate ester, wherein the blocks are mutually bonded; a block copolymer having a block of a structural unit containing an aromatic group and a block of a structural unit derived from (α-substituted) acrylic acid, wherein the blocks are mutually bonded; a block copolymer having a block of a structural unit containing an aromatic group and a block of a structural unit derived from siloxane or a derivative thereof, wherein the blocks are mutually bonded; a block copolymer having a block of a structural unit derived from an alkyleneoxide and a block of a structural unit derived from (α-substituted) acrylate ester, wherein the blocks are mutually bonded; a block copolymer having a block of a structural unit derived from an alkyleneoxide and a block of a structural unit derived from (α-substituted) acrylic acid, wherein the blocks are mutually bonded; a block copolymer having a block of a structural unit containing a polyhedral oligomeric silsesquioxane structure and a block of a structural unit derived from (α-substituted) acrylate ester, wherein the blocks are mutually bonded; a block copolymer having a block of a structural unit containing a polyhedral oligomeric silsesquioxane structure and a block of a structural unit derived from (α-substituted) acrylic acid, wherein the blocks are mutually bonded; and a block copolymer having a block of a structural unit containing a polyhedral oligomeric silsesquioxane structure and a block of a structural unit derived from siloxane or a derivative thereof, wherein the blocks are mutually bonded.

Hereinbelow, in the case where the block including a structural unit containing a polyhedral oligomeric silsesquioxane structure (in particular, a structural unit represented by general formula (a0-1)) is used as $P_A$ block, and the block containing a structural unit other than the structural unit containing a polyhedral oligomeric silsesquioxane structure is used as $P_B$ block will be described later. However, the combination of $P_A$ block and $P_B$ block is not limited to the combination.

{$P_A$ Block Containing Structural Unit Represented by General Formula (a0-1)}

Hereinafter, a $P_A$ containing a structural unit represented by general formula (a0-1) will be described. The general formula (a0-1) is shown below.

[Chemical Formula 1]

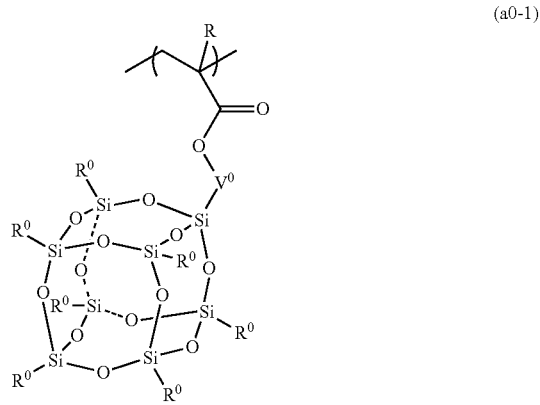

(a0-1)

In the formula, R represents a hydrogen atom, an alkyl group of 1 to 5 carbon atoms or a halogenated alkyl group of 1 to 5 carbon atoms; and $V^0$ represents a divalent hydrocarbon group which may have a substituent; and $R^0$ represents a monovalent hydrocarbon group which may have a substituent, wherein the plurality of $R^0$ may be the same or different from each other.

In general formula (a1-0), as the alkyl group of 1 to 5 carbon atoms represented by R, a linear or branched alkyl group of 1 to 5 carbon atoms is preferable, and specific examples include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a0-1), the monovalent hydrocarbon group for $R^0$ preferably has 1 to 20 carbon atoms, more preferably 1 to 10, and still more preferably 1 to 8. Here, the number of carbon atoms within a substituent(s) described later is not included in the number of carbon atoms of the hydrocarbon group.

The monovalent hydrocarbon group for $R^0$ may be either an aliphatic hydrocarbon group or an aromatic hydrocarbon group, an aliphatic hydrocarbon group is preferable, and a monovalent saturated aliphatic hydrocarbon group (i.e., alkyl group) is more preferable.

As specific examples of the alkyl group, a chain-like aliphatic hydrocarbon group (e.g., a linear or branched alkyl group), and an aliphatic hydrocarbon group containing a ring in the structure thereof can be given.

The linear alkyl group preferably has 1 to 8 carbon atoms, more preferably 1 to 5, and most preferably 1 to 3. Specific examples include a methyl group, an ethyl group, an n-propyl group, an isopropyl group, an n-butyl group, an isobutyl group and an n-pentyl group. Among these, a methyl group, an ethyl group or an n-propyl group is preferable, and a methyl group, an ethyl group or an isobutyl group is preferable, an ethyl group or an isobutyl group is more preferable, and an ethyl group is particularly preferable.

The branched alkyl group preferably has 3 to 5 carbon atoms. Specific examples of such branched alkyl groups include an isopropyl group, an isobutyl group, a tert-butyl group, an isopentyl group and a neopentyl group, and an isopropyl group or a tert-butyl group is particularly desirable.

As examples of the hydrocarbon group containing a ring in the structure thereof, a cyclic aliphatic hydrocarbon group (a group in which one hydrogen atom has been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 8 carbon atoms, and more preferably 4 to 6 carbon atoms. The cyclic aliphatic hydrocarbon group may be either a polycyclic group or a monocyclic group. As the monocyclic group, a group in which one or more hydrogen atoms have been removed from a monocycloalkane of 3 to 6 carbon atoms is preferable. Examples of the monocycloalkane include cyclopentane and cyclohexane. As the polycyclic group, a group in which one or more hydrogen atoms have been removed from a polycycloalkane of 7 to 12 carbon atoms is preferable. Examples of the polycycloalkane include adamantane, norbornane, isobornane, tricyclodecane and tetracyclododecane.

The chain-like aliphatic hydrocarbon group may have a substituent. Examples of the substituent include a fluorine atom, a fluorinated alkyl group of 1 to 5 carbon atoms, and an oxygen atom (=O).

The cyclic aliphatic hydrocarbon group may have a substituent. Examples of the substituent include an alkyl group of 1 to 5 carbon atoms, a fluorine atom, a fluorinated alkyl group of 1 to 5 carbon atoms, and an oxygen atom (=O).

When the monovalent hydrocarbon group for $R^0$ is an aromatic hydrocarbon group, the aromatic hydrocarbon group is a monovalent hydrocarbon group having at least one aromatic ring.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and particularly preferably 6 to 12. Here, the number of carbon atoms within a substituent(s) described later is not included in the number of carbon atoms of the aromatic ring.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group.

The alkylene group which is bonded to the aforementioned aryl group or heteroaryl group preferably has 1 to 4 carbon atoms, more preferably 1 or 2 carbon atoms, and particularly preferably 1 carbon atom.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

In the aforementioned formula (a0-1), the divalent hydrocarbon group for $V^0$ may be either an aliphatic hydrocarbon group or an aromatic hydrocarbon group. An "aliphatic hydrocarbon group" refers to a hydrocarbon group that has no aromaticity.

The aliphatic hydrocarbon group as the divalent hydrocarbon group for $V^0$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3. As the linear aliphatic hydrocarbon group, a linear alkylene group is preferable, and specific examples include a methylene group [—$CH_2$—], an ethylene group [—($CH_2$)$_2$—], a trimethylene group [—($CH_2$)$_3$—], a tetramethylene group [—($CH_2$)$_4$—] and a pentamethylene group [—($CH_2$)$_5$—].

As the branched aliphatic hydrocarbon group, a branched alkylene group is preferable, and specific examples include alkylalkylene groups, e.g., alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)

$CH_2CH_2$—. As the alkyl group within the alkylalkylene group, a linear alkyl group of 1 to 5 carbon atoms is preferable.

As examples of the aliphatic hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed within a linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane.

As the polycyclic alicyclic hydrocarbon group, a group in which two hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20, still more preferably 6 to 15, and particularly preferably 6 to 12. Here, the number of carbon atoms within a substituent(s) described later is not included in the number of carbon atoms of the aromatic ring.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom has been removed from the aforementioned aromatic hydrocarbon ring or aromatic hetero ring and one hydrogen atom thereof has been substituted with an alkylene group (a group in which one hydrogen atom has been removed from the aryl group in the aforementioned arylalkyl group such as a benzyl group, a phenethyl group, a 1-naphthylmethyl group, a 2-naphthylmethyl group, a 1-naphthylethyl group, or a 2-naphthylethyl group).

The alkylene group which is bonded to the aforementioned aryl group or heteroaryl group preferably has 1 to 4 carbon atoms, more preferably 1 or 2 carbon atoms, and particularly preferably 1 carbon atom.

Specific examples of structural units represented by the general formula (a0-1) are shown below. In the formulas shown below, $R^\alpha$ represents a hydrogen atom, a methyl group or a trifluoromethyl group.

[Chemical Formula 2]

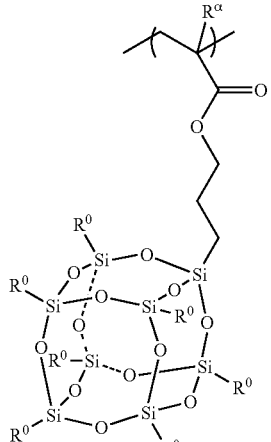

(a0-1-1)

$R^0$ = ethyl group of isobutyl group

In the block copolymer, when the $P_A$ block contains the structural unit represented by the general formula (a0-1), although it depends on the molecular weight of other structural unit described later, the amount of the structural unit represented by the general formula (a0-1) is preferably 0.1 to 50 mol %, more preferably 0.5 to 40 mol % and still more preferably 1 to 30 mol %. When the structural unit of $P_A$ block is at least as large as the lower limit of the above-mentioned range, phase separation is reliably proceed. On the other hand, when the amount of the structural unit represented by the general formula (a0-1) is no more than the upper limit of the above-mentioned range, a good balance with the other structural units can be reliably achieved.

When the amount of the structural unit constituting the $P_A$ block based on the combined total of all structural units constituting the block copolymer is preferably 0.5 to 10 mol %, and more preferably 1 to 9 mol %, a lamellar phase-separated structure may be obtained. When the amount is preferably 10 to 35 mol %, more preferably 12 to 30 mol %, and still more preferably 12 to 27 mol %, a cylindrical phase-separated structure may be obtained.

When the structural unit other than the structural unit represented by the general formula (a0-1) is used as the structural unit constituting the $P_A$ block, and the structural unit other than the structural unit of the $P_A$ block is used as the structural unit constituting the $P_B$ block, the molar ratio of the structural unit constituting the $P_A$ can be appropriately determined based on the volume fraction of each of phase-separated structures described later, and the molar ratio of the structural unit constituting the $P_B$ block can be determined in the same manner. In the block copolymer, when the $P_A$ block contains the structural unit other than the structural unit represented by the general formula (a0-1), although it depends on the molecular weight of other structural unit described later, the amount of the structural unit other the structural unit represented by the general formula (a0-1) is preferably 0.1 to 50 mol %, more preferably 0.5 to 40 mol % and still more preferably 1 to 30 mol %.

When $P_A$ block is composed of the structural unit other than the structural unit represented by the general formula (a0-1), the $P_A$ block is preferably a block containing the structural units derived from styrene or a derivative thereof, a block containing the structural unit derived from (α-substituted) acrylic acid, a block containing the structural unit derived from (α-substituted) acrylate ester, a block containing the structural unit derived from siloxane or a derivative thereof, or a block containing the structural unit derived from an alkyleneoxyde or a derivative thereof described later.

{$P_B$ Block Containing Structural Unit Other Than Structural Unit Constituting $P_A$ Block}

In the present invention, the block copolymer contains $P_B$ block other than $P_A$ block. $P_B$ block contains a structural unit other than the structural unit constituting $P_A$ block.

When $P_A$ block is composed of the structural unit represented by the general formula (a0-1), the block other than the $P_A$ block is preferably a block composed of the structural units derived from styrene or a derivative thereof, a block composed of the structural unit derived from (α-substituted) acrylic acid, a block composed of the structural unit derived from (α-substituted) acrylate ester, a block composed of the structural unit derived from siloxane or a derivative thereof, or a block composed of the structural unit derived from an alkyleneoxyde or a derivative thereof.

Examples of the derivative of styrene include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, trimethylsilylstyrene, 4-vinylbenzylchloride, 1-vinylnaphthalene, 4-vinylbiphenyl, 1-vinyl-2-pyrolidone, 9-vinylanthracene, and vinylpyridine.

The (α-substituted) acrylic acid refers to a compound that includes acrylic acid having a hydrogen atom bonded to the α-position and/or acrylic acid having a substituent bonded to the α-position. As an example of such a substituent, an alkyl group of 1 to 5 carbon atoms can be given.

An example of an (α-substituted) acrylic acid includes acrylic acid and methacrylic acid.

The (α-substituted) acrylate ester refers to a compound that includes acrylate ester having a hydrogen atom bonded to the α-position and/or acrylate ester having a substituent bonded to the α-position. As an example of such a substituent, an alkyl group of 1 to 5 carbon atoms can be given.

Specific examples of the (α-substituted) acrylate ester include acrylic acid ester such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethyl acrylate and trimethoxysilylpropyl acrylate; and methacrylic acid ester such as methyl methacrylate, ethyl methacrylate, propyl methacrylate, n-butyl methacrylate, t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethyl methacrylate and trimethoxysilylpropyl methacrylate.

Among these, methyl acrylate, ethyl acrylate, t-butyl acrylate, methyl methacrylate, ethyl methacrylate and t-butyl acrylate are preferable.

Examples of the siloxane and the derivative thereof include dimethylsiloxane, diethylsiloxane, diphenylsiloxane, and methylphenylsiloxane.

Examples of the alkylene oxide include ethylene oxide, propylene oxide, isopropylene oxide and butylene oxide.

When $P_A$ block is composed of the structural unit represented by the general formula (a0-1), the block other than $P_A$ block is preferably a block containing the structural unit derived from (α-substituted) acrylic acid or a block containing the structural unit derived from (α-substituted) acrylate ester.

When $P_A$ block contains the structural unit other than the structural unit represented by the general formula (a0-1), the block other than the $P_A$ block is preferably a block containing the structural units derived from styrene or a derivative thereof, a block containing the structural unit derived from (α-substituted) acrylic acid, a block containing the structural unit derived from (α-substituted) acrylate ester, a block containing the structural unit derived from siloxane or a derivative thereof, or a block containing the structural unit derived from an alkyleneoxyde or a derivative thereof. Among these, the block containing the structural unit derived from the (α-substituted) acrylic acid and a block containing the structural unit derived from the (α-substituted) acrylate ester are preferable.

In the block copolymer, the amount of the structural unit other than the structural unit constituting the $P_A$ block based on the combined total of all structural units constituting the block copolymer is preferably 10 to 99.5 mol %, more preferably 15 to 99 mol %, and still more preferably 20 to 98 mol %.

When the structural unit derived from (α-substituted) acrylic acid or the structural unit derived from (α-substituted) acrylate ester is used as the structural unit other than the structural unit constituting the $P_A$ block, the amount of the structural unit derived from (α-substituted) acrylic acid or the structural unit derived from (α-substituted) acrylate acid ester (provided that, in the case where the both structural units is included, the total amount of these structural units) based on the combined total of all structural units constituting the block copolymer is preferably 10 to 99 mol %, more preferably 15 to 99 mol %, and still more preferably 20 to 98 mol %.

When the amount of the structural unit other than the structural unit constituting the $P_A$ block is within the above-mentioned range, a good balance can be reliably achieved with the $P_A$ block.

The block copolymer used in the present invention has $P_A$ block and $P_B$ block. It is preferable that the combination of $P_A$ block and $P_B$ block is a combination of at least two blocks selected from the group consisting of a block (B1) composed of the structural unit represented by the formula (a0-1) (hereinafter, sometimes referred to as "(a0-1) block"), a block (B2) composed of the structural unit derived from styrene or a derivative thereof and a block (B3) composed of the structural unit derived from (α-substituted) acrylate ester. In particular, a block copolymer having the block (B1) and the block (B3), and a block copolymer having the block (B2) and a block (B3) are preferable.

Specific examples of the block copolymers include a block copolymer having a (a0-1) block and a block of poly(methyl methacrylate); a block copolymer having a (a0-1) block and a block of polystyrene; a block copolymer having a (a0-1) block and a block of a structural unit derived from acrylic acid; a block copolymer having a (a0-1) block and a block of a structural unit derived from methyl acrylate; a block copolymer having a (a0-1) block and a block of a structural unit derived from ethyl acrylate; a block copolymer having a (a0-1) block and a block of a structural unit derived from t-butyl acrylate; a block copolymer having a (a0-1) block and a block of a structural unit derived from methacrylic acid; a block copolymer having a (a0-1) block and a block of a structural unit derived from methyl methacrylate; a block copolymer having a (a0-1) block and a block of a structural unit derived from ethyl methacrylate; a block copolymer having a (a0-1) block and a block of a structural unit derived from t-butyl methacrylate; a block of polystyrene and a block of a structural unit derived from methyl methacrylate; a block copolymer having a block of polystyrene and a block of poly(trimethylsilylstyrene); a block copolymer having a block of poly(methyl methacrylate) and a block of poly(t-butylstyrene); and a block copolymer having a block of poly(methyl methacrylate) and a block of poly(trimethylsilylstyrene).

In the present invention, it is preferable to use a block copolymer having a (a0-1) block and a block of poly(methyl methacrylate); a block copolymer having a (a0-1) block and a block of polystyrene; and a block copolymer having a block of polystyrene and a block of poly(methyl methacrylate); a block copolymer having a block of polystyrene and a block of poly(trimethylsilylstyrene); a block copolymer having a block of poly(methyl methacrylate) and a block of poly(t-butylstyrene); or a block copolymer having a block of poly(methyl methacrylate) and a block of poly(trimethylsilylstyrene).

The weight average molecular weight (Mw) (the polystyrene equivalent value determined by gel permeation chromatography) of the block copolymer is not particularly limited as long as it is large enough to proceed phase separation. The weight average molecular weight is preferably 1000 to 150000, more preferably 3000 to 100000, and still more preferably 5000 to 80000.

The polydispersity (Mw/Mn) of the block copolymer is preferably 1.0 to 3.0, more preferably 1.0 to 1.5, and still more preferably 1.0 to 1.2. Here, Mn is the number average molecular weight.

The period of the pattern size to be formed by the block copolymer is preferably 5 to 120 nm, more preferably 5 to 100 nm, and still more preferably 10 to 80 nm.

Organic Solvent

As an organic solvent used in a block copolymer solution (i.e., a composition containing a block copolymer), any organic solvents can be used, as long as it dissolves the block copolymer so as to give a uniform solution. Examples the organic solvent include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, PGMEA, PGME, cyclohexanone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the organic solvent in the block copolymer solution, a mixed solvent of γ-butyrolactone with PGMEA, EL or the aforementioned mixed solvent of PGMEA with a polar solvent, is also preferable. The mixing ratio (former: latter) of such a mixed solvent is preferably from 70:30 to 95:5.

If desired, other miscible additives can also be added to the block copolymer solution. Examples of such miscible additives include additive resins for improving the performance of the pattern composed of the neutralization film described later, surfactants for improving the applicability, dissolution inhibitors, plasticizers, stabilizers, colorants, halation prevention agents, dyes, sensitizers, base amplifiers and basic compound.

The method of forming a layer containing a block copolymer in which $P_A$ block and $P_B$ block have been mutually bonded (wherein the $P_B$ is composed of the structural unit other than the structural unit constituting the PA block) on the layer 2 composed of the neutralization film is not particularly limited, and for example, a method in which a composition containing a block copolymer is applied onto the layer 2 composed of the neutralization film can be used. As the method of applying, the same method as those described above for applying the undercoat agent can be used.

In the present invention, the lower limit of the thickness of the layer 3 containing the block copolymer is not particularly limited, as long as it is sufficient to conduct phase separation. Taking into consideration of the size of period of phase separation structure to be formed and the uniformity of the nano structure, the thickness of the layer is preferably 5 nm or more, and more preferably 10 nm or more.

[Step in which Layer Containing Block Copolymer is Subjected to Annealing Treatment]

With respect to the phase separation of the layer 3 containing the block copolymer, the substrate 1 on which the layer 3 containing the block copolymer and the layer 2 composed of the neutralization film have been formed, is subjected to an annealing treatment (a heat treatment). Then, the block is selectively removed from the block copolymer, and a phase separation structure in which at least a part of the surface of the substrate is exposed is formed. The heat treatment is preferably conducted at a temperature at least as high as the glass transition temperature of the block copolymer used but is conducted at a temperature lower than the heat decomposition temperature. In general, the heat treatment is preferably conducted at 180 to 270° C. and 30 seconds to 3600 seconds (i.e., 60 minutes). When POSS-PMMA (Mw: 40 k to 20 k) is used as a block copolymer, the condition can be applied.

Further, the heat treatment is preferably conducted in a low reactive gas such as nitrogen.

<When Phase-Separated Structure is $P_A$ Matrix Cylindrical Structure>

In the present invention, "$P_A$ matrix cylindrical structure" refers to a structure in which $P_B$ block forms a cylindrical structure, and the cylindrical structures are oriented periodically, and the $P_A$ block is formed a matrix surrounding the cylindrical structure.

In the case where the phase-separated structure is a $P_A$ matrix cylindrical structure, it is preferable that, as shown in Table. 1, the coordinate point N of the neutralization film is within the range of the ellipse $E_A$, wherein the ellipse $E_A$ has the point $O_A$ as a center of the ellipse $E_A$, the point $O_A$ divides the line segment AB in the length ratio of 3:7, the line segment AB is drawn by joining a coordinate point A (square root of dispersive component $(dP_A)^{0.5}$, square root of polar component $(pP_A)^{0.5}$) and a coordinate point B (square root of dispersive component $(dP_B)^{0.5}$, square root of polar component $(pP_B)^{0.5}$), the line segment AB is on the minor axis, and the minor radius is 0.4 times the length of the line segment AB, and the major radius is 3 times the length of the line segment AB. Provided that, the coordinates of each block is an integral number (hereinafter the same in the present specification).

Figure 1:
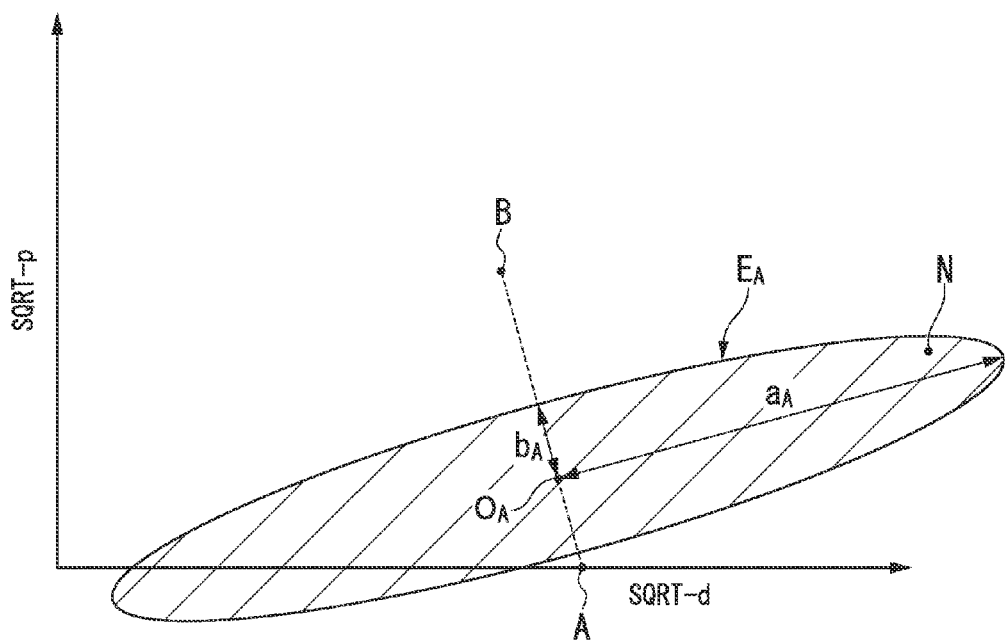
FIG. 1 is a diagram showing an example of one embodiment of the first aspect of the present invention.

In FIG. 1, the minor radius ($2b_A$) of the ellipse $E_A$ is 0.4 times the length of the line segment AB, and the major radius ($2a_A$) of the ellipse $E_A$ is 3 times the length of the line segment AB.

In the present invention, it is preferable that the coordinate portion N of the neutralization film is within the range of the ellipse $E_A$ in which the major radius ($2a_A$) is 0.5 to 2.8 times the length of the line segment AB; it is more preferable that the coordinate portion N of the neutralization film is within the range of the ellipse $E_A$ in which the major radius $2a_A$ is 0.5 to 2.5 times the length of the line segment AB; it is still more preferable that the coordinate portion N of the neutralization film is within the range of the ellipse $E_A$ in which the major radius $2a_A$ is 0.75 to 2 times the length of the line segment AB; and it is particularly preferable that the coordinate portion N of the neutralization film is within the range of the ellipse $E_A$ in which the major radius $2a_A$ is 0.75 to 1.5 times the length of the line segment AB. In the present invention, it is preferable that the coordinate point N of the neutralization film is on the minor radius ($2b_A$) of the ellipse $E_A$.

In the present invention, it is presumed that, when the coordinate point N of the neutralization film is in the aforementioned range, the affinity between the neutralization film and the $P_A$ block can be enhanced, and the $P_A$ matrix cylindrical structure can be reliably formed, in which the cylindrical structure of the $P_B$ block is oriented in the perpendicular direction relative to the substrate.

In the present invention, when the volume fraction of the $P_B$ block within the block copolymer is rendered smaller than that of the $P_A$ block, a $P_A$ matrix cylindrical structure in which the phase of the $P_B$ block having a cylindrical structure is surrounded by the phase of the $P_A$ block can be formed.

More specifically, it is preferable that the volume ratio between the $P_B$ block and the $P_A$ block within the block copolymer, represented by [the volume of $P_A$ block]:[the volume of the $P_B$ block] is 80:20 to 70:30.

<When Phase-Separated Structure is Lamellar Structure>

Figure 2:
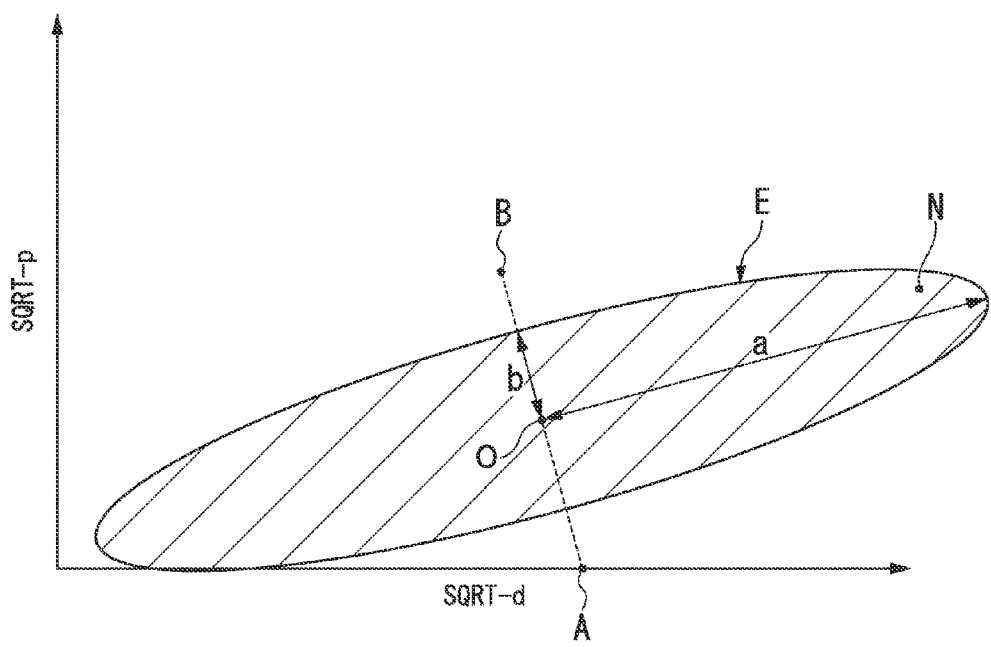
FIG. 2 is a diagram showing an example of one embodiment of the first aspect of the present invention.

In the case where the phase-separated structure is a lamellar structure, it is preferable that, as shown in FIG. 2, the coordinate point N of the neutralization film is within the range of the ellipse E, wherein the ellipse E has the point O as a center of the ellipse E, the point O divides the line segment AB into the length ratio of 5:5, the line segment AB is on the minor axis of the ellipse E, and the minor radius of the ellipse E is 0.6 times the length of the line segment AB, and the major radius of the ellipse E is 3 times the length of the line segment AB.

In the present invention, it is preferable that the coordinate portion N of the neutralization film is within the range of the ellipse E in which the major radius ($2a$) is 0.5 to 2.8 times the length of the line segment AB, it is more preferable that the coordinate portion N of the neutralization film is within the range of the ellipse E in which the major radius $2a$ is 0.5 to 2.5 times the length of the line segment AB, it is still more preferable that the coordinate portion N of the neutralization film is within the range of the ellipse E in which the major radius $2a$ is 0.75 to 2 times the length of the line segment AB, and it is particularly preferable that the coordinate portion N of the neutralization film is within the range of the ellipse E in which the major radius $2a$ is 0.75 to 1.5 times the length of the line segment AB. In the present invention, it is preferable that the coordinate point N of the neutralization film is on the minor radius ($2b$) of the ellipse E.

In the present invention, it is presumed that, when the coordinate point N of the neutralization film is in the aforementioned range, a good balance of the affinity between the neutralization film and the $P_A$ block and the affinity between the neutralization film and the $P_B$ block can be achieved, and the phase-separated structure containing a lamellar structure that is oriented in the perpendicular direction relative to the substrate can be reliably formed.

In the present invention, it is preferable that the volume of the $P_B$ block within the block copolymer is rendered substantially the same volume as the $P_A$ block, such that a lamellar structure in which the phase of the $P_A$ block and the phase of the $P_B$ block are alternately-arranged can be formed.

More specifically, it is preferable that the volume ratio between the $P_B$ block and the $P_A$ block within the block copolymer, represented by [the volume of $P_A$ block]:[the volume of the $P_B$ block] is 60:40 to 40:60.

<When Phase-Separated Structure is $P_B$ Matrix Cylindrical Structure>

In the present invention, "$P_B$ matrix cylindrical structure" refers to a structure in which $P_A$ block forms a cylindrical structure, and the cylindrical structure are arranged at regular intervals, and the $P_B$ block forms a matrix surrounding the cylindrical structure.

Figure 3:
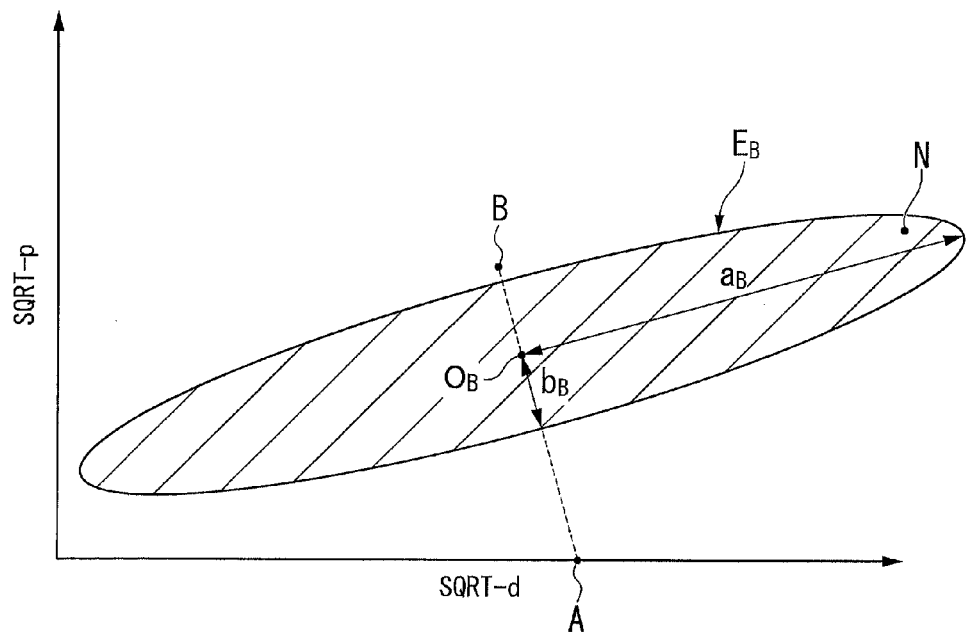
FIG. 3 is a diagram showing an example of one embodiment of the first aspect of the present invention.

In the case where the phase-separated structure is a $P_B$ matrix cylindrical structure, it is preferable that, as shown in FIG. 3, the coordinate point N of the neutralization film is within the range of the ellipse $E_B$, wherein the ellipse $E_B$ has the point OB as a center of the ellipse, the point OA divides the line segment AB into the length ratio of 7:3, the line segment AB is on the minor axis, and the minor radius is 0.4 times the length of the line segment AB, and the major radius is 3 times the length of the line segment AB.

In the present invention, it is preferable that the coordinate portion N of the neutralization film is within the range of the ellipse $E_B$ in which the major radius ($2a_B$) is 0.5 to 2.8 times the length of the line segment AB, it is more preferable that the coordinate portion N of the neutralization film is within the range of the ellipse $E_B$ in which the major radius $2a_B$ is 0.5 to 2.5 times the length of the line segment AB, it is still more preferable that the coordinate portion N of the neutralization film is within the range of the ellipse $E_B$ in which the major radius $2a_B$ is 0.75 to 2 times the length of the line segment AB, and it is particularly preferable that the coordinate portion N of the neutralization film is within the range of the ellipse $E_B$ in which the major radius $2a_B$ is 0.75 to 1.5 times the length of the line segment AB. In the present invention, it is preferable that the coordinate point N of the neutralization film is on the minor radius ($2b_B$) of the ellipse E.

In the present invention, it is presumed that, when the coordinate point N of the neutralization film is in the aforementioned range, the affinity between the neutralization film and the $P_B$ block can be enhanced, and the $P_B$ matrix cylindrical structure can be reliably formed, in which the cylindrical structure of the $P_A$ block is oriented in the perpendicular direction relative to the substrate.

In the present invention, when the volume of the $P_A$ block within the block copolymer is rendered smaller than that of the $P_B$ block, a $P_B$ matrix cylindrical structure in which the phase of the $P_A$ block having a cylindrical structure is within the phase of the $P_B$ block can be formed.

More specifically, it is preferable that the volume ratio between the $P_B$ block and the $P_A$ block within the block copolymer, represented by [the volume of $P_A$ block]:[the volume of the $P_B$ block] is 20:80 to 30:70.

In the present invention, the length of the line segment AN in the plane of coordinates is at least 0.1 times the length of the length of the line segment AB. By virtue of the length of the line segment AB at least 0.1 times longer than the length of the line segment AB, that is, by virtue of the differences between the surface free energy of the neutralization film and the surface free energy of the $P_A$ block, it becomes suitable condition to form a phase-separated structure in which the block is oriented in the perpendicular direction to the substrate.

The length of the line segment BN in the plane of coordinates is at least 0.1 times the length of the length of the line segment AB. By virtue of the length of the line segment BN at least 0.1 times the length of the length of the line segment AB, that is, by virtue of the differences between the surface free energy of the neutralization film and the surface free energy of the $P_B$ block, it becomes suitable condition to form a phase-separated structure in which the block is oriented in the perpendicular direction.

<Undercoat Agent>

In order to form a layer composed of a neutralization film such that the coordinate point N of the neutralization film is present within the range of each of the ellipses, as the undercoat agent to form the neutralization film, an undercoat agent containing the following resin component is preferably used.

Resin Component (A)

The resin component (A) preferably contains a structural unit (I) that contributes to a surface free energy, and a structural unit (II) that contains a substrate interaction group. It is presumed that the structural unit (II) slightly contributes to the surface free energy of the neutralization film, since the structural unit (II) is a structural unit to promote the interaction between the substrate and the neutralization film (e.g., adhesion, crosslinking and the like) with the substrate.

In the present description and claims, the term "resin component" refers to a polymer having a molecular weight of 1,000 or more. As the molecular weight of the polymer, the weight average molecular weight in terms of the polystyrene equivalent value determined by gel permeation chromatography (GPC) is used.

Structural Unit (I) that Contributes to Surface Free Energy

As the structural unit (I), the same structural units as those described above for the structural unit constituting the $P_A$ block or the $P_B$ block can be mentioned. Specific examples include structural units represented by general formulae (ba0-1) and (ba0-2) shown below.

[Structural Unit Represented by General Formula (ba0-1)]

Hereinafter, a structural unit represented by general formula (ba0-1) (hereinafter, referred to as "structural unit (ba0-1)") will be described.

The general formula (ba0-1) is shown below.

[Chemical Formula 3]

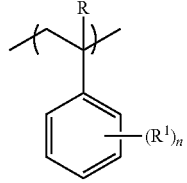

(ba0-1)

In general formula (ba0-1), R represents a hydrogen atom, an alkyl group of 1 to 5 carbon atoms or a halogenated alkyl group of 1 to 5 carbon atoms; $R^1$ represents a halogen atom or an organic group selected from a linear, branched or cyclic organic group of 1 to 20 carbon atoms which may contain an oxygen atom, halogen atom or silicon atom and a combination of these groups; and n represents an integer of 0 to 5.

In general formula (ba0-1), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (ba0-1), $R^1$ represents a halogen atom or an organic group selected from a linear, branched or cyclic organic group of 1 to 20 carbon atoms, which may contain an oxygen atom, halogen atom or silicon atom, or a combination of these organic groups.

Examples of the halogen atom for $R^1$ include a fluorine atom, a chlorine atom and a bromine atom, and a fluorine atom is preferable.

As the organic group for $R^1$, a linear, branched, or cyclic alkyl group or aryl group is preferable.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. As the alkyl group, a partially or completely fluorinated alkyl group (hereinafter, sometimes referred to as a "fluorinated alkyl group"), and an alkylsilyl group, an alkylsilyloxy group or alkoxy group in which a terminal carbon atom of the alkyl group has been substituted with a silicon atom or oxygen atom can be mentioned. The "partially fluorinated alkyl group" refers to an alkyl group in which part of the hydrogen atoms are substituted with fluorine atoms and the "completely fluorinated alkyl group" refers to an alkyl group in which all of the hydrogen atoms are substituted with fluorine atoms.

The aryl group preferably has 4 to 20 carbon atoms, more preferably 4 to 10 carbon atoms, and most preferably 6 to 10 carbon atoms.

As R¹, a linear or branched alkyl group of 1 to 4 carbon atoms having no substituent, a linear or branched alkoxy group of 1 to 4 carbon atoms, a fluorinated alkyl group of 1 to 4 carbon atoms, an alkylsilyl group of 1 to 6 carbon atoms, an alkysilyloxy group of 1 to 6 carbon atoms or an aryl group of 6 to 10 carbon atoms is particularly desirable.

As the linear or branched alkyl group of 1 to 4 carbon atoms which does not have a substituent, a methyl group, an ethyl group, an isopropyl group or a t-butyl group is preferable. Among these, as R¹, a t-butyl group is particularly preferable.

Examples of the linear or branched alkoxy group of 1 to 4 carbon atoms include a methoxy group, an ethoxy group, a t-butoxy group and an isopropoxy group.

As the alkylsilyl group of 1 to 10 carbon atoms, a trialkylsilyl group or a trialkylsilylalkyl group is preferable, and a trimethylsilyl group, a trimethylsilylmethyl group, a trimethylsilylethyl group and a trimethylsilyl-n-propyl group are preferably used.

As the alkylsilyloxy group of 1 to 10 carbon atoms, a trialkylsilyloxy group or a trialkylsilyloxyalkyl group is preferable, and a trimethylsilyloxy group, a trimethylsilyloxymethyl group, a trimethylsilyoxylethyl group and a trimethylsilyloxy-n-propyl group are preferably used.

In formula (ba0-1), n represents an integer of 0 to 5. In the present invention, n is preferably 0 to 3. When n is 1 or more, the undercoat agent having a preferable surface free energy may be prepared.

Specific examples of structural units represented by general formula (ba0-1) include the structural units derived from styrene or a derivative thereof and structural units represented by formulae shown below. In the formulae, R is the same as defined above.

[Chemical Formula 4]

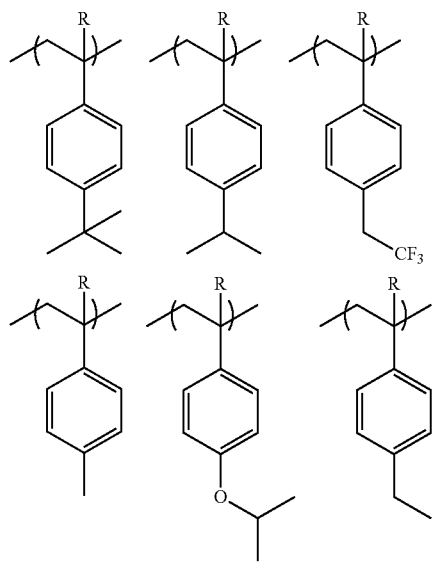
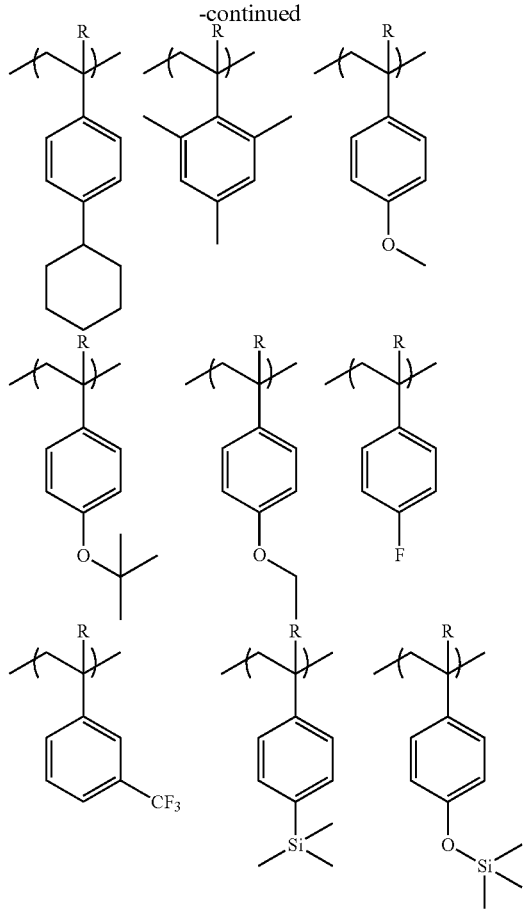

As the structural unit (ba0-1) contained in the component (A), 1 type of structural unit may be used, or 2 or more types may be used.

In the component (A), the amount of the structural unit (ba0-1) based on the combined total of all structural units constituting the component (A) is not particularly limited, but is preferably 5 to 99 mol %.

[Structural Unit Represented by General Formula (ba0-2)]

Hereinafter, a structural unit represented by general formula (ba0-2) (hereinafter, referred to as "structural unit (ba0-2)") will be described.

Specific examples of structural units represented by the general formula (ba0-2) are shown below.

[Chemical Formula 5]

In general formula (ba0-2), R represents a hydrogen atom, an alkyl group of 1 to 5 carbon atoms or a halogenated alkyl group of 1 to 5 carbon atoms; and R² represents an organic group selected from a linear, branched or cyclic organic group of 1 to 20 carbon atoms which may contain an oxygen atom, fluorine atom or silicon atom and a combination of these groups.

In formula (ba0-2), R is the same as defined above.

In general formula (ba0-2), $R^2$ is the same as described above for $R^1$ in formula (ba0-1).

As the organic group for $R^2$ in the formula (ba0-2), a linear, branched, or cyclic alkyl group is preferably used, and a fluorinated alkyl group may be used.

When $R^2$ contains a silicon atom, $R^2$ may be an organic group containing a polyhedral oligomeric silsesquioxane. More specifically, as the structural unit represented by the general formula (ba0-2), the structural unit represented by the general formula (a0-1) may be used. As the structural unit represented by the general formula (a0-1), the structural unit represented by the general formula (a0-1-1) is preferably used.

Specific examples of structural units represented by general formula (ba0-2) include the structural units derived from (α-substituted) acrylate ester and structural units represented by formulae shown below. In the formulae, R is the same as defined above.

[Chemical Formula 6]

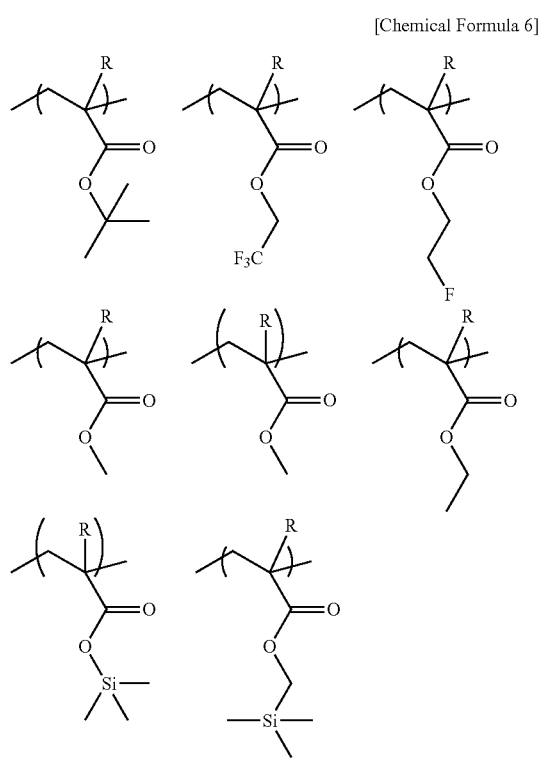

As the structural unit (ba0-2) contained in the component (A), 1 type of structural unit may be used, or 2 or more types may be used.

In the component (A), the amount of the structural unit (ba0-2) based on the combined total of all structural units constituting the component (A) is not particularly limited, but is preferably 5 to 99 mol %.

Structural Unit Having Substrate Interaction Group (II)

Examples of the structural unit (II) include the structural units derived from (α-substituted) acrylate ester and a structural unit (ba0-3) having a substrate interaction group.

{Substrate Interaction Group}

The component (A) preferably has a substrate interaction group. By including the substrate interaction group within the component (A), the undercoat agent containing the component (A) interacts with the substrate, thereby forming a strong film (a layer composed of the undercoat agent) on the substrate, and as a result, the layer containing the block copolymer can undergo favorable phase separation on the layer composed of the undercoat agent.

In the present invention, the "substrate interaction group" refers to a group that can interact chemically or physically with the substrate, and this group can be selected appropriately in accordance with the type of substrate. Examples of the types of interaction between the substrate and the substrate interaction group include covalent bonding interactions, ionic bonding interactions, hydrogen bonding interactions, electrostatic interactions, hydrophobic interactions, and van der Waals force interactions.

Specific examples of such substrate interaction groups include a carboxy group, a hydroxy group, a cyano group, an azide group, an amino group, a trialkoxysilyl group, a dialkoxysilyl group, and a mono-alkoxysilyl group and the like. Among these, a carboxy group, a hydroxy group, a cyano group, an amino group or a trialkoxysilyl group is preferable. As the alkoxy group in the trialkoxysilyl group, a methoxy group or an ethoxy group is preferable, and a methoxy group is particularly preferable.

In the present invention, as the substrate interaction group, a lactone-containing cyclic group, a group represented by any one of formulae (ba0-3-1'-1) and (ba0-3-1'-r2) described later, an ether-containing cyclic group and a cyclooctatrienyl group can be mentioned.

The term "lactone-containing cyclic group" refers to a cyclic group including a ring containing a —O—C(=O)— structure (lactone ring) in the ring skeleton thereof. The term "lactone ring" refers to a ring containing a —O—C(=O)— structure, and a single ring containing a —O—C(=O)— is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

As the lactone-containing cyclic group for the substrate interaction group, there is no particular limitation, and an arbitrary group may be used. Specific examples include structural units represented by general formulas (1c-r-1) to (1c-r-7) shown below. Hereinafter, "*" represents a valence bond.

[Chemical Formula 7]

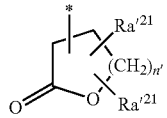
(1c-r-1)

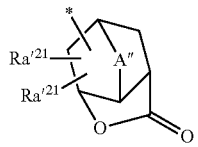
(1c-r-2)

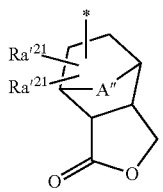
(1c-r-3)

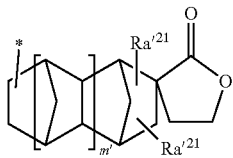
(1c-r-4)

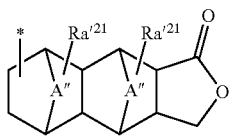
(1c-r-5)

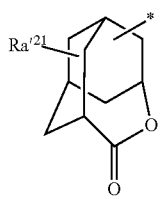
(1c-r-6)

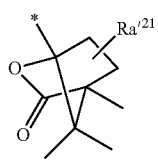
(1c-r-7)

In the formulas, each $Ra'^{21}$ independently represents a hydrogen atom, an alkyl group, an alkoxy group, a halogen atom, a halogenated alkyl group, a hydroxy group, —COOR", —OC(═O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; n' represents an integer of 0 to 2; and m' represents 0 or 1.

In general formulas (1c-r-1) to (1c-r-7), A" represents an oxygen atom (—O—), a sulfonyl group (—S—) or an alkylene group of 1 to 5 carbon atoms which may contain an oxygen atom or a sulfur atom. As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group. Each $Ra'^{21}$ independently represents an alkyl group, an alkoxy group, a halogen atom, a halogenated alkyl group, —COOR", —OC(═O)R", a hydroxyalkyl group or a cyano group.

The alkyl group for $Ra'^{21}$ is preferably an alkyl group of 1 to 5 carbon atoms.

The alkoxy group for $Ra'^{21}$ is preferably an alkoxy group of 1 to 6 carbon atoms.

Further, the alkoxy group is preferably a linear or branched alkoxy group. Specific examples of the alkoxy groups include a group in which the aforementioned alkyl group for $Ra'^{21}$ has an oxygen atom (—O—) on the terminal of the alkyl group.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl groups for $Ra'^{21}$ has been substituted with the aforementioned halogen atoms. As the halogenated alkyl group, a fluorinated alkyl group is preferable, and a perfluoroalkyl group is particularly desirable.

With respect to —COOR" and —OC(═O)R" for $Ra'^{21}$, R" represents a hydrogen atom or an alkyl group.

In the present invention, among these, the group represented by general formula (1c-r-1) or (1c-r-2) is preferable.

Specific examples of the group represented by the aforementioned general formulas (1c-r-1) to (1c-r-7) are shown below.

[Chemical Formula 8]

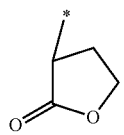
(r-lc-1-1)

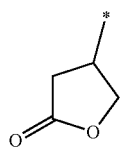
(r-lc-1-2)

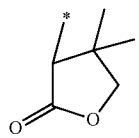
(r-lc-1-3)

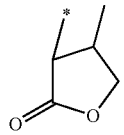
(r-lc-1-4)

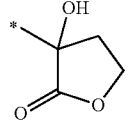
(r-lc-1-5)

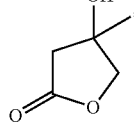
(r-lc-1-6)

(r-lc-1-7)
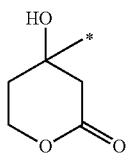
(r-lc-2-1)
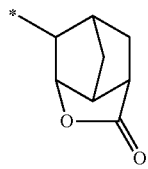
(r-lc-2-2)
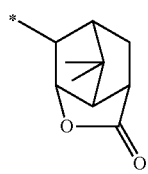
(r-lc-2-3)
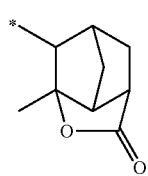
(r-lc-2-4)
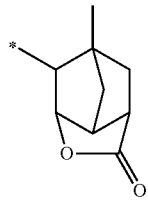
(r-lc-2-5)
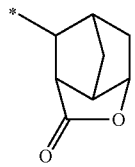
(r-lc-2-6)
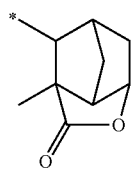
(r-lc-2-7)
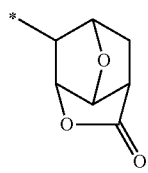
(r-lc-2-8)
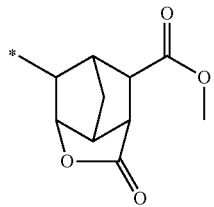
(r-lc-2-9)
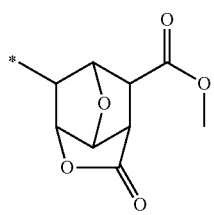
(r-lc-2-10)
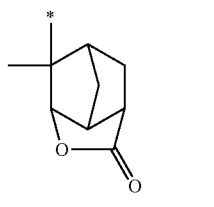
(r-lc-2-11)
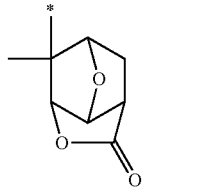
(r-lc-2-12)
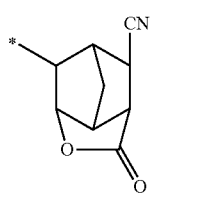
(r-lc-2-13)
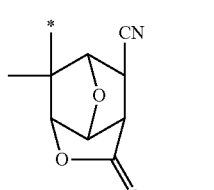
(r-lc-3-1)
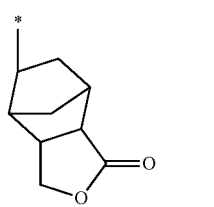

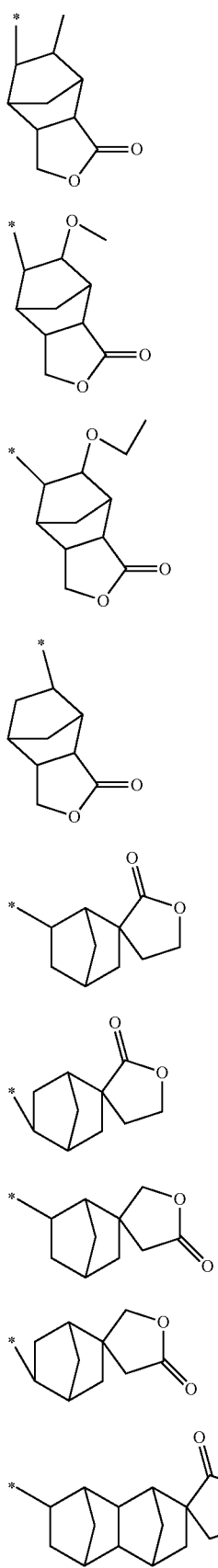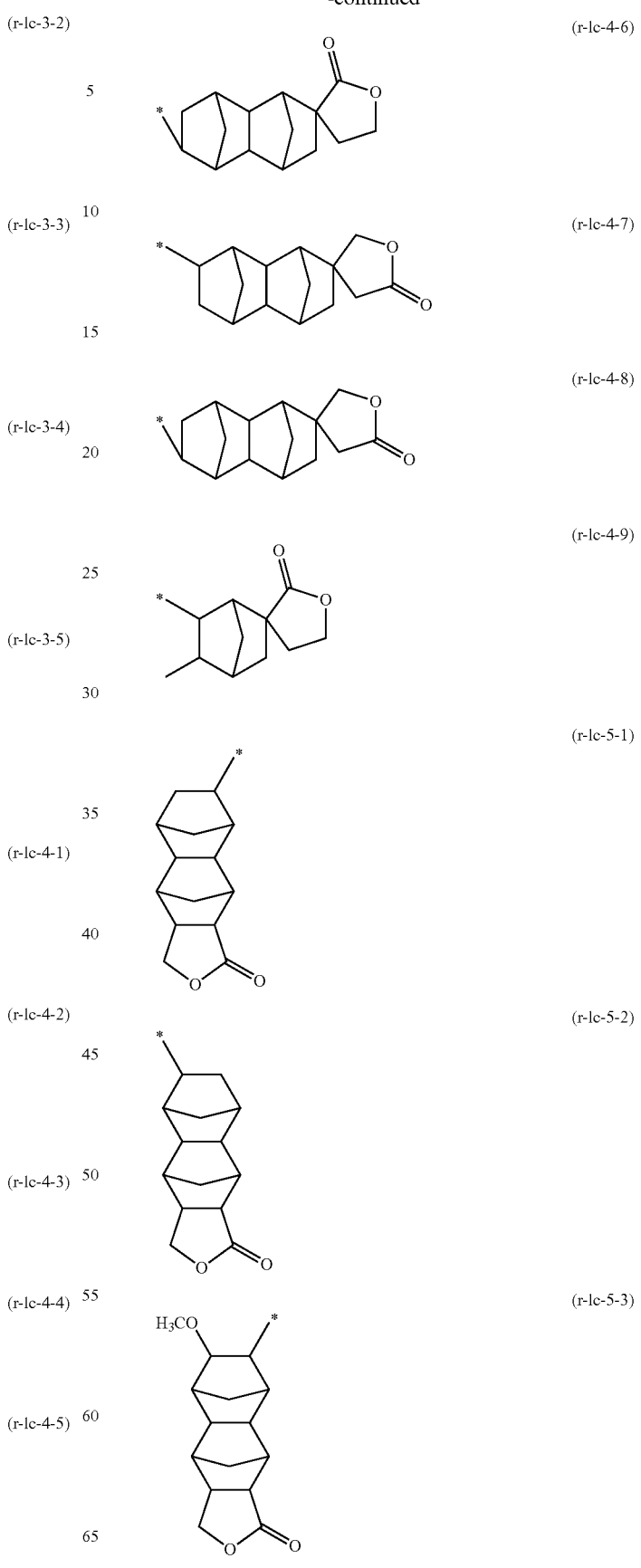

(r-lc-5-4)

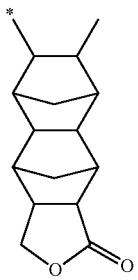

(r-lc-6-1)

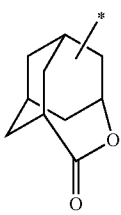

(r-lc-7-1)

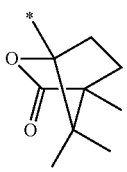

In the present invention, among the examples shown above, as the lactone-containing cyclic group, groups represented by general formulas (r-1c-1-1) to (r-1c-1-7), and (r-1c-2-1) to (r-1c-2-13) is preferable, and groups represented by general formulas (r-1c-1-1) to (r-1c-1-7) are particularly preferable.

Specific examples of substrate interaction groups represented by the general formula (ba0-3-1'-r1) or (ba0-3-1'-r2) are shown below.

[Chemcial Formula 9]

(ba0-3-1'-r1)

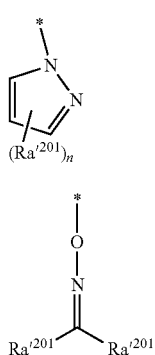

(ba0-3-1'-r2)

In the formula (ba0-3-1'-r1), $Ra'^{201}$ represents a hydrogen atom or an alkyl group of 1 to 10 carbon atoms; and n represents an integer of 1 to 3; in the formula (ba0-3-1'-r2), $Ra'^{201}$ is the same as defined above, and when $Ra'^{201}$ is each independently an alkyl group, these groups may be mutually bonded to form a ring; and "*" represents a valence bond.

In the formula (ba0-3-1'-r1) or (ba0-3-1'-r2), $Ra'^{201}$ represents a hydrogen atom or an alkyl group of 1 to 10 carbon atoms; and n represents an integer of 1 to 3. Examples of the alkyl group of 1 to 10 carbon atoms for $Ra'^{201}$ include a methyl group, an ethyl group, an n-propyl group, an i-propyl group, a 2-methylpropyl group, a 1-methylpropyl group and a t-butyl group.

In the formula (ba0-3-1'-r2), $Ra'^{201}$ is the same as defined above, and when $Ra'^{201}$ is each independently an alkyl group, these groups may be mutually bonded to form a ring. Specific examples of the ring structure to be formed include a cyclopentyl group and a cyclohexyl group.

Here, the "ether-containing cyclic group" as a substrate interaction group refers to a cyclic group including a structure in which a carbon atom within the cyclic hydrocarbon group has been replaced with an oxygen atom (cyclic ether). Specifically, groups represented by general formulae (e-1) to (e-2) shown below are preferable.

[Chemical Formula 10]

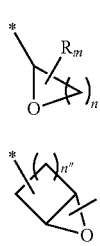

(e-1)

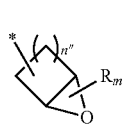

(e-2)

In the formulae, $R_m$ represents a hydrogen atom or an alkyl group of 1 to 5 carbon atoms; n represents an integer of 1 to 5; and n" represents an integer of 0 to 3.

It is presumed that, when the substrate interaction group is an ether-containing cyclic group or a cyclooctatrienyl group, the under coat layer becomes thick, since cross-linking reaction is likely to proceed and the substrate interaction effect may be given.

As the structural unit (ba0-3), those represented by formulae (ba0-3-1) to (ba0-3-4) shown below are preferable.

[Chemical Formula 11]

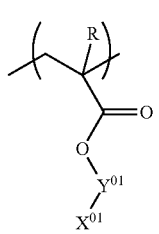

(ba0-3-1)

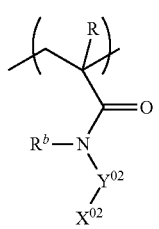

(ba0-3-2)

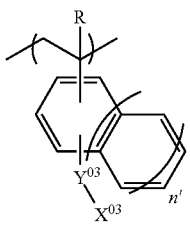
(ba0-3-3)

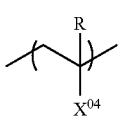
(ba0-3-4)

In the formulae, R is the same as defined above; $R^b$ represents a hydrogen atom or an alkyl group of 1 to 5 carbon atoms; $Y^{01}$ represents a divalent linking group; $Y^{02}$ represents a divalent linking group; $Y^{03}$ represents a single bond or a divalent linking group; and $X^{01}$ to $X^{04}$ represents a substrate interaction group as defined above.

In the formula, the divalent linking group for $Y^{01}$ is not particularly limited, and may have a substituent, and examples thereof include: a divalent hydrocarbon group which does not contain an aromatic ring and may have a substituent; and a divalent linking group which contains a hetero atom and does not contain an aromatic ring.

(Divalent Hydrocarbon Group Which May Have a Substituent)

The hydrocarbon group as a divalent linking group is preferably an aliphatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, and still more preferably 1 to 5.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent (a group or an atom other than a hydrogen atom) for substituting a hydrogen atom. Examples of the substituent include a fluorine atom, a fluorinated alkyl group of 1 to 5 carbon atoms, and an oxo group (=O).

As examples of the aliphatic hydrocarbon group containing a ring in the structure thereof, a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed between atoms within a linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic aliphatic hydrocarbon group, a group in which two hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent (a group or an atom other than a hydrogen atom) for substituting a hydrogen atom. Examples of substituents include an alkyl group, an alkoxy group, a halogen atom, a halogenated alkyl group, a hydroxyl group and an oxo group (=O).

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

In the cyclic aliphatic hydrocarbon group, part of the carbon atoms constituting the ring structure thereof may be substituted with a substituent containing a hetero atom. The substituent containing a hetero atom is preferably —O—, —C(=O)—O—, —S—, —S(=O)$_2$— or —S(=O)$_2$—O—.

(Divalent Linking Group Containing a Hetero Atom)

With respect to a "divalent linking group containing a hetero atom" for $Y^{01}$, a hetero atom is an atom other than carbon and hydrogen, and examples thereof include an oxygen atom, a nitrogen atom, a sulfur atom and a halogen atom.

Examples of the divalent linking group containing a hetero atom include —O—, —C(=O)—O—, —C(=O)—, —O—C(=O)—O—, —C(=O)—NH—, —NH— (H may be substituted with a substituent such as an alkyl group or an acyl group), —S—, —S(=O)₂—, —S(=O)₂—O—, —NH—C(=O)—, =N—, and a group represented by general formula —Y²¹—O—Y²²—, —[Y²¹—C(=O)—O]$_{m'}$—Y²²—, C(=O)—O—Y²²— or —Y²¹—O—C(=O)—Y²²— in the formulae, each of Y²¹ and Y²² independently represents a divalent hydrocarbon group which may have a substituent; O represents an oxygen atom; and m' represents an integer of 0 to 3].

When $Y^{01}$ represents —NH—, H may be substituted with a substituent such as an alkyl group, an acyl group or the like. The substituent (an alkyl group, an aryl group or the like) preferably has 1 to 10 carbon atoms, more preferably 1 to 8, and most preferably 1 to 5.

Each of $Y^{21}$ and $Y^{22}$ independently represents a divalent hydrocarbon group which may have a substituent. As the divalent hydrocarbon group, the same groups as those described above for the "divalent hydrocarbon group which may have a substituent" for $Y^{01}$ can be mentioned.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y²¹—C(=O)—O]$_{m'}$—Y²²—, m' represents an integer of 0 to 3, preferably an integer of 0 to 2, more preferably 0 or 1, and particularly preferably 1. Namely, it is particularly desirable that the group represented by the formula —[Y²¹—C(=O)—O]$_{m'}$—Y²²— is a group represented by the formula —Y²¹—C(=O)—O—Y²²—. Among these, a group represented by the formula —(CH₂)$_{a'}$—C(=O)—O—(CH₂)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom, a linear group containing an oxygen atom as the hetero atom e.g., a group containing an ether bond or an ester bond is preferable, and a group represented by the aforementioned formula —Y²¹—O—Y²²—, —[Y²¹—C(=O)—O]$_{m'}$—Y²²— or —Y²¹—O—C(=O)—Y²²— is more preferable.

Among the aforementioned examples, as the divalent linking group for $Y^{01}$, a linear or branched alkylene group which may contain a hetero atom, or a divalent alicyclic hydrocarbon group which may contain a hetero atom is particularly desirable.

Among these, a linear, branched or cyclic alkylene group, a divalent linking group containing an ester bond (—C(=O)—O—), a divalent linking group containing an —S(=O)₂ bond and a divalent linking group containing an ether bond is preferable.

In the formulae, $X^{01}$ preferably represents a carboxy group, a hydroxy group, a cyano group, an amino group, a trialkoxysilyl group, an azide group, a lactone-containing cyclic group, groups represented by formulae (ba0-3-1'-r1) to (ba0-3-1'-r2) described later and an ether-containing cyclic group. The alkoxy group in the trialkoxysilyl group is the same as defined above. As the trialkoxysilyl group, a trimethoxysilyl group is preferable.

When $X^{01}$ is a group represented by any one of the aforementioned formulae (ba0-3-1'-r1) to (ba0-3-1'-r2), the structural unit (ba0-3-1) is preferably a structural unit represented by formula (ba0-3-1') shown below.

[Chemical Formula 12]

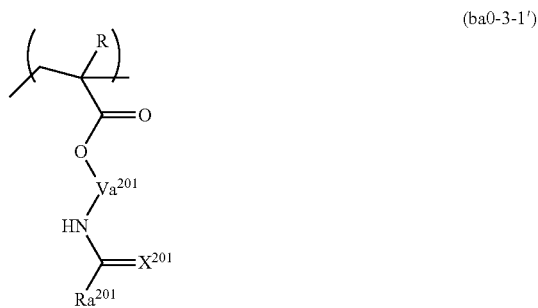

(ba0-3-1')

In general formula (ba0-3-1'), R represents a hydrogen atom, an alkyl group of 1 to 5 carbon atoms or a halogenated alkyl group of 1 to 5 carbon atoms; $Va^{201}$ represents a divalent linking group; $X^{201}$ represents an oxygen atom or a sulfur atom; and $Ra^{201}$ represents a group represented by the aforementioned general formula (ba0-3-1'-r1) or (ba0-3-1'-r2).

In general formula (ba0-3-1'), R represents a hydrogen atom, an alkyl group of 1 to 5 carbon atoms or a halogenated alkyl group of 1 to 5 carbon atoms, and these groups are the same as defined above.

In general formula (ba0-3-1'), $Va^{201}$ represents a divalent linking group.

The divalent linking group for $Va^{201}$ is the same as the divalent linking group for $Y^{01}$, and preferably represents an ester bond [—C(=O)—O—], an ether bond (—O—), a linear or branched alkylene group or a combination of these. In particular, a linear alkylene group is preferably used. When $Va^{201}$ is a linear alkylene group, it preferably has 1 to 10 carbon atoms, more preferably 1 to 6 carbon atoms.

In general formula (ba0-3-1'), $X^{201}$ represents an oxygen atom or a sulfur atom; and $Ra^{201}$ represents a group represented by the aforementioned general formula (ba0-3-1-r1') or (ba0-3-1-r2').

In general formula (ba0-3-2), $Y^{02}$ represents a divalent linking group, and is the same divalent linking group as those described above for $Y^{01}$.

$X^{02}$ preferably represents a carboxy group, a hydroxy group, a cyano group, an amino group, a trialkoxysilyl group, an azide group and a lactone-containing cyclic group. The trialkoxysilyl group for $X^{02}$ is the same as the trialkoxysilyl group for $X^{01}$.

In general formula (ba0-3-3), $Y^{03}$ represents a single bond or a divalent linking group, and is the same divalent linking group as those described above for $Y^{01}$.

$X^{03}$ preferably represents a carboxy group, a hydroxy group, a cyano group, an azide group, an amino group, a trialkoxysilyl group and an ether-containing cyclic group.

In general formula (ba0-3-4), as $X^{04}$, a carboxy group or a cyclooctatrienyl group is preferable.

Specific examples of the structural unit (ba0-3) are shown below. In the formula, R is the same as defined above, and $R^1$ is the same definition as R.

[Chemical Formula 13]
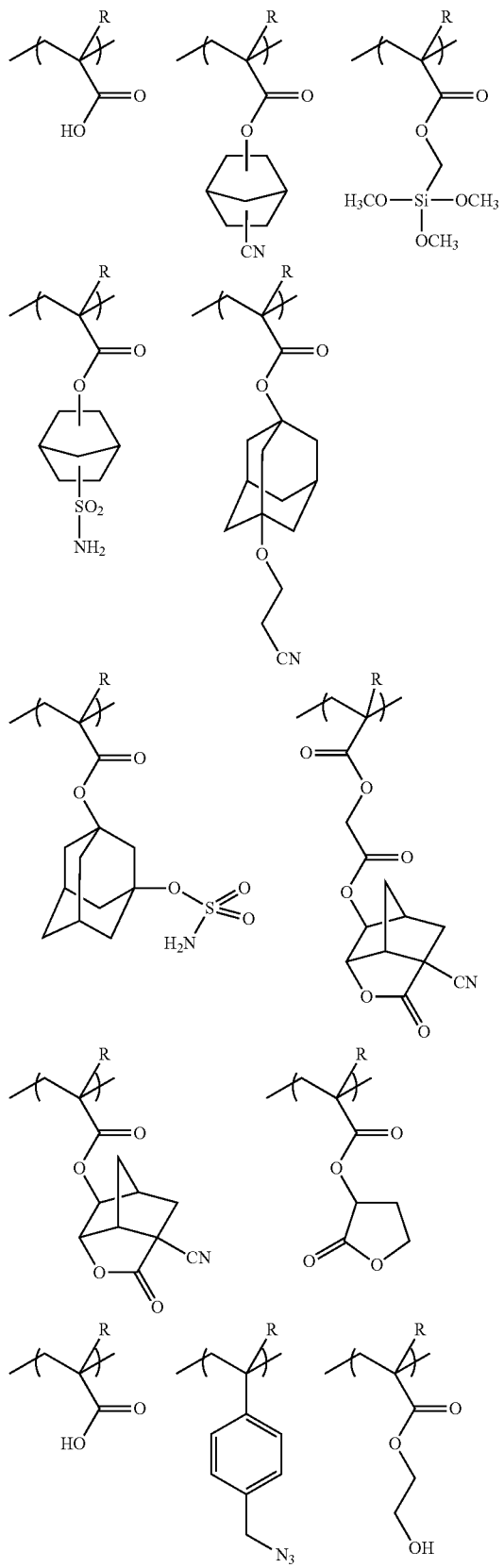
[Chemical Formula 14]
-continued
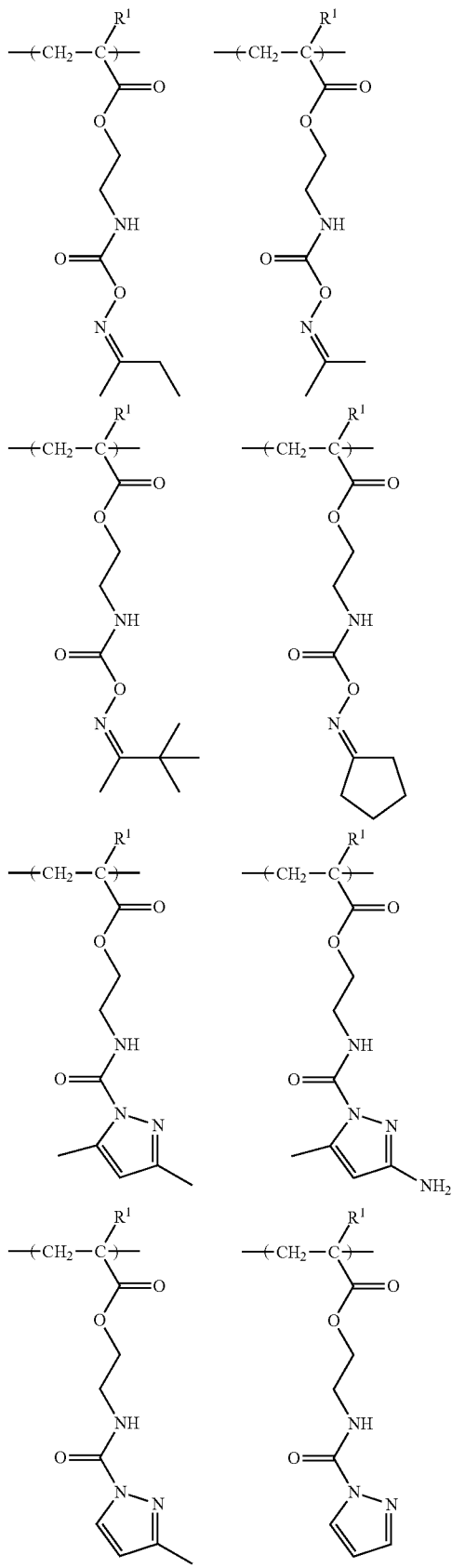

[Chemical Formula 15]

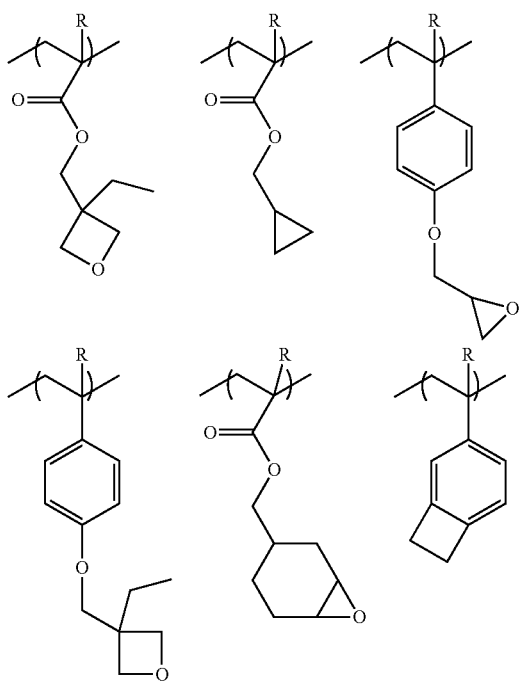

As the structural unit (ba0-3), one type of structural unit may be used, or two or more types may be used in combination.

The amount of the structural unit (ba0-3) within the component (A) based on the combined total of all structural units constituting the component (A) is not particularly limited, but is preferably 20 mol % or less, more preferably 1 to 10 mol %, and particularly more preferably 1 to 5 mol %. By ensuring the above-mentioned range, the adhesiveness to a substrate is improved.

The resin component (A) is preferably a copolymer containing the structural unit (ba0-1) and the structural unit (ba0-3), a copolymer containing the structural unit (ba0-2) and the structural unit (ba0-3), or a copolymer containing the structural unit (ba0-1), the structural unit (ba0-2) and the structural unit (ba0-3).

The weight average molecular weight (Mw) (the polystyrene equivalent value determined by gel permeation chromatography) of the component (A) is not particularly limited, but is preferably 1,000 to 200,000, more preferably 1,500 to 200,000, and most preferably 2,000 to 150,000. When the weight average molecular weight is no more than the upper limit of the above-mentioned range, the undercoat agent containing the component (A) exhibits a sufficient solubility in an organic solvent described later, therefore an excellent applicability to the substrate may be given. On the other hand, when the weight average molecular weight is at least as large as the lower limit of the above-mentioned range, the polymer may be produced in a certain quality and an excellent applicability to the substrate can be given.

Further, the dispersity (Mw/Mn) is not particularly limited, but is preferably 1.0 to 5.0, more preferably 1.0 to 3.0, and most preferably 1.0 to 2.5. Here, Mn is the number average molecular weight.

The component (A) can be obtained, for example, by a conventional radical polymerization or the like of the monomers corresponding with each of the structural units, using a radical polymerization initiator such as azobisisobutyronitrile (AIBN).

Furthermore, in the component (A), by using a chain transfer agent such as HS—$CH_2$—$CH_2$—$CH_2$—$C(CF_3)_2$—OH, a —$C(CF_3)_2$—OH group can be introduced at the terminals of the component (A).

As the monomers for deriving the corresponding structural units, commercially available monomers may be used, or the monomers may be synthesized by a conventional method.

In the undercoat agent used for forming a layer composed of the neutralization film, as the component (A), one type may be used, or two or more types may be used in combination.

In the undercoat agent, the amount of the component (A) can be appropriately adjusted depending on the desired thickness of the layer composed of the neutralization film, and the like.

[Organic Solvent; Component (S)]

The undercoat agent used for forming the layer composed of the neutralization film can be prepared by dissolving the materials for the undercoat agent in an organic solvent (hereinafter, referred to as "component (S)").

The component (S) may be any organic solvent which can dissolve the each of the components to give a uniform solution, and one or more kinds of any organic solvent can be appropriately selected from known solvents for a film composition containing a resin as a main component.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol, and poly hydric alcohol derivative having an ether bond, such as a monoalkylether (e.g., monomethylether, monoethylether, monopropylether or monobutylether) or monophenylether of compound having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentyl benzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the organic solvent is used in an amount such that the solid content of the undercoat agent becomes within the range from 1 to 20% by weight, and preferably from 2 to 15% by weight.

[Guide Pattern Forming Step]

In the method of producing a structure containing a phase-separated structure according to the first aspect of the present invention, after the [Step in which layer composed of neutralization film (i.e., undercoat agent) is formed on substrate] but before the [Step in which layer containing block copolymer is formed on layer composed of the neutralization film, wherein, in the block copolymer, $P_A$ block and $P_A$ block are mutually bonded, and the $P_B$ block contains structural unit other than the structural unit constituting $P_B$ block], a guide pattern having a pattern may be formed in advance on the layer 2 composed of the neutralization film. As a result, it becomes possible to achieve a desirable arrangement of the phase separation structure, depending on the shape and surface properties of the guide pattern. For example, in the case of a block copolymer where a random fingerprint-patterned phase separation structure is formed without using a guide pattern, by introducing a trench pattern of a resist film on the surface of the substrate, a phase separation structure oriented along the trench can be obtained. The guide pattern can be introduced in accordance with the above-described principle. Further, when the surface of the guide pattern has affinity for any of the polymers constituting the block copolymer, a phase separation structure having a lamellar structure or a cylindrical structure oriented in the perpendicular direction to the surface of the substrate can be more reliably formed.

More specifically, for example, using a spinner or the like, a photosensitive resin composition described later is applied to the surface of the substrate or the surface of the substrate on which a neutralization film has been formed, and a prebake (post applied bake (PAB)) is conducted under temperature conditions of 80 to 150° C. for 40 to 120 seconds, preferably 60 to 90 seconds. Then, for example, using an ArF exposure apparatus or the like, the resist film is selectively exposed to an ArF excimer laser through a desired mask pattern, followed by post exposure bake (PES) under temperature conditions of 80 to 150° C. for 40 to 120 seconds, preferably 60 to 90 seconds. Subsequently, developing treatment is conducted using an alkali developing solution such as a 0.1 to 10% by weight aqueous solution of tetramethylammonium hydroxide (TMAH), if necessary, followed by rinsing with pure water, and drying. If desired, bake treatment (post bake) can be conducted following the developing. In this manner, a guide pattern that is faithful to the mask pattern can be formed.

In the formation of guide pattern, the guide pattern may be formed in accordance with nanoimprint lithography. In nanoimprint lithography, a mold having a predetermined pattern formed thereon is attached to a support having a nanoimprint material such as a resin layer formed thereon, then, if required, heating or exposure is conducted to cure the resin layer, followed by removing the mold, thereby forming a guide pattern.

The thickness of the guide pattern from the surface of the substrate (or the surface of the neutralization film) to the surface of the guide pattern is preferably at least as large as the thickness of the layer containing the block copolymer to be formed on the surface of the substrate. The thickness of the guide pattern from the surface of the substrate (or the surface of the neutralization film) can be appropriately adjusted by the film thickness of the resist film formed by applying the resist composition (photosensitive resin composition) for forming a guide pattern.

When a solution of the block copolymer is cast onto the surface of the substrate having a guide pattern formed, and a heat treatment is conducted to cause a phase separation. Therefore, the resist composition for forming a guide pattern is preferably capable of forming a resist film which exhibits solvent resistance and heat resistance.

<Photosensitive Resin Component>

In the present invention, the photosensitive resin composition used in the step in which a guide pattern is formed is preferably a photosensitive resin composition that generates acid upon exposure and exhibits changed solubility in a developing solution by the action of acid, and a conventional composition may be appropriately used. For example, the photosensitive resin component disclosed in WO 2012/046770 pamphlet, WO 2012/169620 pamphlet, Japanese Patent No. 5227846 and Japanese Patent No. 5225555 may be used.

As the nanoimprint material used in the method of forming a guide pattern by nanoimprint lithography, a silicone-based compound-containing material disclosed in Japanese Unexamined Patent Application, First Publication No. 2007-072374, Japanese Unexamined Patent Application, First Publication No. 2007-329276, and Japanese Unexamined Patent Application, First Publication No. 2008-246876 may be used, and an organic material in which an acrylic resin is used instead of the silicon-based compound may be used.

[Top Coat Forming Step]

In the present invention, it is preferable that a top coat material that exhibits changed polarity by heating and contributes to the surface energy of the layer containing a block copolymer is applied to the layer containing a block copolymer to form a top coat film. It is preferable that the [Top coat forming step] is conducted before a step in which a layer containing a block copolymer is subjected to an annealing treatment.

By forming a top coat film using the top coat material on the layer containing a block copolymer, the surface condition of the layer can be controlled, and phase separation may be uniformly conducted.

In the present embodiment, the formation of top coat film can be conducted by applying the top coat material to the layer 2 containing a block copolymer using a spinner or the like. After the application, bake treatment can be conducted. The heat temperature is preferably 80 to 280° C., and the heating time is preferably 10 to 600 seconds.

The thickness of the topcoat film formed on the layer 2 is preferably 2 to 500 nm, more preferably 5 to 200 nm, and still more preferably 10 to 100 nm. By ensuring that the thickness of the topcoat film is within the aforementioned range, it is possible to block the adverse effect from the external environment sufficiently, and to bring phase separation efficiently.

As the topcoat material, the topcoat material described later can be applied.

<<Method of Forming a Pattern>>

A second aspect of the present invention is a method of forming a pattern including a step in which a phase containing at least one block is selectively removed from a structure containing a phase-separated structure to form a pattern, the structure is produced in accordance with a method of the first aspect of the present invention.

[Step in Which a Phase Including at Least One Block is Selectively Removed from a Structure Containing a Phase-Separated Structure to Form a Pattern]

A phase 3a composed of at least one block among the plurality of blocks constituting the block copolymer is selectively removed from the layer 3 containing the block copolymer, thereby forming a pattern.

Hereinafter, among the blocks constituting the block copolymer, a block which is not selectively removed is referred to as "$P_A$ block, and a block to be selectively removed is referred to as "block $P_B$. For example, after the phase separation of a layer containing a silsesquioxane-poly(methyl methacrylate) (POSS-PMMA) block copolymer, by subjecting the layer to an oxygen plasma treatment or a hydrogen plasma treatment, the phase of PMMA is selectively removed. In such a case, POSS is the $P_A$ block, and PMMA is the block $P_B$.

Subsequently, after the formation of the phase separation structure, at least a part of the phase of block $P_B$ is selectively removed from the layer containing the block copolymer formed on the substrate, as a result, the molecular weight of the block copolymer is reduced. By selective removal of a part of the block $P_B$ in advance, the solubility in a developing solution can be enhanced. As a result, the phase of the block $P_B$ can be more reliably removed by selective removing than the phase of the $P_A$ block.

The method of the removal of the specific block is not particularly limited, as long as it is a treatment so as to decompose and remove the block $P_B$ without affecting the $P_A$ block. The selective removal treatment can be appropriately selected from any methods for removing a resin film, depending on the types of the $P_A$ block and the $P_B$ block. Further, when a neutralization film is formed on the surface of the substrate, the neutralization film is removed together with the phase of the block $P_B$. Examples of the removal treatment include an oxygen plasma treatment, an ozone treatment, a UV irradiation treatment, a heat decomposition treatment and a chemical decomposition treatment.

When the method includes [Top coat forming step], the selective removal of the phase 2a may be conducted without removal the top coat film. However, the method is not limited to the process, and the selective removal of the phase 2a may be conducted after the removal of the top coat film. In terms of removing the top coat film uniformly, it is preferable that the selective removal of the phase 2a is conducted after the removal of the top coat film.

As the method of removing the top coat film, a method can be selected appropriately in accordance with the type of the top coat material.

The removal of the top coat film can be performed by a method in which a solvent used as a solvent of the top coat material is applied to the top coat film. As the solvent of the top coat material, the same solvent as those for the top coat material described later can be mentioned.

The substrate on which a pattern 3b has been formed through a phase separation of the layer 3 containing the block copolymer in the manner described above can be used without further modification, or may be subjected to an additional heat treatment to change the shape of the polymer nanostructure on the substrate. The heat treatment is preferably conducted at a temperature at least as high as the glass transition temperature of the block copolymer to be used but is conducted at a temperature lower than the heat decomposition temperature. Further, the heat treatment is preferably conducted in a low-reactive gas such as nitrogen.

<<Top Coat Material>>

A top coat material that is preferably used in a method of producing a structure containing a phase-separated structure according to the first aspect of the present invention will be described.

In the present invention, the top coat material is a top coat material (hereinafter, sometimes referred to as "top coat material (1)") that includes a polymeric compound containing a structural unit (Tc1) that exhibits changed polarity by heating and a surface energy control agent that contributes to a surface energy of the layer containing a block copolymer.

The top coat material of the present invention may be a top coat material (hereinafter, sometimes referred to as "top coat material (2)") includes a polymeric compound containing a structural unit (Tc1) that exhibits changed polarity by heating and a structural unit (Tc2) that contributes to a surface energy of the layer containing a block copolymer.

<Top Coat Material (1)>

The top coat material (1) is a top coat material that includes a polymeric compound containing a structural unit (Tc1) that exhibits changed polarity by heating and a surface energy control agent that contributes to a surface energy of the layer containing a block copolymer.

(Polymeric Compound)

Structural Unit (Tc1)

A polymeric compound used in the top coat material (1) contains a structural unit (Tc1) that exhibits changed polarity by heating.

By including the structural unit (Tc1), the surface energy of the layer containing the block copolymer can be maintained in an appropriate level during the phase separation.

The "structural unit that exhibits changed polarity by heating" refers to a repeating unit that changes the structure thereof by heating and changes the structure of the polar group thereof. As a structural unit (Tc1), a repeating unit can be mentioned, in which the structure of the polar group is changed when the ring-opening structure is converted to a ring-closed structure by dehydration condensation due to heating.

Examples of the polar group include —COO⁻, —SO₃⁻, —NH₄⁺; a carboxy group, a hydroxy group, an amino group and a sulfo group (—SO₃H).

As an example of the structural unit (Tc1), a structural unit represented by chemical formula shown below can be given.

The structural unit represented by chemical formula (Tc1-1) is a structural unit that exhibits increased polarity by heating in the presence of basic component. The structural unit represented by chemical formula (Tc1-2) is a structural unit that exhibits decreased polarity by heating.

[Chemical Formula 16]

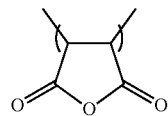

(Tc1-1)

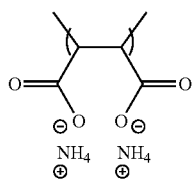

(Tc1-2)

As the structural unit (Tc1) contained in the polymeric compound, 1 type of structural unit may be used, or 2 or more types may be used.

The type of the structural unit (Tc1) selected from the group consisting of a structural unit that exhibits increased polarity by heating and a structural unit that exhibits decreased polarity by heating can be appropriately determined, taking into consideration the type of the block copolymer or the level of the surface energy of the layer containing the block copolymer.

As the structural unit (Tc1), it is preferable to use the structural unit represented by the aforementioned chemical formula (Tc1-1), or the structural unit represented by the aforementioned chemical formula (Tc1-2).

In the polymeric compound, the amount of the structural unit (Tc1) based on the combined total of all structural units constituting the polymeric compound is preferably 10 to 90 mol %, more preferably 30 to 80 mol %, and still more preferably 40 to 80 mol %.

When the amount of the structural unit (Tc1) is within the aforementioned range, the surface energy of the layer containing the block copolymer can be easily maintained in an appropriate level during the phase separation.

The polymeric compound used in the top coat material (1) may contain a structural unit other than the structural unit (Tc1).

Examples of the structural unit other than the structural unit (Tc1) include a structural unit (Tc2) that contributes the surface energy of the layer containing the block copolymer, a structural unit (Tc3) that contributes to the glass transition temperature (Tg).

Structural Unit (Tc2)

Examples of the structural unit (Tc2) include the same structural units as those described above for the structural unit (Tc2) that will be explained in <Top coat material (2)> described later.

As the structural unit (T2) contained in the polymeric compound, 1 type of structural unit may be used, or 2 or more types may be used.

As the structural unit (Tc2), it is preferable to include at least one structural unit selected from the group consisting of a structural unit represented by general formula (Tc2-1) described later, a structural unit represented by general formula (Tc2-2) described later and a structural unit represented by general formula (Tc2-3) described later; and it is more preferable to include at least one structural unit selected from the group consisting of a structural unit represented by general formula (Tc2-1) described later and a structural unit represented by general formula (Tc2-2) described later.

When the polymeric compound includes the structural unit (Tc2), the amount of the structural unit (Tc2) within the polymeric compound, based on the combined total of all the structural units that constitute the polymeric compound, is preferably within a range from 10 to 90 mol %, more preferably from 20 to 70 mol %, and still more preferably from 20 to 60 mol %.

When the amount of the structural unit (Tc2) is within the aforementioned range, the layer containing the block copolymer having a desirable surface energy may be given.

In the top coat material (1), as the polymeric compound containing the structural unit (Tc1), one type of polymeric compound may be used alone, or two or more types of polymeric compounds may be used in combination.

The polymeric compound used in the top coat material (1) is a polymer containing at least the structural unit (Tc1), and preferably a copolymer having the structural unit (Tc2), in addition to the structural unit (Tc1).

Among these copolymers, it is preferable to include a copolymer containing a repeating structure of a structural unit represented by the aforementioned general formula (Tc1-1) described later, a structural unit represented by chemical formula (Tc2-1) described later and structural unit represented by general formula (Tc2-2) described later.

Specific examples of preferable polymer compound used for the top coat material (1) include the same polymeric compounds as those explained in <Top coat material (2)> described later.

The weight average molecular weight (Mw) (the polystyrene equivalent value determined by gel permeation chromatography) of the polymeric compound used for the top coat material (1) is not particularly limited, but is preferably 1,000 to 50,000, more preferably 1,500 to 30,000, and most preferably 2,000 to 30,000. By ensuring the aforementioned range, solubility in an organic solvent can be increased.

Further, the dispersity (Mw/Mn) of the polymeric compound is not particularly limited, but is preferably 1.0 to 6.0, more preferably 1.0 to 5.0, and most preferably 1.0 to 4.0.

The polymeric compound can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

In the topcoat material (1), the amount of the polymeric compound can be appropriately adjusted depending on the thickness of the topcoat film to be formed, and the like. In the topcoat material (1), the concentration of the polymeric compound is preferably 0.1 to 15% by weight, and more preferably 0.2 to 7% by weight.

(Surface Energy Control Agent)

A top coat material (1) contains a surface energy control agent that contributes to a surface energy of the layer containing a block copolymer explained in <<method of producing structure containing phase-separated structure>>, in addition to the polymeric compound containing the structural unit (Tc1).

By including the surface energy control agent, the surface energy of the layer containing the block copolymer can be adjusted to an appropriate level during the phase separation.

Examples of the surface energy control agent include a component (i.e., cross-linking agent) that form an intermolecular or intramolecular chemical bond of the polymeric compounds in the top coat material by heating.

Specific examples of the surface energy control agent include cross-linking agents such as diamines, triamines and the like. Among these, a diamine or a triamine is preferably used, and a diamine is particularly preferably used.

Preferred examples of the surface energy control agents are shown below.

[Chemical Formula 17]

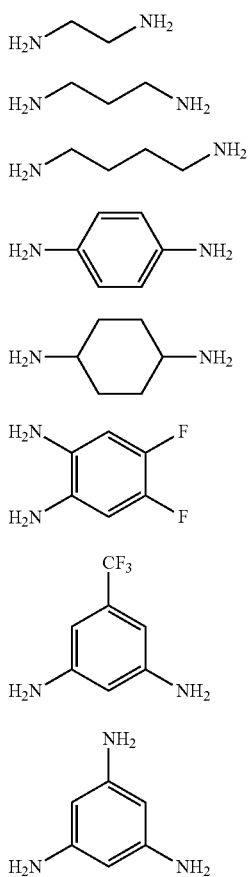

(Sc-1)
(Sc-2)
(Sc-3)
(Sc-4)
(Sc-5)
(Sc-6)
(Sc-7)
(Sc-8)

In the top coat material (1), as the surface energy control agent, one type of surface energy control agent may be used alone, or two or more types of surface energy control agents may be used in combination.

In the top coat material (1), the amount of the surface energy control agent relative to 100 parts by weight of the polymeric compound is preferably 2 to 500 parts by weight, and more preferably 5 to 300 parts by weight.

When the amount of the surface energy control agent is at least as large as the lower limit of the above-mentioned range, the surface energy of the layer containing the block copolymer having a preferable surface energy may be given. On the other hand, when the amount of the surface energy control agent is no more than the upper limit of the above-mentioned range, the film formability becomes excellent.

(Optional Components)

If desired, other miscible additives can also be added to the top coat material (I), in addition to the polymeric compound and the surface energy control agent.

Solvent

The top coat material (1) can be produced by dissolving the polymeric compound and the surface energy control agent in a solvent.

As a solvent, any solvents can be used, as long as it dissolves the respective components so as to give a uniform solution. Examples the solvents include water, aqueous ammonia (preferably 10 to 50% by weight), methanol, a mixed solvent of methanol and aqueous ammonia, a mixed solvent of water and methanol, a mixed solvent of aqueous ammonia and ethanol.

<Top Coat Material (2)>

A top coat material (2) includes a polymeric compound containing a structural unit (Tc1) that exhibits changed polarity by heating and a structural unit (Tc2) that contributes to the a surface energy of the layer containing a block copolymer.

(Polymeric Compound)

A polymeric compound used in the top coat material (2) contains a structural unit (Tc1) that exhibits changed polarity by heating and a structural unit (Tc2) that contributes to a surface energy of the layer containing a block copolymer.

Structural Unit (Tc1)

Examples of the structural unit (Tc1) include the same structural units as those described above for the structural unit (Tc1) that will be explained in the aforementioned <Top Coat Material (1)>.

As the structural unit (Tc1) contained in the polymeric compound, 1 type of structural unit may be used, or 2 or more types may be used.

The type of the structural unit (Tc1) selected from the group consisting of a structural unit that exhibits increased polarity by heating and a structural unit that exhibits decreased polarity by heating can be appropriately determined, taking into consideration the type of the block copolymer or the level of the surface energy of the layer of containing the block copolymer.

As the structural unit (Tc1), it is preferable to use the structural unit represented by the aforementioned chemical formula (Tc1-1), or the structural unit represented by the aforementioned chemical formula (Tc1-2).

In the polymeric compound, the amount of the structural unit (Tc1) based on the combined total of all structural units constituting the polymeric compound is preferably 10 to 90 mol %, more preferably 30 to 80 mol %, and still more preferably 40 to 80 mol %.

When the amount of the structural unit (Tc1) is within the aforementioned range, the surface energy of the layer containing the block copolymer can be easily maintained in an appropriate level during the phase separation.

Structural Unit (Tc2)

A structural unit (Tc2) is a structural unit that contributes to a surface energy of the layer containing a block copolymer.

By including the structural unit (Tc2), the layer containing the block copolymer having an appropriate surface energy can be given through phase separation.

As the structural unit (Tc2), any structural units can be used, as long as it contributes to polarity of the polymeric compound containing the structural unit (Tc1). It is preferable to include at least one structural unit selected from the group consisting of a structural unit represented by general formula (Tc2-1) shown below, a structural unit represented by general formula (Tc2-2) shown below and a structural unit represented by general formula (Tc2-3) shown below.

[Chemical Formula 18]

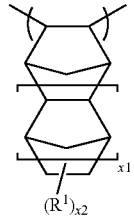

(Tc2-1)

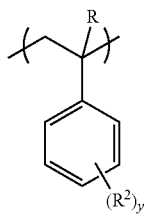

(Tc2-2)

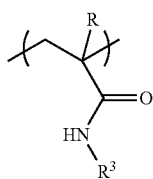

(Tc2-3)

In the formulae, x1 represents 0 or 1; $R^1$ represents a fluorine atom or a hydrocarbon group which may have a fluorine atom or an oxygen atom; x2 represents an integer of 0 to 4; R represents a hydrogen atom, an alkyl group of 1 to 5 carbon atoms or a halogenated alkyl group of 1 to 5 carbon atoms; and the plurality of R may be the same or different from each other; $R^2$ represents a fluorine atom or a hydrocarbon group which may have a fluorine atom or an oxygen atom; y represents an integer of 0 to 3; $R^3$ represents a hydrocarbon group which may have a substituent; $R^3$ represents a fluorine atom or a hydrocarbon group which may have a fluorine atom or an oxygen atom.

In general formula (Tc2-1) above, x represents 0 or 1.

x2 represents an integer of 0 to 4, is preferably an integer of 0 to 2, is more preferably either 0 or 1, and is most preferably 1.

In formula (Tc2-1), $R^1$ represents a fluorine atom or a hydrocarbon group which may have a fluorine atom or an oxygen atom; The monovalent hydrocarbon group for $R^1$ may be either an aliphatic hydrocarbon group or an aromatic hydrocarbon group, an aliphatic hydrocarbon group is preferable, and a monovalent saturated aliphatic hydrocarbon group (i.e., alkyl group) is more preferable.

As specific examples of the alkyl group, a chain-like aliphatic hydrocarbon group (e.g., a linear or branched alkyl group), and an aliphatic hydrocarbon group containing a ring in the structure thereof can be given.

The linear alkyl group preferably has 1 to 8 carbon atoms, more preferably 1 to 5, and most preferably 1 to 3. Specific examples include a methyl group, an ethyl group, an n-propyl group, an n-butyl group and an n-pentyl group. Among these, a methyl group, an ethyl group or an n-propyl group is preferable, and a methyl group or an ethyl group is more preferable.

The branched alkyl group preferably has 3 to 10 carbon atoms, more preferably 3 to 8, and most preferably 3 to 6.

As examples of the hydrocarbon group containing a ring in the structure thereof, a cyclic aliphatic hydrocarbon group (a group in which one hydrogen atom has been removed from an aliphatic hydrocarbon ring), and a group in which the cyclic aliphatic hydrocarbon group is bonded to the terminal of the aforementioned chain-like aliphatic hydrocarbon group or interposed between atoms within the aforementioned chain-like aliphatic hydrocarbon group, can be given.

The cyclic aliphatic hydrocarbon group preferably has 3 to 8 carbon atoms, and more preferably 4 to 6 carbon atoms. The cyclic aliphatic hydrocarbon group may be either a polycyclic group or a monocyclic group. As the monocyclic group, a group in which one or more hydrogen atoms have been removed from a monocycloalkane of 3 to 6 carbon atoms is preferable. Examples of the monocycloalkane include cyclopentane and cyclohexane. As the polycyclic group, a group in which one or more hydrogen atoms have been removed from a polycycloalkane of 7 to 12 carbon atoms is preferable. Examples of the polycycloalkane include adamantane, norbornane, isobornane, tricyclodecane and tetracyclododecane.

The chain-like aliphatic hydrocarbon group and the cyclic aliphatic hydrocarbon group may contain a fluorine atom or an oxygen atom. In other words, the hydrogen atom in the aliphatic hydrocarbon group may be substituted with a fluorine atom. The methylene group (—$CH_2$—) in the aliphatic hydrocarbon group may be substituted with an oxygen atom (—O—) or a carbonyl group (—C(=O)—).

When the monovalent hydrocarbon group for $R^1$ is an aromatic hydrocarbon group, the aromatic hydrocarbon group is a monovalent hydrocarbon group having at least one aromatic ring.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and particularly preferably 6 to 12. Here, the number of carbon atoms within a substituent(s) described later is not included in the number of carbon atoms of the aromatic ring.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthyl ethyl group, or a 2-naphthylethyl group).

The alkylene group which is bonded to the aforementioned aryl group or heteroaryl group preferably has 1 to 4 carbon atoms, more preferably 1 or 2 carbon atoms, and particularly preferably 1 carbon atom.

The aromatic hydrocarbon group may contain a fluorine atom or an oxygen atom. In other words, the hydrogen atom in the aromatic hydrocarbon group may be substituted with a fluorine atom. The methylene group (—$CH_2$—) in the aromatic hydrocarbon group may be substituted with an oxygen atom (—O—) or a carbonyl group (—C(=O)—).

In the aforementioned general formulae (Tc2-2) and (Tc2-3), R represents a hydrogen atom, an alkyl group of 1 to 5 carbon atoms or a halogenated alkyl group of 1 to 5 carbon atoms. Here, the plurality of the R group may be the same or different from each other.

As the alkyl group for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (Tc2-2), $R^2$ is the same as defined for $R^1$ in general formula (Tc2-1).

y represents an integer of 0 to 3, is preferably an integer of 0 to 2, is more preferably either 1 or 2, and is most preferably 1.

In general formula (Tc2-3), $R^3$ represents a hydrocarbon group which may have a substituent.

The hydrocarbon group for $R^3$ is the same hydrocarbon group as those described above for $R^1$ in general formula (Tc2-1).

Examples of the substituent for $R^3$ include a fluorine atom or a hydrocarbon group which may have a fluorine atom or an oxygen atom, and are the same groups as those described above for $R^1$ in the aforementioned formula (Tc2-1).

Specific examples of structural units represented by the general formula (Tc2-1) are shown below.

In the formula, $R^{11}$ represents a hydrogen atom or a hydrocarbon group which may have a fluorine atom.

The hydrocarbon group for is the same hydrocarbon group as those described above for $R^1$ in general formula (Tc2-1). In the chemical formula, the wavy line refers to both "wedge bond" and "dashed line bond".

[Chemical Formula 19]

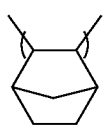
(Tc2-1-1)

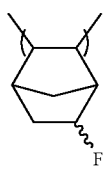
(Tc2-1-2)

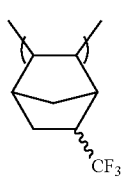
(Tc2-1-3)

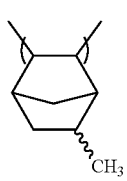
(Tc2-1-4)

-continued

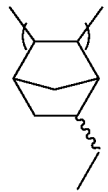
(Tc2-1-5)

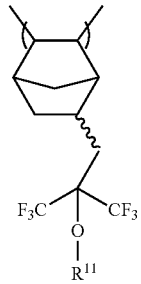
(Tc2-1-6)

(Tc2-1-7)

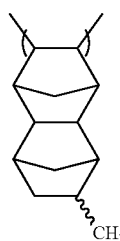
(Tc2-1-8)

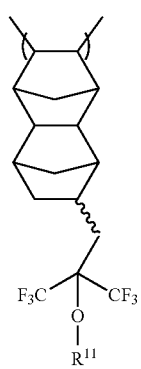
(Tc2-1-9)

Specific examples of structural units represented by the general formula (Tc2-2) are shown below. In the formulas shown below, $R^\alpha$ represents a hydrogen atom, a methyl group or a trifluoromethyl group.

In the formula, $R^{12}$ represents a hydrogen atom or a hydrocarbon group which may have a fluorine atom.

The hydrocarbon group for $R^{12}$ is the same hydrocarbon group as those described above for $R^1$ in general formula (Tc2-1).

[Chemical Formula 20]

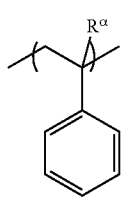 (Tc2-2-1)

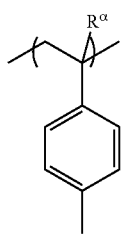 (Tc2-2-2)

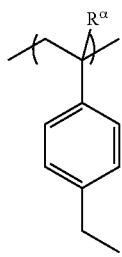 (Tc2-2-3)

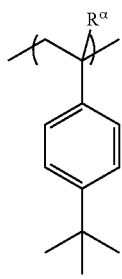 (Tc2-2-4)

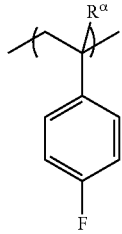 (Tc2-2-5)

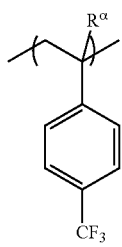 (Tc2-2-6)

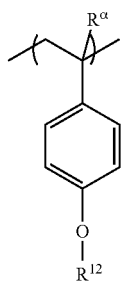 (Tc2-2-7)

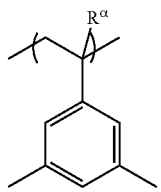 (Tc2-2-8)

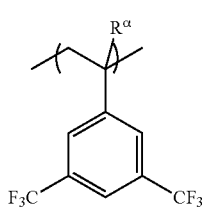 (Tc2-2-9)

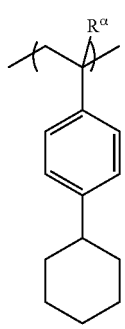 (Tc2-2-10)

Specific examples of structural units represented by the general formula (Tc2-3) are shown below. In the formulas shown below, $R^\alpha$ represents a hydrogen atom, a methyl group or a trifluoromethyl group.

In the formula, $R^{13}$ represents a hydrogen atom or a hydrocarbon group which may have a fluorine atom.

The hydrocarbon group for $R^{13}$ is the same hydrocarbon group as those described above for $R^1$ in general formula (Tc2-1).

[Chemical Formula 21]

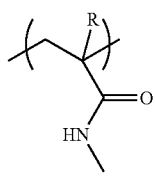 (Tc2-3-1)

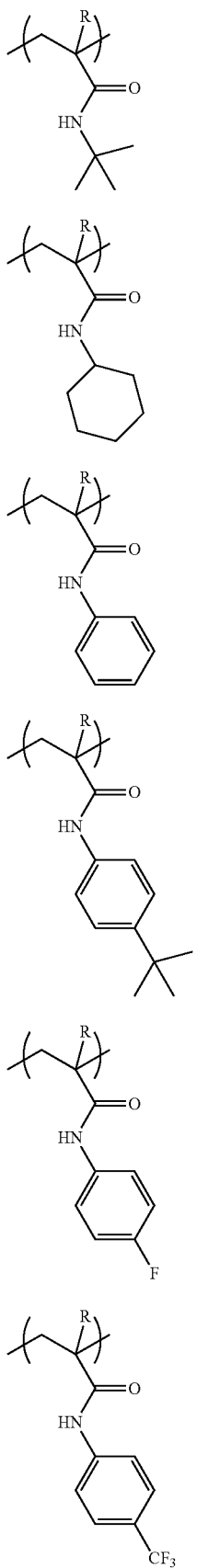
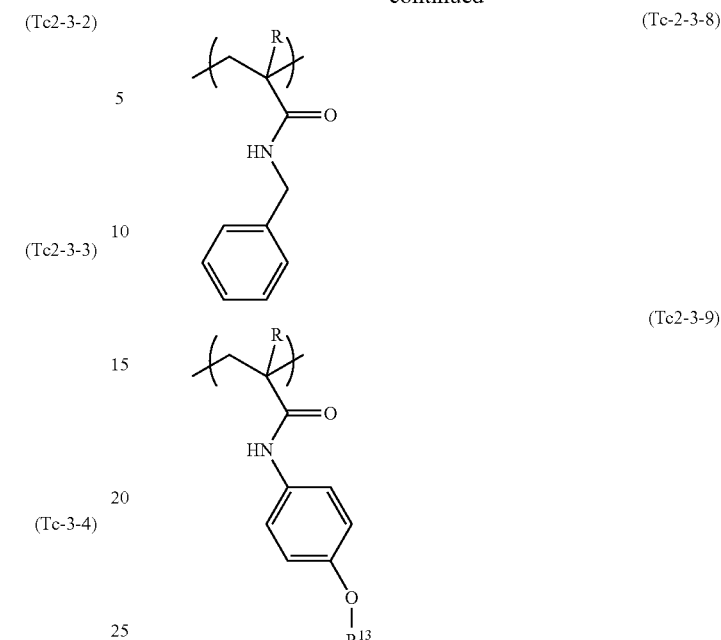

As the structural unit (T2), contained in the polymeric compound, 1 type of structural unit may be used, or 2 or more types may be used.

As the structural unit (Tc2), it is preferable to include at least one structural unit selected from the group consisting of a structural unit represented by the aforementioned general formula (Tc2-1), a structural unit represented by the aforementioned general formula (Tc2-2) and a structural unit represented by the aforementioned general formula (Tc2-3).

As a structural unit (Tc2) it is more preferable to include at least one structural unit selected from the group consisting of a structural unit represented by the aforementioned general formula (Tc2-1) and a structural unit represented by the aforementioned general formula (Tc2-2).

In the polymeric compound, the amount of the structural unit (Tc2) based on the combined total of all structural units constituting the polymeric compound is preferably 10 to 90 mol %, more preferably 20 to 70 mol %, and still more preferably 20 to 60 mol %.

When the amount of the structural unit (Tc2) is within the aforementioned range, the layer containing the block copolymer having a desirable surface energy may be easily obtained.

The polymeric compound used in the top coat material (2) may contain a structural unit other than the structural unit (Tc1) or (Tc2).

Examples of the structural unit other than the structural unit (Tc1) or (Tc2) include a structural unit (Tc3) that contributes to the glass transition temperature (Tg).

In the top coat material (2), as the polymeric compound containing the structural unit (Tc1) or (Tc2), one type of polymeric compound may be used alone, or two or more types of polymeric compounds may be used in combination.

The polymeric compound used in the top coat material (2) is a polymer containing at least the structural unit (Tc1) and the structural unit (Tc2).

More specifically, preferable examples of the copolymer include a copolymer containing a repeating structure of a structural unit represented by general formula (Tc1-2) a structural unit represented by general formula (Tc2-1); a copolymer containing a repeating structure of a structural unit represented by general formula (Tc1-2) and a structural unit represented by general formula (Tc2-2); a copolymer containing a repeating structure of a structural unit represented by general formula (Tc1-2) and a structural unit represented by general formula (Tc2-3); a copolymer containing a repeating structure of a structural unit represented by general formula (Tc1-2), a structural unit represented by general formula (Tc2-1) and a structural unit represented by general formula (Tc2-2); a copolymer containing a repeating structure of a structural unit represented by general formula (Tc1-2), a structural unit represented by general formula (Tc2-1) and a structural unit represented by general formula (Tc2-3); a copolymer containing a repeating structure of a structural unit represented by general formula (Tc1-2), a structural unit represented by general formula (Tc2-2) and a structural unit represented by general formula (Tc2-3); and a copolymer containing a repeating structure of a structural unit represented by general formula (Tc1-1), a structural unit represented by general formula (Tc2-1) and a structural unit represented by general formula (Tc2-2). Among these copolymers, it is preferable to include a copolymer containing a repeating structure of a structural unit represented by general formula (Tc1-1), a structural unit represented by general formula (Tc2-1) and structural unit represented by general formula (Tc2-2).

Specific examples of polymeric compounds used in the top coat material (2) are shown below.

In the formulae, $R^1$, $R^2$, $R^3$ and y are respectively the same as defined for $R^1$, $R^2$, $R^3$ and in the formulae (Tc2-1) to (Tc2-3).

In the formulae, $R^\alpha$ is the same as defined for R in the formulae (Tc2-2) and (Tc2-3). In the formulae, $R^{1a}$ and $R^{1b}$ are the same as defined for $R^1$ in the formula (Tc2-1).

$R^{2a}$ and $R^{2b}$ are the same as defined for $R^2$ in the formula (Tc2-2).

$y_1$ and $y_2$ are the same as defined for y in the formula (Tc2-2).

$R^{3a}$ and $R^{3b}$ are the same as defined for $R^3$ in the formula (Tc2-3).

[Chemical Formula 22]

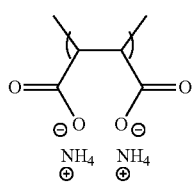 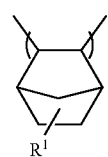
(TC1)

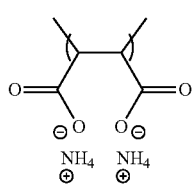 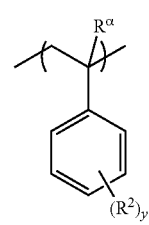
(TC2)

[Chemical Formula 23]

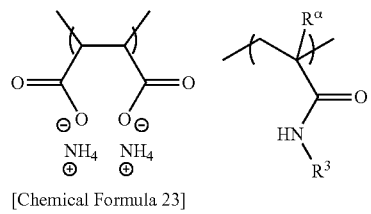
(TC3)

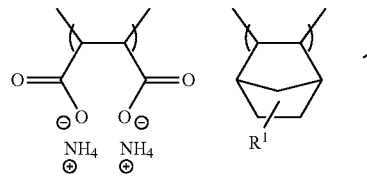
(TC4)

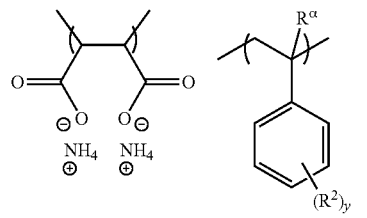
(TC5)

[Chemical Formula 24]

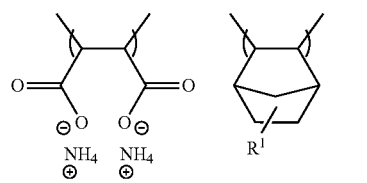
(TC6)

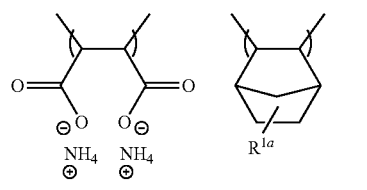
(TC7)

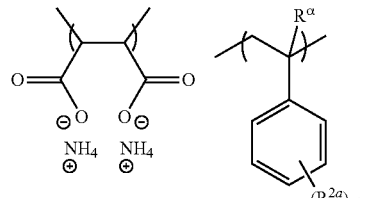
(TC8)

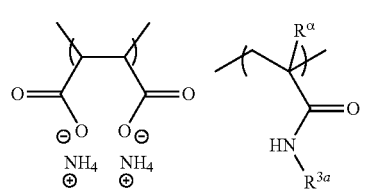
(TC9)

-continued

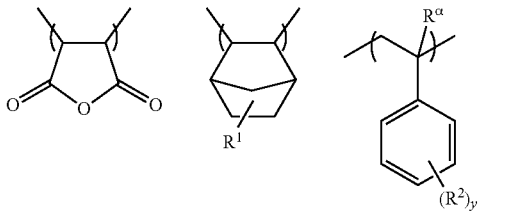
(TC10)

The weight average molecular weight (Mw) (the polystyrene equivalent value determined by gel permeation chromatography) of the polymeric compound used for the top coat material (2) is not particularly limited, but is preferably 1,000 to 50,000, more preferably 1,500 to 30,000, and most preferably 2,000 to 30,000. By ensuring the aforementioned range, solubility in an organic solvent can be increased.

Further, the dispersity (Mw/Mn) of the polymeric compound is not particularly limited, but is preferably 1.0 to 6.0, more preferably 1.0 to 5.0, and most preferably 1.0 to 4.0.

The polymeric compound can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

In the topcoat material (2), the amount of the polymeric compound can be appropriately adjusted depending on the thickness of the topcoat film to be formed, and the like. In the topcoat material (2), the concentration of the polymeric compound is preferably 0.1 to 15% by weight, and more preferably 0.2 to 7% by weight.

(Optional Components)

If desired, other miscible additives such as the surface energy control agent can also be added to the top coat material (2), in addition to the polymeric compound.

Solvent

The top coat material (2) can be produced by dissolving the polymeric compound in a solvent.

As a solvent, any solvents can be used, as long as it dissolves the respective components so as to give a uniform solution. Examples the solvents include water, aqueous ammonia (preferably 10 to 50% by weight), methanol, a mixed solvent of methanol and aqueous ammonia, a mixed solvent of water and methanol, a mixed solvent of aqueous ammonia and ethanol.

<<Method of Forming a Fine Pattern>>

A third aspect of the present invention is a method of forming a fine pattern including: a step in which a substrate is subjected to etching using a mask, the pattern is formed by the method of forming a pattern according to the second aspect.

[Etching Step]

The Etching step is a step in which a substrate is subjected to etching treatment using a pattern formed from the phase-separated structure as a mask.

The method of etching is not particularly limited, and dry etching is preferable. Among dry etching, in terms of efficiency, oxygen ($O_2$)-plasma etching or etching using a $CF_4$ gas, a $CHF_3$ gas or an $Ar/CF_4$ gas is preferable, and oxygen-plasma etching is particularly desirable.

The condition during dry etching is not particularly limited, but can be appropriately employed depending on the type of material constituting the pattern of the phase-separated structure or the thickness of the pattern from the surface of the substrate. When oxygen plasma treatment is employed, the pressure during the oxygen plasma treatment is preferably 1.33 to 66.5 Pa (10 to 50 mtorr), and more preferably 13.3 to 26.6 Pa (100 to 200 mtorr). The plasma power during oxygen plasma treatment is preferably 5 to 500 W, and more preferably 5 to 50 W. The treatment time of the oxygen plasma treatment is preferably 1 to 100 seconds, and more preferably 2 to 60 seconds. The temperature during the oxygen plasma treatment is preferably −30 to 300° C., more preferably 0 to 100° C., and most preferably a room temperature (5 to 40° C.). The plasma equipment used for oxygen plasma treatment is not particularly limited, and for example, PE-2000 Plasma etcher (product name, manufactured by South Bay Technology, Inc., USA) and the like can be used.

EXAMPLES

As follows is a description of examples of the present invention, although the scope of the present invention is by no way limited by these examples.

Neutralization Film

By using each of the monomers (1) to (7) with the molar ratio indicated in Tables 1 and 2, each of resins 1 to 12 was synthesized. Then each of resins 1 to 12 was dissolved in propylene glycol monomethyl ether acetate (PGMEA), thereby preparing undercoat agents 1 to 12 having a solid content of 1.0% by weight. With respect to the undercoat agent containing a structural unit derived from the monomer (2) or (3), structural units derived from the monomer (2) or (3) could not be separated, and hence, the molar ratio indicated in Table 1 is based on the used amount of the resin. In the monomer (5) shown below, $R^0$ is an isobutyl group.

[Chemical Formula 25]

(1)
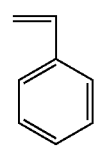

(2)
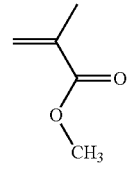

(3)
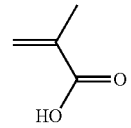

(4)
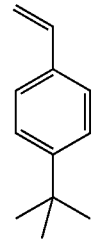

-continued

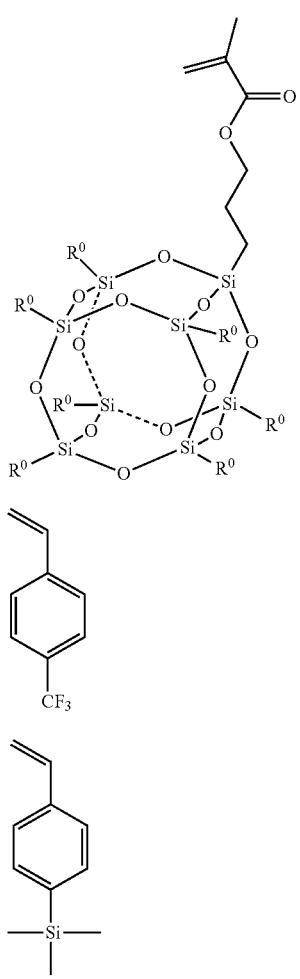

(5)

(6)

(7)

TABLE 2-continued

| | Undercoat agent | | | |
|---|---|---|---|---|
| | 9 | 10 | 11 | 12 |
| Mw | 60000 | 60000 | 60000 | 60000 |
| Mw/Mn | 1.5 | 1.5 | 1.5 | 1.5 |

<<Measurement and Calculation of Surface Free Energy>>

With respect to the undercoat agents 1 to 12 (hereinafter, sometimes referred to as "neutralization film"), the block composed of POSS structure-containing structural unit (hereinafter, sometimes referred to as "A block"), the block composed of the structural unit derived from methyl methacrylate (hereinafter, sometimes referred to as "B block"), the block composed of polystyrene (hereinafter, sometimes referred to as "C block"), the block composed of poly(trimethylsilylstyrene) (hereinafter, sometimes referred to as "D block"), and the block composed of poly(t-butylstyrene) (hereinafter, sometimes referred to as "E block"), the contact angle with respect to water and the contact angle with respect to diiodomethane were measured using Multi-function integrated analysis software "FAMAS" (manufactured by Kyowa Interface Science Co., Ltd.). Further, by using the software, the surface free energy based on Wu's theory was calculated. In the measurement of the contact angle of A to E blocks, following homopolymers were used: a homopolymer consisting of the structural unit containing the POSS structure (i.e., the structural unit having a molar ratio of m and represented by the formula (BCP)-1 shown below) and having a molecular weight of 7,000; a homopolymer (PMMA) consisting of the structural unit derived from methyl methacrylate (i.e., the structural unit having a molar ratio of 1 and represented in the formula (BCP)-1 shown below) and having a molecular weight of 7,000; a homopolymer (polystyrene) consisting of the structural unit derived from styrene (i.e., the structural unit having a molar ratio of 1 and represented in the formula (BCP)-2 shown below) and having a molecular weight of 7,000; and a homopolymer (PMMA) consisting of the structural unit having a molar ratio of 1 and represented in the formula (BCP)-2 shown below) and having a molecular weight of 7,000. The resin solution for forming a homopolymer film was prepared to have a solid content of the resin of 1% by weight using methyl amyl ketone as a solvent, and the solution was used for measurement of contact angle. Each of the neutralization films having a thickness of about 25 nm and each of the homopolymer films having a thickness of about 25 nm were used to determine contact angle.

The results are shown under "SFE-Wu d" (dispersive component) and "SFE-Wu p (polar component)" in Table 3. The

TABLE 1

| | | Undercoat agent | | | | | | | |
|---|---|---|---|---|---|---|---|---|---|
| | | 1 | 2 | 3 | 4 | 5 | 6 | 7 | 8 |
| Monomer | (1) | 25 | 60 | 97 | | | | | |
| | (2) | 72 | 37 | | 51 | | 51 | | 77 |
| | (3) | 3 | 3 | 3 | 3 | 3 | 3 | 3 | 3 |
| | (4) | | | | | | 46 | 97 | |
| | (5) | | | | | | | | 20 |
| | (6) | | | | | 46 | 97 | | |
| Mw | | 60000 | 60000 | 60000 | 60000 | 60000 | 60000 | 60000 | 60000 |
| Mw/Mn | | 1.5 | 1.5 | 1.5 | 1.5 | 1.5 | 1.5 | 1.5 | 1.5 |

TABLE 2

| | | Undercoat agent | | | |
|---|---|---|---|---|---|
| | | 9 | 10 | 11 | 12 |
| Monomer | (1) | | | | |
| | (2) | | 13 | 51 | 73 |
| | (3) | 3 | 4 | 3 | 3 |
| | (4) | | 83 | | 24 |
| | (5) | | | | |
| | (6) | | | | |
| | (7) | 97 | | 46 | | unit is mJ/m². In Table 3, each square root of SFE-Wu d and SFE-Wu p is shown as SQRT-d and SQRT-p, respectively. The unit is (mJ/m²)^{1/2}.

TABLE 3

| | SFE-Wu d | SFE-Wu p | Dispersive component SQRT-d | Polar component SQRT-p |
|---|---|---|---|---|
| A block | 40.4 | 0.0 | 6.4 | 0.0 |
| B block | 30.1 | 16.1 | 5.5 | 4.0 |
| C block | 41.3 | 4.8 | 6.4 | 2.2 |
| D block | 38.6 | 0.0 | 6.2 | 0.0 |
| E block | 37.5 | 0.8 | 6.1 | 0.9 |
| Undercoat agent 1 | 37.5 | 6.2 | 6.1 | 2.5 |
| Undercoat agent 2 | 34.9 | 9.9 | 5.9 | 3.1 |
| Undercoat agent 3 | 32.5 | 13.1 | 5.7 | 3.6 |
| Undercoat agent 4 | 27.6 | 6.5 | 5.3 | 2.5 |
| Undercoat agent 5 | 25.3 | 3.8 | 5.0 | 1.9 |
| Undercoat agent 6 | 32.6 | 6.1 | 5.7 | 2.5 |
| Undercoat agent 7 | 38.5 | 0.5 | 6.2 | 0.7 |
| Undercoat agent 8 | 29.5 | 0.9 | 5.4 | 0.9 |
| Undercoat agent 9 | 37.6 | 1.1 | 6.1 | 1.0 |
| Undercoat agent 10 | 35.8 | 2.3 | 6.0 | 1.5 |
| Undercoat agent 11 | 33.0 | 3.0 | 5.7 | 1.7 |
| Undercoat agent 12 | 29.6 | 11.3 | 5.4 | 3.4 |

Figure 4:
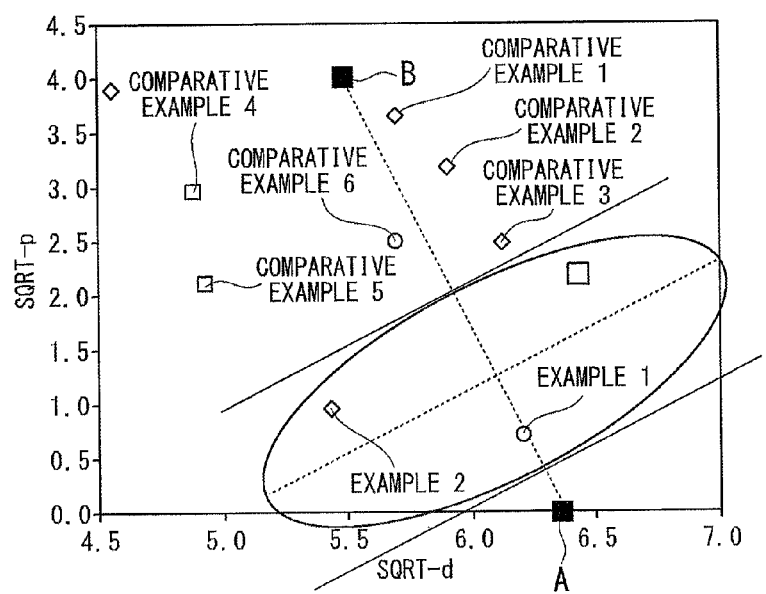
FIG. 4 is a diagram showing an example of one embodiment of the present invention.

Based on the results, in the plane of coordinates shown in FIG. 4, the square root of the dispersive component SQRT-d (square root of the dispersive component (d)^{0.5}) was plotted along the direction of the horizontal axis, and the square root of the polar component SQRT-p (square root of the polar component (p)^{0.5}) was plotted along the direction of the vertical axis, and coordinate points of A and B blocks and the undercoat agents 1 to 8 were plotted.

The coordinate point A of the A block (square root of dispersive component: 6.4, square root of polar component: 0.0), the coordinate point B of the B block (square root of dispersive component: 5.5, square root of polar component: 4.0), and the coordinate point N of each undercoat agent (i.e., neutralization film) (square root of dispersive component $(dP_N)^{0.5}$, square root of polar component $(pP_N)^{0.5}$) were plotted. From the results, it was confirmed that, with respect to the coordinate point N of the undercoat agent (i.e., neutralization film), the coordinate point N of undercoat agent 7 (Example 1 in FIG. 4) and the coordinate point N of undercoat agent 8 (Example 2 in FIG. 4) were within the range of the ellipse $E_A$. The ellipse $E_A$ has the point $O_A$ as a center of the ellipse, the point OA divides the line segment AB in the ratio of 3:7, the line segment AB is on the minor axis of the ellipse $E_A$, the minor radius is 0.4 times the length of the line segment AB, and the major radius is 3 times the length of the line segment AB.

The coordinate points of the undercoat agents 1 to 6 (see Comparative Examples 1 to 6 in FIG. 4) were outside the range of the ellipse $E_A$.

Block Copolymer

The block copolymers (1) and (2) represented by chemical formula (BCP)-1 shown below but having respective molar ratio of the structural units, and the block copolymers (3) and (4) represented by chemical formula (BCP)-2 shown below but having respective molar ratio of the structural unit were used.

[Chemical Formula 26]

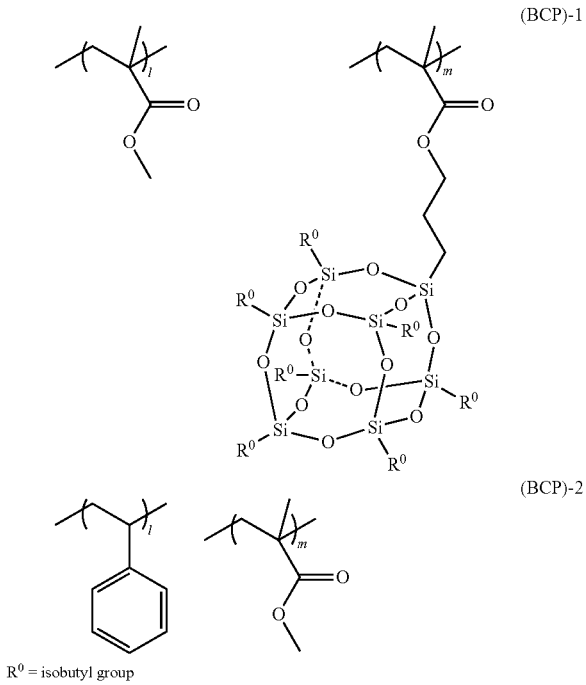

$R^0$ = isobutyl group

Block copolymer (1): phase-separated structure having a cylindrical structure was formed (period $L_0$=20 nm). The weight average molecular weight (Mw) and the dispersity (Mw/Mn) in terms of the polystyrene equivalent value measured by gel permeation chromatography (GPC) were 20,000 and 1.02, respectively. Further, as a result of an analysis by $^{13}$C-NMR, it was found that the copolymer compositional ratio (ratio (molar ratio) of the respective structural units) was l/m=74/26.

A 2-heptanone solution containing the block copolymer (1) and 2-heptanone and having a solid content of the block copolymer (1) of 1.0% by weight was prepared, thereby obtaining a block copolymer (1)-containing composition.

Block copolymer (2): phase-separated structure having a lamellar structure was formed (period $L_0$=20 nm). The weight average molecular weight (Mw) and the dispersity (Mw/Mn) in terms of the polystyrene equivalent value measured by gel permeation chromatography (GPC) were 20,000 and 1.02, respectively. Further, as a result of an analysis by $^{13}$C-NMR, it was found that the copolymer compositional ratio (ratio (molar ratio) of the respective structural units) was l/m=95/5.

A 2-heptanone solution containing the block copolymer (2) and 2-heptanone and having a solid content of the block copolymer (2) of 1.0% by weight was prepared, thereby obtaining a block copolymer (2)-containing composition.

Block copolymer (3): phase-separated structure having a cylindrical structure was formed (period $L_0$=24 nm). The weight average molecular weight (Mw) and the dispersity (Mw/Mn) in terms of the polystyrene equivalent value measured by gel permeation chromatography (GPC) were 35,000 and 1.02, respectively. Further, as a result of an analysis by $^{13}$C-NMR, it was found that the copolymer compositional ratio (ratio (molar ratio) of the respective structural units) was l/m=75/25.

A PGMEA solution containing the block copolymer (3) and PGMEA and having a solid content of the block copolymer (3) of 2.0% by weight was prepared, thereby obtaining a block copolymer (3)-containing composition.

Block copolymer (4): phase-separated structure having a lamellar structure was formed (period $L_0$=51 nm) The weight average molecular weight (Mw) and the dispersity (Mw/Mn) in terms of the polystyrene equivalent value measured by gel permeation chromatography (GPC) were 110,000 and 1.02, respectively. Further, as a result of an analysis by $^{13}$C-NMR, it was found that the copolymer compositional ratio (ratio (molar ratio) of the respective structural units) was l/m=55/45.

A PGMEA solution containing the block copolymer (4) and PGMEA and having a solid content of the block copolymer (4) of 2.0% by weight was prepared, thereby obtaining a block copolymer (4)-containing composition.

Block copolymer (5): phase-separated structure having a lamellar structure was formed (period $L_0$=37 nm) using the block copolymer (5) represented by formula (BCP)-3 shown below. The weight average molecular weight (Mw) and the dispersity (Mw/Mn) in terms of the polystyrene equivalent value measured by gel permeation chromatography (GPC) were 62,000 and 1.02, respectively. Further, as a result of an analysis by $^{13}$C-NMR, it was found that the copolymer compositional ratio (ratio (molar ratio) of the respective structural units) was l/m=34/66.

A PGMEA solution containing the block copolymer (5) and PGMEA and having a solid content of the block copolymer (5) of 2.0% by weight was prepared, thereby obtaining a block copolymer (5)-containing composition.

[Chemical Formula 27]

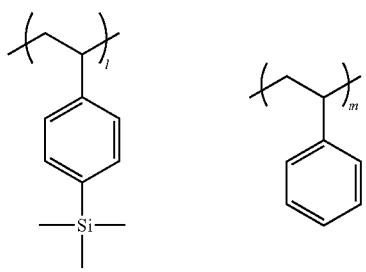

(BCP)-3

Block copolymer (6): phase-separated structure having a cylindrical structure was formed (period $L_0$=48 nm) using the block copolymer (6) represented by formula (BCP)-4 shown below. The weight average molecular weight (Mw) and the dispersity (Mw/Mn) in terms of the polystyrene equivalent value measured by gel permeation chromatography (GPC) were 96,000 and 1.02, respectively. Further, as a result of an analysis by $^{13}$C-NMR, it was found that the copolymer compositional ratio (ratio (molar ratio) of the respective structural units) was l/m=66/34.

A PGMEA solution containing the block copolymer (6) and PGMEA and having a solid content of the block copolymer (6) of 2.0% by weight was prepared, thereby obtaining a block copolymer (6)-containing composition.

[Chemical Formula 28]

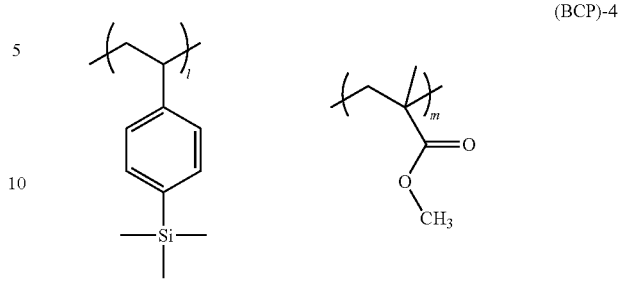

(BCP)-4

Block copolymer (7): phase-separated structure having a cylindrical structure was formed (period $L_0$=45 nm) using the block copolymer (7) represented by formula (BCP)-5 shown below. The weight average molecular weight (Mw) and the dispersity (Mw/Mn) in terms of the polystyrene equivalent value measured by gel permeation chromatography (GPC) were 96,000 and 1.02, respectively. Further, as a result of an analysis by $^{13}$C-NMR, it was found that the copolymer compositional ratio (ratio (molar ratio) of the respective structural units) was l/m=75/25.

A PGMEA solution containing the block copolymer (7) and PGMEA and having a solid content of the block copolymer (7) of 2.0% by weight was prepared, thereby obtaining a block copolymer (7)-containing composition.

[Chemical Formula 29]

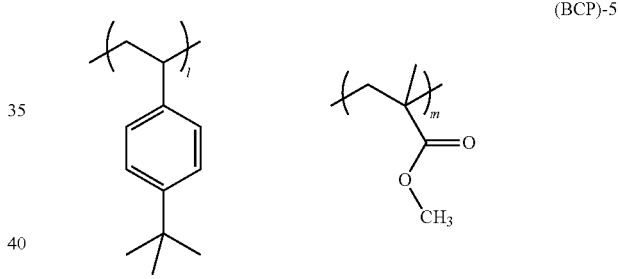

(BCP)-5

Top Coat (TC) Material

TC material (2-1): a solution of 1.5% by weight, containing the polymeric compound represented by chemical formula (TC)-1 shown below with a solvent (mixed solvent of aqueous ammonia:methanol=1:3 (weight ratio))

[Chemical Formula 30]

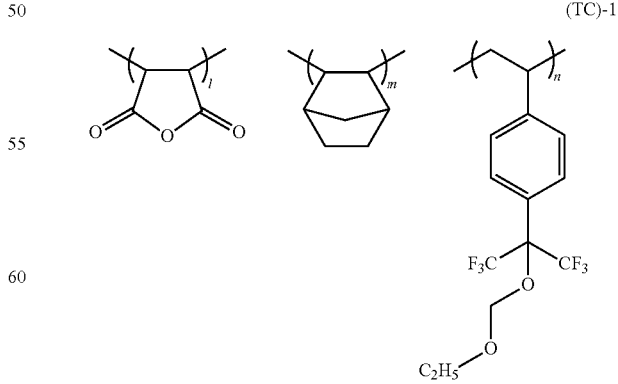

(TC)-1

With respect to the polymeric compound represented by chemical formula (TC)-1 shown below, the weight average molecular weight (Mw) and the dispersity (Mw/Mn) were determined by the polystyrene equivalent value as measured by gel permeation chromatography (GPC). As a result, it was found that the weight average molecular weight was 13,400, and the dispersity was 2.7. Further, as a result of an analysis by $^{13}$C-NMR, it was found that the copolymer compositional ratio (ratio (molar ratio) of the respective structural units) was l/m/n=60/16/24.

<<Formation of Pattern>>

In accordance with the following method of each example, a structure containing a phase-separated structure was formed through phase separation of the layer containing each of the block copolymers (1) to (7), and then, the phase of the block composed of the structural unit derived from methyl methacrylate was selectively removed from the structure, thereby forming a pattern. Next, the cross-sectional shape of the obtained pattern was observed. Whether or not a lamellar phase-separated structure or a cylindrical phase-separated structure oriented in a perpendicular direction to the surface of the substrate was formed was evaluated.

Examples 1 and 2, Comparative Examples 1 to 6

Each of the undercoat agents indicated in Table 4 was applied to an 8-inch silicon wafer that had been subjected to bake treatment (dehydration bake) at 200° C. for 60 seconds, such that the layer composed of the undercoat agent was formed to have a thickness of 20 nm, followed by bake treatment at 230° C. for 60 seconds. Then, a rinse treatment was conducted using PGMEA so as to remove the uncrosslinked portions, followed by a post bake at 90° C. for 60 seconds for drying. Then, the block copolymer (1)-containing composition was applied to the layer composed of the undercoat agent (Comparative Examples 1 to 6, Examples 1 and 2) by spin coating (number of revolution:1500 rpm, 60 seconds), and then a bake treatment was conducted at 110° C. for 60 seconds, thereby forming a layer containing the block copolymer (1) having a film thickness of 18 nm.

To the layer containing the block copolymer (1), the TC material (2-1) was applied, thereby forming a top coat film having a film thickness of 57 nm.

Next, the layer containing the block copolymer (1) was subjected to a phase separation caused by a heat annealing treatment in air at 180° C. for 1 hour, followed by removing the top coat film using a mixed solvent of aqueous ammonia and methanol (aqueous ammonia:methanol=1:3 (weight ratio)), thereby obtaining a structure containing a phase-separated structure.

Then, using TCA-3822 (product name; manufactured by Tokyo Ohka Kogyo Co., Ltd.), the structure was subjected to an oxygen plasma treatment (200 sccm, 40 Pa, 200 W, 30 seconds, 40° C.), thereby removing only the phase of the block composed of the structural unit derived from methyl methacrylate from the structure.

The cross-sectional shape of the obtained pattern was observed using a scanning electron microscope (acceleration voltage: 800V, product name: SU8000, manufactured by Hitachi High-Technologies Corporation). The formation of a cylindrical phase-separated structure oriented in a perpendicular direction to the surface of the substrate was observed.

Examples 3 and 4, Comparative Examples 7 and 8

A pattern was formed in the same manner as described above, except that the block copolymer (2)-containing composition was used instead of the block copolymer (1)-containing composition and each of the undercoat agents indicated in Table 4 were used. As a result, in Examples 3 and 4, the formation of a lamellar phase-separated structure oriented in a perpendicular direction to the surface of the substrate was observed.

Figure 5:
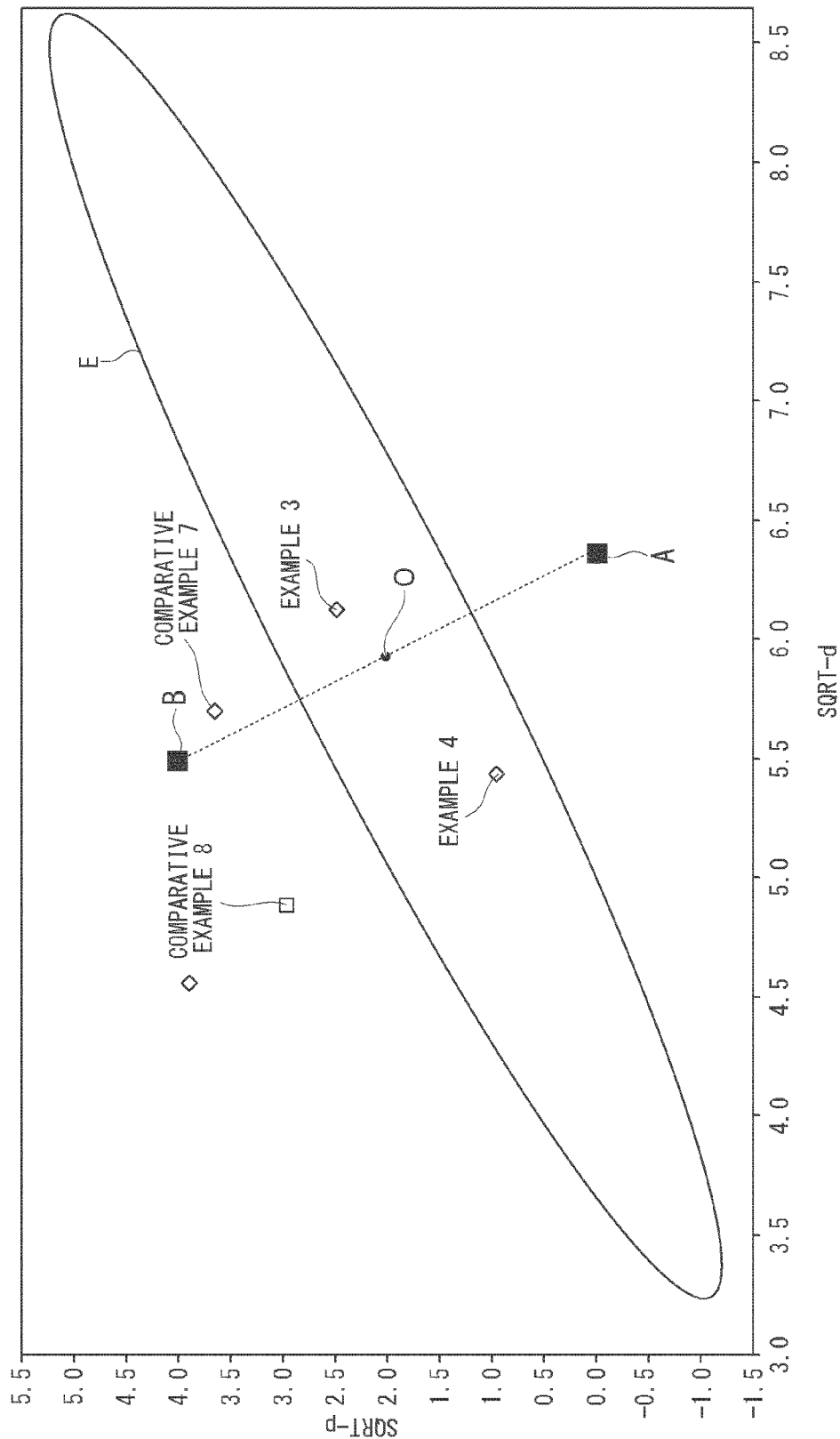
FIG. 5 is a diagram showing an example of one embodiment of the present invention.

The coordinate point A of the A block (square root of dispersive component: 6.4, square root of polar component: 0.0), the coordinate point B of the B block (square root of dispersive component: 5.5, square root of polar component: 4.0), and the coordinate point N of each undercoat agent (i.e., neutralization film) (square root of dispersive component $(dP_N)^{0.5}$, square root of polar component $(pP_N)^{0.5}$) were plotted. From the results, it was confirmed that, with respect to the coordinate point N of the undercoat agent (i.e., neutralization film), the coordinate point N of each of the undercoat agents of Examples 3 and 4 was within the range of the ellipse E. The ellipse E has the point O as a center of the ellipse E, the point O divides the line segment AB in the ratio of 5:5, the line segment AB is on the minor axis of the ellipse E, the minor radius is 0.4 times the length of the line segment AB, and the major radius is 3 times the length of the line segment AB (see Examples 3 and 4 in FIG. 5). As shown in FIG. 5, the coordinate point N of each of the undercoat agents (i.e., neutralization films) of Comparative Examples 7 and 8 was outside the range of the ellipse E.

Examples 5 and 6

A pattern was formed in the same manner as described above, except that the block copolymer (3)-containing composition was used instead of the block copolymer (1)-containing composition, the undercoat agent indicated in Table 4 was used, and a heat annealing treatment at 180° C. for 600 seconds was conducted under a nitrogen atmosphere without using the TC material (2-1). As a result, in Examples 5 and 6, the formation of a cylindrical phase-separated structure oriented in a perpendicular direction to the surface of the substrate was observed.

Figure 6:
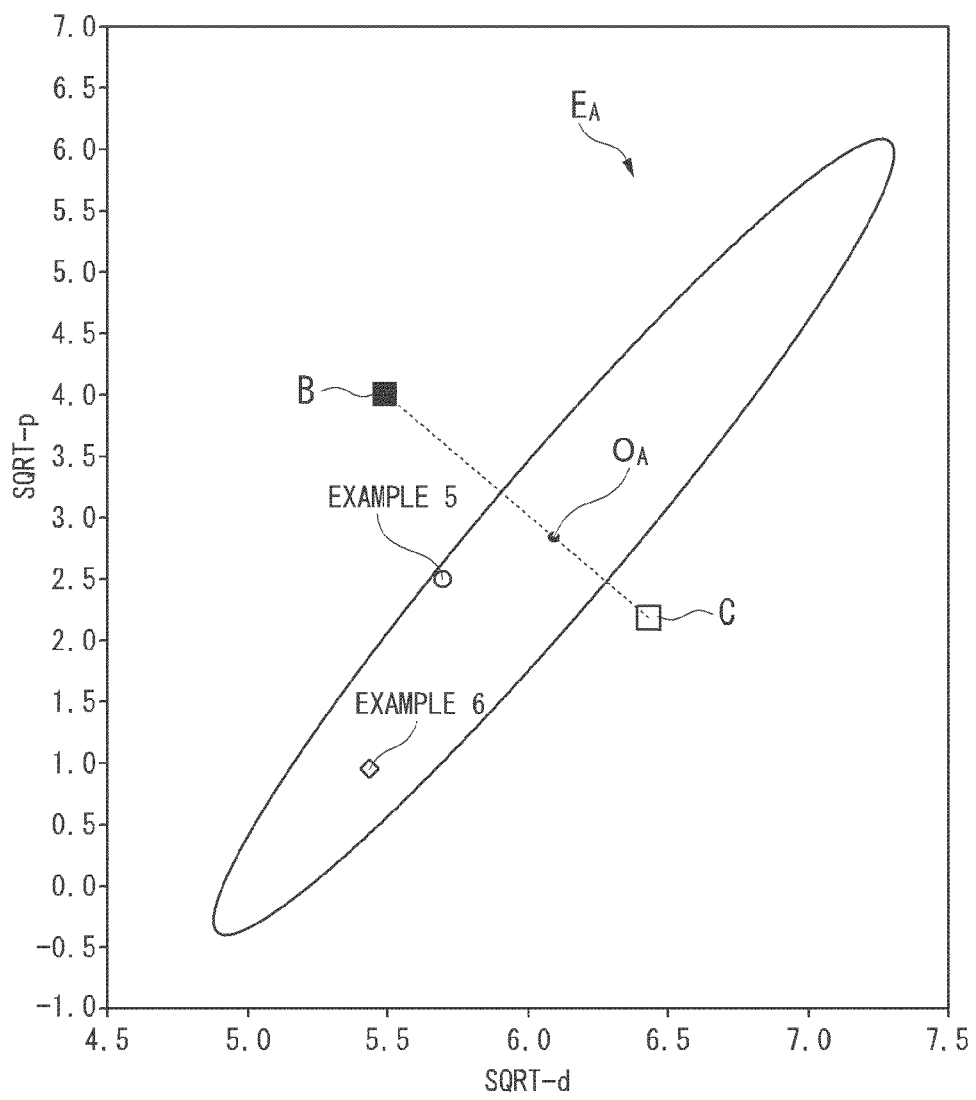
FIG. 6 is a diagram showing an example of one embodiment of the present invention.

The coordinate point B of the B block (square root of dispersive component: 5.5, square root of polar component: 4.0), the coordinate point C of the C block (square root of dispersive component: 6.4, square root of polar component: 2.2), and the coordinate point N of each undercoat agent (i.e., neutralization film) (square root of dispersive component $(dP_N)^{0.5}$, square root of polar component $(pP_N)^{0.5}$) were plotted. From the results, it was confirmed that the coordinate point N of each of the undercoat agents (i.e., neutralization films) of Examples 5 and 6 was within the range of the ellipse $E_A$. The ellipse $E_A$ has the point $O_A$ as a center of the ellipse $E_A$, and as shown in FIG. 6, the point $O_A$ divides the line segment BC into the length ratio of 7:3, the line segment BC is on the minor axis of the ellipse $E_A$, the minor radius is 0.4 times the length of the line segment BC, and the major radius is 3 times the length of the line segment BC.

Example 7

A pattern was formed in the same manner as described above, except that the block copolymer (4)-containing composition was used instead of the block copolymer (1)-containing composition, the undercoat agent indicated in Table 4 was used, and a heat annealing treatment at 240° C. for 600 seconds was conducted under a nitrogen atmosphere without using the TC material (2-1). As a result, in Example 7, the formation of a lamellar phase-separated structure oriented in a perpendicular direction to the surface of the substrate was observed.

Figure 7:
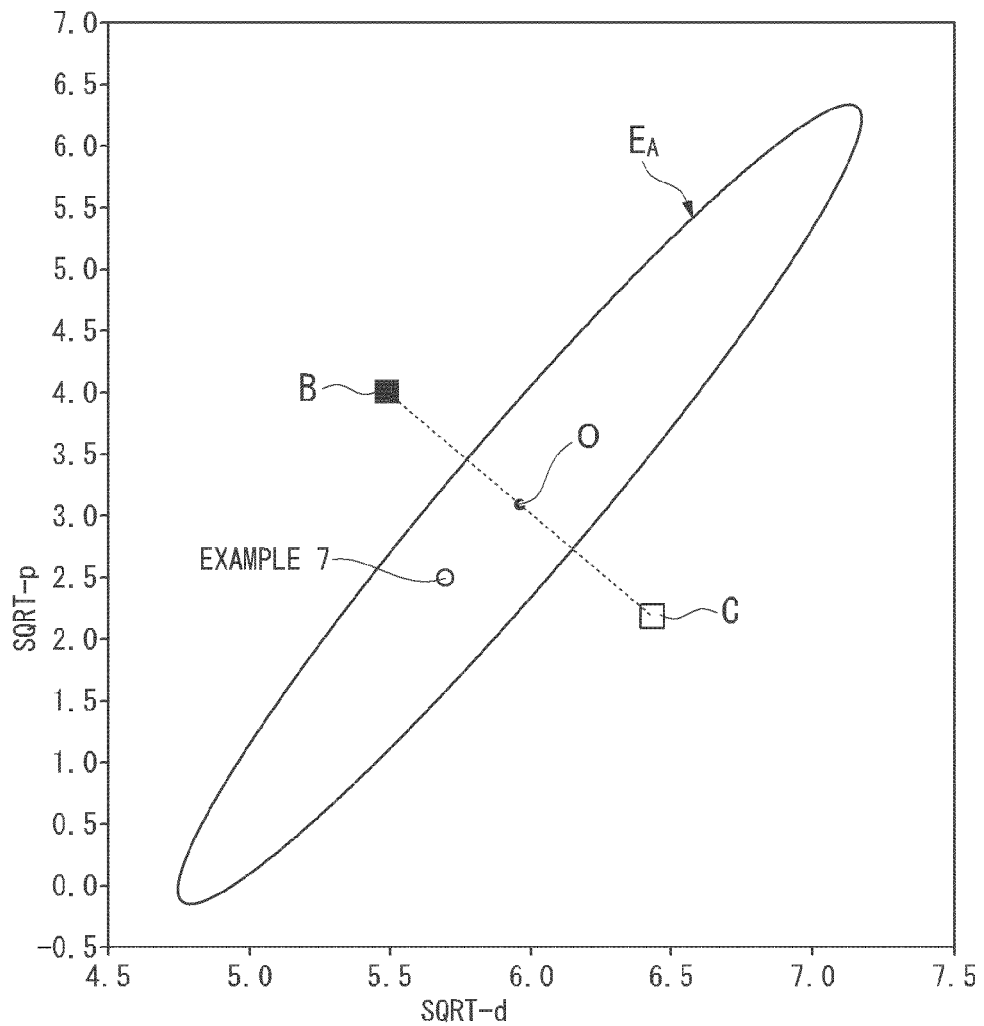
FIG. 7 is a diagram showing an example of one embodiment of the present invention.

The coordinate point B of the B block (square root of dispersive component: 5.5, square root of polar component: 4.0), the coordinate point C of the C block (square root of dispersive component: 6.4, square root of polar component: 2.2), and the coordinate point N of each undercoat agent (i.e., neutralization film) (square root of dispersive component $(dP_N)^{0.5}$, square root of polar component $(pP_N)^{0.5}$) were plotted. From the results, it was confirmed that the coordinate point N of the undercoat agent (i.e., neutralization film) of Example 7 was within the range of the ellipse $E_A$. The ellipse $E_A$ has the point O as a center of the ellipse, and as shown in FIG. 7, the point O divides the line segment BC into the length ratio of 5:5, the line segment BC is on the minor axis of the ellipse $E_A$, the minor radius is 0.4 the length of the line segment BC, and the major radius is 3 times the length of the line segment BC.

Example 8

A pattern was formed in the same manner as described above, except that the block copolymer (5)-containing composition was used instead of the block copolymer (1)-containing composition, the undercoat agent indicated in Table 4 was used and a heat annealing treatment at 240° C. for 600 seconds was conducted under a nitrogen atmosphere without using the TC material (2-1). As a result, in Example 8, the formation of a lamellar phase-separated structure oriented in a perpendicular direction of the surface of the substrate was observed.

Figure 10:
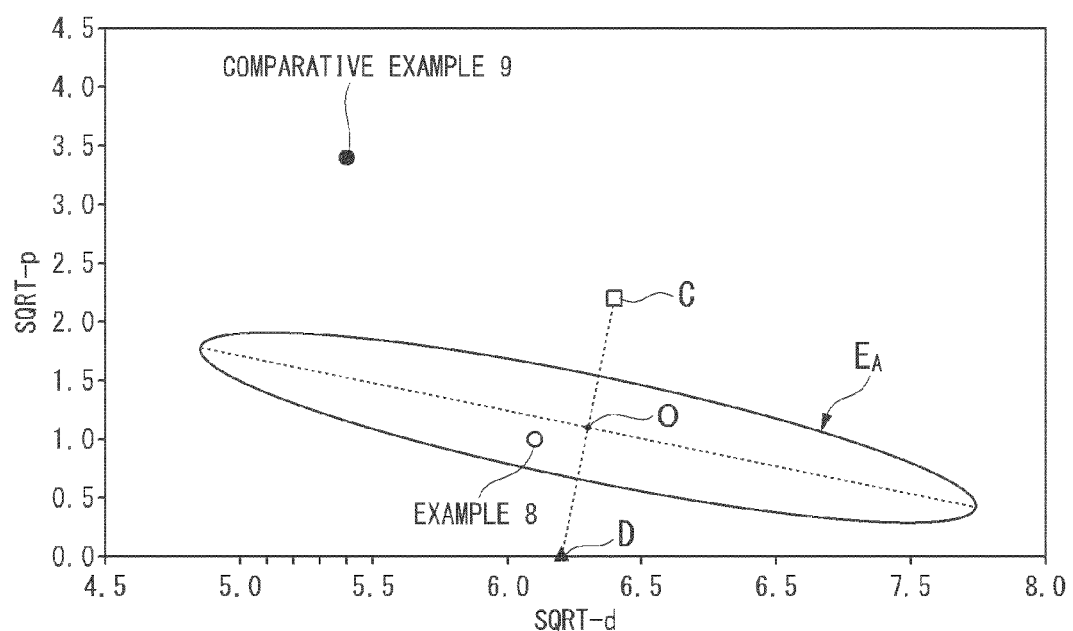
FIG. 10 is a diagram showing an example of one embodiment of the first aspect of the present invention.

The coordinate point D of the D block (square root of dispersive component: 6.2, square root of polar component: 0.0), the coordinate point C of the C block (square root of dispersive component: 6.4, square root of polar component: 2.2), and the coordinate point N of each undercoat agents (i.e., neutralization film) (square root of dispersive component $(dP_N)^{0.5}$, square root of polar component $(pP_N)^{0.5}$) were plotted. From the results, it was confirmed that the coordinate point N of the undercoat agent (i.e., neutralization film) of Example 8 was within the range of the ellipse $E_A$. The ellipse $E_A$ has the point O as a center of the ellipse $E_A$, and as shown in FIG. 10, the point O divides the line segment DC in the length ratio of 5:5, the line segment DC is on the minor axis of the ellipse $E_A$, the minor radius is 0.4 times the length of the line segment DC, and the major radius is 3 times the length of the line segment DC.

Example 9

A pattern was formed in the same manner as described above, except that the block copolymer (6)-containing composition was used instead of the block copolymer (1)-containing composition, the undercoat agents indicated in Table 4 was used, and a heat annealing treatment at 240° C. for 600 seconds was conducted under a nitrogen atmosphere without using the TC material (2-1). As a result, in Example 9, the formation of a cylindrical phase-separated structure oriented in a perpendicular direction of the surface of the substrate was observed.

Figure 11:
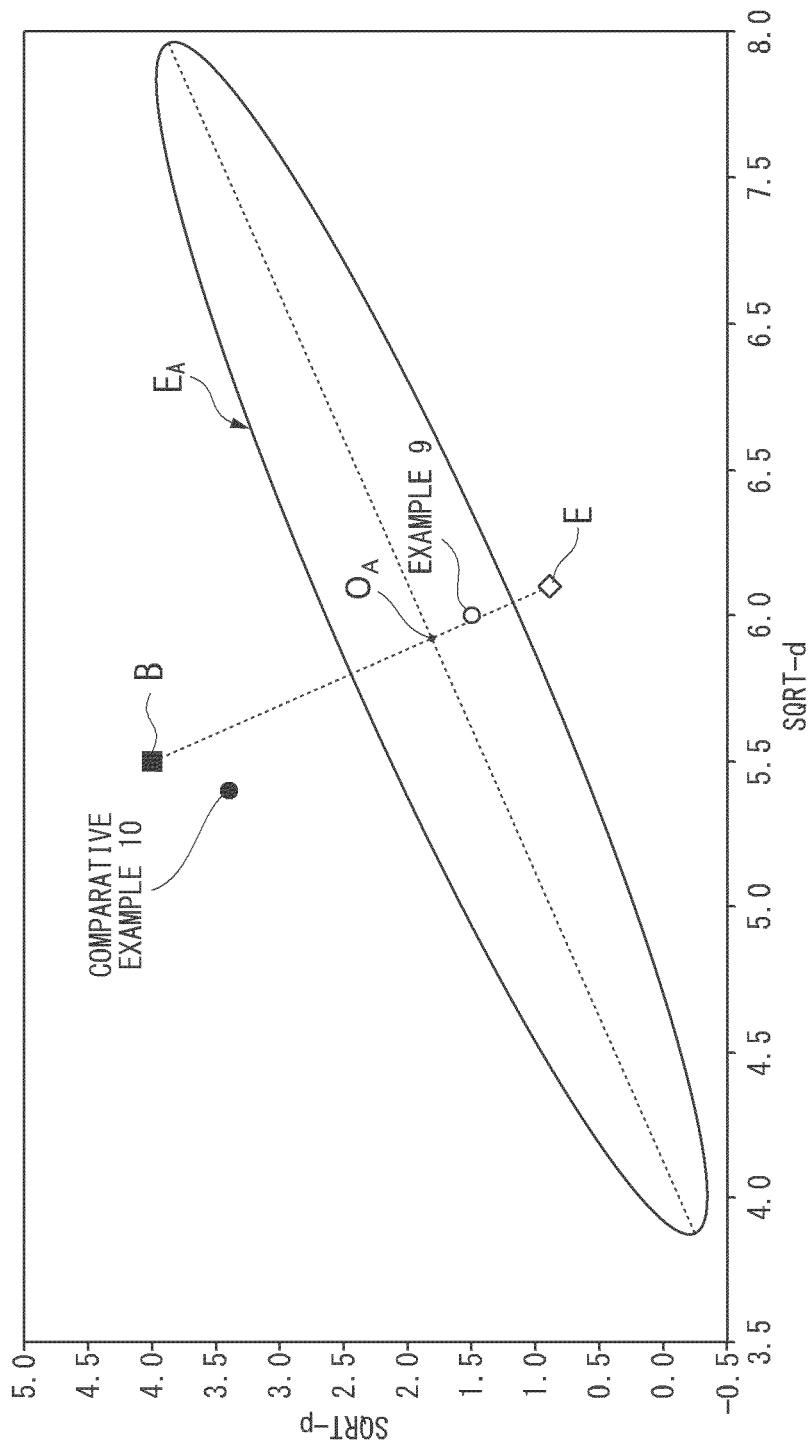
FIG. 11 is a diagram showing an example of one embodiment of the first aspect of the present invention.

The coordinate point B of the B block (square root of dispersive component: 5.4, square root of polar component: 4.0), the coordinate point E of the E block (square root of dispersive component: 6.1, square root of polar component: 0.9), and the coordinate point N of each undercoat agent (i.e., neutralization film) (dispersive component-square root $(dP_N)^{0.5}$, polar component-square root $(pP_N)^{0.5}$) were plotted. From the results, it was confirmed that the coordinate point N of the undercoat agents (i.e., neutralization films) of Example 9 was within the range of the ellipse $E_A$. The ellipse $E_A$ has the point $O_A$ as a center of the ellipse, and as shown in FIG. 11, the point $O_A$ divides the line segment BE into the length ratio of 7:3, the line segment BE is on the minor axis of the ellipse $E_A$, the minor radius is 0.4 times the length of the line segment BE, and the major radius is 3 times the length of the line segment BC.

Example 10

A pattern was formed in the same manner as described above, except that the block copolymer (7)-containing composition was used instead of the block copolymer (1)-containing composition, the undercoat agent was changed to the undercoat agent indicated in Table 4 was used, and a heat annealing treatment at 240° C. for 600 seconds was conducted under a nitrogen atmosphere without using the TC material (2-1). As a result, in Example 10, the formation of a cylindrical phase-separated structure oriented in a perpendicular direction of the surface of the substrate was observed.

Figure 12:
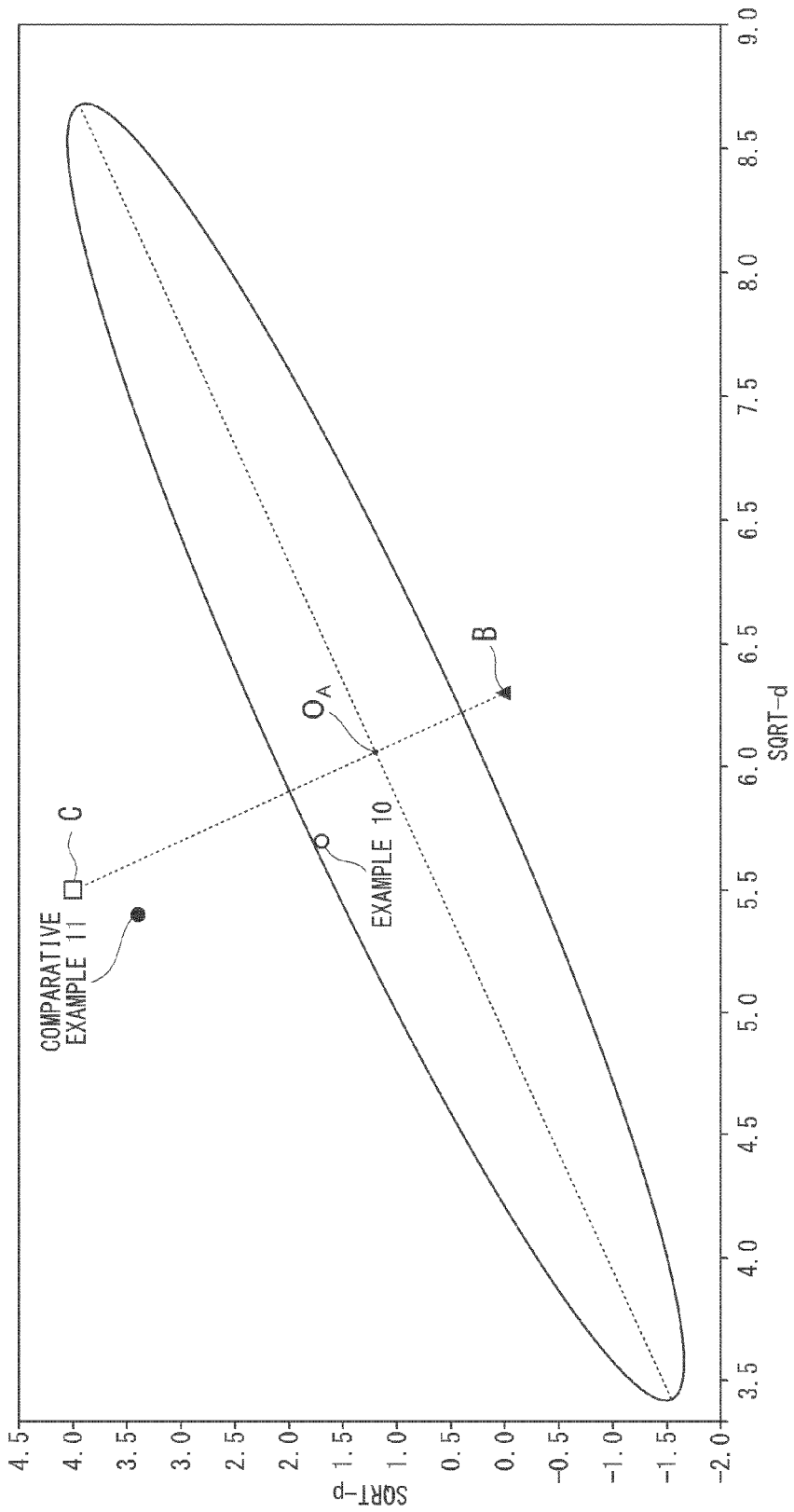
FIG. 12 is a diagram showing an example of one embodiment of the first aspect of the present invention.

The coordinate point B of the B block (square root of dispersive component: 5.4, square root of polar component: 4.0), the coordinate point C of the C block (square root of dispersive component: 6.4, square root of polar component: 2.2), and the coordinate point N of each undercoat agent (i.e., neutralization film) (square root of dispersive component $(dP_N)^{0.5}$, square root of polar component $(pP_N)^{0.5}$) were plotted. From the results, it was confirmed that the coordinate point N of the undercoat agents (i.e., neutralization films) of Example 10 was within the range of the ellipse $E_A$. The ellipse $E_A$ has the point $O_A$ as a center of the ellipse $E_A$, and as shown in FIG. 12, the point $O_A$ divides the line segment BC into the length ratio of 7:3, the line segment BC is on the minor axis of the ellipse $E_A$, the minor radius is 0.4 times the length of the line segment BC, and the major radius is 3 times the length of the line segment BC.

TABLE 4

| | Block copolymer | Undercoat agent | Pattern shape |
|---|---|---|---|
| Example 1 | Block copolymer (1) used for formation of cylinder pattern | Undercoat agent 7 | A perpendicular cylinder pattern was formed. |
| Example 2 | Block copolymer (1) used for formation of cylinder pattern | Undercoat agent 8 | A perpendicular cylinder pattern was formed. |
| Comparative Example 1 | Block copolymer (1) used for formation of cylinder pattern | Undercoat agent 1 | A pattern was not formed. |
| Comparative Example 2 | Block copolymer (1) used for formation of cylinder pattern | Undercoat agent 2 | A pattern was not formed. |
| Comparative Example 3 | Block copolymer (1) used for formation of cylinder pattern | Undercoat agent 3 | A pattern was not formed. |
| Comparative Example 4 | Block copolymer (1) used for formation of cylinder pattern | Undercoat agent 4 | A pattern was not formed. |
| Comparative Example 5 | Block copolymer (1) used for formation of cylinder pattern | Undercoat agent 5 | A pattern was not formed. |
| Comparative Example 6 | Block copolymer (1) used for formation of cylinder pattern | Undercoat agent 6 | A pattern was not formed. |
| Example 3 | Block copolymer (2) used for formation of lamellar pattern | Undercoat agent 3 | A perpendicular lamellar pattern was formed. |
| Example 4 | Block copolymer (2) used for formation of lamellar pattern | Undercoat agent 8 | A perpendicular lamellar pattern was formed. |

TABLE 4-continued

| | Block copolymer | Undercoat agent | Pattern shape |
|---|---|---|---|
| Comparative Example 7 | Block copolymer (2) used for formation of lamellar pattern | Undercoat agent 1 | A pattern was not formed. |
| Comparative Example 8 | Block copolymer (2) used for formation of lamellar pattern | Undercoat agent 4 | A pattern was not formed. |
| Example 5 | Block copolymer (3) used for formation of cylinder pattern | Undercoat agent 6 | A perpendicular cylinder pattern was formed. |
| Example 6 | Block copolymer (3) used for formation of cylinder pattern | Undercoat agent 8 | A perpendicular cylinder pattern was formed. |
| Example 7 | Block copolymer (4) used for formation of lamellar pattern | Undercoat agent 6 | A perpendicular lamellar pattern was formed |
| Example 8 | Block copolymer (5) used for formation of lamellar pattern | Undercoat agent 9 | A perpendicular lamellar pattern was formed. |
| Comparative Example 9 | Block copolymer (5) used for formation of lamellar pattern | Undercoat agent 12 | A pattern was not formed. |
| Example 9 | Block copolymer (6) used for formation of cylinder pattern | Undercoat agent 10 | A perpendicular cylinder pattern was formed. |
| Comparative Example 10 | Block copolymer (6) used for formation of cylinder pattern | Undercoat agent 12 | A pattern was not formed. |
| Example 10 | Block copolymer (7) used for formation of cylinder pattern | Undercoat agent 11 | A perpendicular cylinder pattern was formed. |
| Comparative Example 11 | Block copolymer (7) used for formation of cylinder pattern | Undercoat agent 12 | A pattern was not formed. |

As seen from the results, it was confirmed that, when the under coat agent of the present invention was used, a phase-separated structure of the block copolymer was formed, and an excellent perpendicular pattern was formed.

DESCRIPTION OF REFERENCE NUMERALS AND CHARACTERS

1: substrate, 2: layer composed of neutralization film, 3: layer containing block copolymer, 3a: phase composed of $P_B$ block, 3b: phase composed of $P_A$ block While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a structure containing a phase-separated structure, comprising:
applying an undercoat agent to a substrate, so as to form a neutralization film on the substrate;
applying a block copolymer composition to the neutralization film, so as to form a block copolymer layer on the neutralization film, the block copolymer having a PA block and a PB block being mutually bonded; and
annealing the block copolymer layer; and
forming a phase-separated structure selected from the group consisting of a PA matrix cylindrical structure, a lamellar structure, or a PB matrix cylindrical structure, wherein a surface free energy of the $P_A$ block as represented by a coordinate point A of the PA block, a surface free energy of the $P_B$ block as represented by a coordinate point B of the PB block and a surface free energy of the neutralization film as represented by a coordinate point N of the neutralization film are determined from the following formulae:

$$\gamma S = \gamma SL + \gamma L \cos\theta \quad (1)$$

$$WSL = \gamma S + \gamma L - \gamma SL \quad (2)$$

$$WSL = \gamma L(1 + \cos\theta) \quad (3)$$

$$\gamma SL = \gamma S + \gamma L - 4\gamma Sd\gamma Ld/(\gamma Sd + \gamma Ld) - 4\gamma Sp\gamma Lp/(\gamma Sp + \gamma Lp)$$

wherein each of said coordinate points A, B and N are in a plane of coordinates having an X-axis of square root of the dispersive component (d)0.5 and a Y-axis of square root of the polar component (p)0.5,
wherein γS represents a surface tension of a solid selected from a PA block homopolymer film, a PB block homopolymer film or the neutralization film; γL represents a surface tension of a liquid disposed on a surface of the solid; γSL represents an interface tension between the solid and the liquid; θ represents a contact angle formed between tangential line drawn to a droplet of the liquid and the surface of the solid; WSL represents work of adhesion between the liquid and the solid; γSd represents a dispersive component of the surface free energy of the solid; γSp represents a polar component of the surface free energy of the solid; γLd represents a dispersive component of the surface free energy of the liquid; and γLp represents a liquid component of the surface free energy of the liquid,
wherein, when the phase-separated structure is the $P_A$ matrix cylindrical structure, a coordinate point N of the neutralization film is within the range of an ellipse $E_A$, wherein a point $O_A$ is a center of the ellipse $E_A$ and divides a line segment AB in the ratio of 3:7, the line segment AB is on a minor axis of the ellipse $E_A$, a minor radius of the ellipse $E_A$ is 0.4 times the length of the line segment AB, and a major radius of the ellipse $E_A$ is 3 times the length of the line segment AB;
wherein, when the phase-separated structure is the lamellar structure, the coordinate point N of the neutralization film is within the range of an ellipse E, wherein a point O is a center of the ellipse E and divides a line segment AB in the ratio of 5:5, the line segment AB is on a minor axis of the ellipse E, a minor radius of the ellipse E is 0.6 times the length of the line segment AB, and a major radius of the ellipse E is 3 times the length of the line segment AB; and
wherein, when the phase-separated structure is the $P_B$ matrix cylindrical structure, the coordinate point N of the neutralization film is within the range of an ellipse $E_B$, wherein a point $O_B$ is a center of the ellipse $E_B$ and divides a line segment AB in the ratio of 7:3, the line segment AB is on a minor axis of the ellipse $E_B$, a minor radius of the ellipse $E_B$ is 0.4 times the length of the line segment AB, and a major radius of the ellipse $E_B$ is 3 times the length of the line segment AB.

2. The method according to claim 1, wherein the coordinate point N of the neutralization film is within the range of the ellipse $E_A$, wherein the point $O_A$ is the center of the ellipse $E_A$ and divides the line segment AB in the ratio of 3:7, the line segment AB is on the minor axis of the ellipse $E_A$, the minor radius is 0.4 times the length of the line segment AB, and the major radius is 3 times the length of the line segment AB, wherein the volume of the $P_B$ block in the block copolymer is rendered smaller than the volume of the $P_A$ block in the block copolymer, such that a $P_A$ matrix cylindrical structure in which the phase of the $P_B$ block having a cylindrical structure is present within the phase of the $P_A$ block is formed.

3. The method according to claim 1, wherein the coordinate point N of the neutralization film is within the range of the ellipse E, wherein the point O is the center of the ellipse E and divides the line segment AB in the ratio of 5:5, the line segment AB is on the minor axis of the ellipse E, the minor radius is 0.6 times the length of the line segment AB, and the major radius is 3 times the length of the line segment AB, wherein the volume of the $P_B$ block is rendered substantially the same as the volume of the $P_A$ block in the block copolymer, such that a lamellar structure in which the phase of the $P_A$ block and the phase of the $P_B$ block are alternately-arranged is formed.

4. The method according to claim 1, wherein the coordinate point N of the neutralization film is within the range of the ellipse $E_B$, wherein a point $O_B$ is the center of the ellipse $E_B$ and divides a line segment AB in the ratio of 7:3, the line segment AB is on the minor axis of the ellipse $E_B$, the minor radius is 0.4 times the length of the line segment AB, and the major radius of the ellipse $E_B$ is 3 times the length of the line segment AB, wherein the volume of the $P_A$ block is rendered smaller than the volume of the $P_B$ block in the block copolymer, such that a $P_B$ matrix cylindrical structure in which the phase of the $P_A$ block having a cylindrical structure is present within the phase of the $P_B$ block is formed.

5. The method according to claim 1, wherein, in the plane of coordinates, the line segment AN is at least 0.1 times the length of the line segment AB.

6. The method according to claim 1, wherein the combination of the $P_A$ block and the $P_B$ block comprises at least two blocks selected from the group consisting of a block containing a structural unit represented by general formula (a0-1) shown below, a block composed of the structural units derived from styrene or a derivative thereof, or a block composed of the structural unit derived from (α-substituted) acrylate ester:

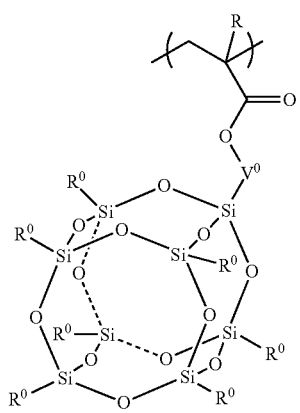

(a0-1)

wherein R represents a hydrogen atom, an alkyl group of 1 to 5 carbon atoms or a halogenated alkyl group of 1 to 5 carbon atoms; $V^0$ represents a divalent hydrocarbon group which may have a substituent; and $R^0$ represents a monovalent hydrocarbon group which may have a substituent, wherein the plurality of $R^0$ may be the same or different from each other.

7. The method according to claim 1, comprising: a step in which a guide pattern is formed after the step in which the layer composed of the neutralization film is formed.

8. The method according to claim 1, comprising: a step in which a topcoat material is applied to the layer containing a block copolymer to form a top coat film.

9. A method of forming a pattern, comprising: a step in which a phase comprising at least one block is selectively removed from a structure containing a phase-separated structure to form a pattern, the structure being produced by a method of claim 1.

10. A method of forming a fine pattern, comprising: a step in which a substrate is subjected to etching treatment using a pattern of claim 9 as a mask.

11. The method according to claim 6, wherein the neutralization film comprises a resin component (A) including a structural unit (ba0-3) that has a substrate interaction group, and at least one structural unit selected from the group consisting of a structural unit represented by general formula (ba0-1) shown below and a structural unit represented by general formula (ba0-2) shown below:

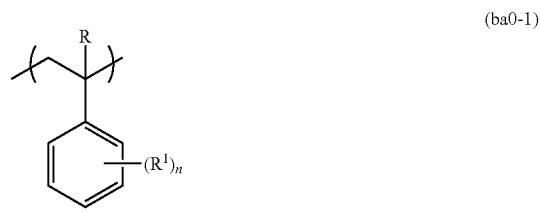

(ba0-1)

wherein R represents a hydrogen atom, an alkyl group of 1 to 5 carbon atoms or a halogenated alkyl group of 1 to 5 carbon atoms; $R^1$ represents a halogen atom or an organic group selected from a linear, branched or cyclic organic group of 1 to 20 carbon atoms which may contain an oxygen atom, halogen atom or silicon atom and a combination of these groups; and n represents an integer of 0 to 5;

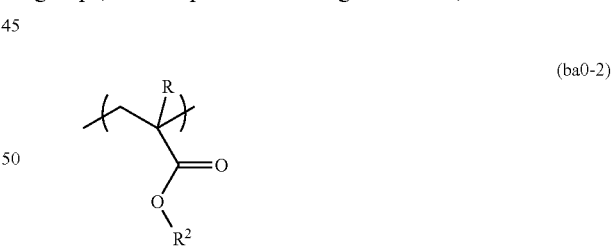

(ba0-2)

wherein R represents a hydrogen atom, an alkyl group of 1 to 5 carbon atoms or a halogenated alkyl group of 1 to 5 carbon atoms; and $R^2$ represents an organic group selected from a linear, branched or cyclic organic group of 1 to 20 carbon atoms which may contain an oxygen atom, fluorine atom or silicon atom and a combination of these groups.

12. The method according to claim 11, wherein the substrate interaction group in the structural unit (ba0-3) is at least one group selected from the group consisting of a carboxy group, a hydroxy group, a cyano group, an azide group, an amino group, a trialkoxysilyl group, a dialkoxysilyl group and a mono-alkoxysilyl group.

13. The method according to claim 12, wherein the structural unit (ba0-3) is at least one structural unit selected from the group constituting of structural units represented by formulae (ba0-3-1) to (ba0-3-4) shown below:

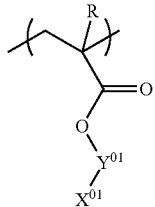

(ba0-3-1)

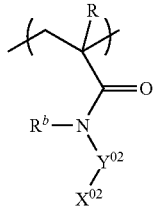

(ba0-3-2)

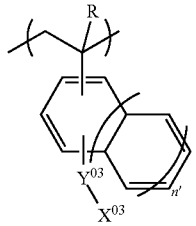

(ba0-3-3)

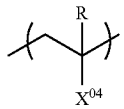

(ba0-3-4)

wherein R represents a hydrogen atom, an alkyl group of 1 to 5 carbon atoms or a halogenated alkyl group of 1 to 5 carbon atoms; $R^b$ represents a hydrogen atom or an alkyl group of 1 to 5 carbon atoms; $Y^{01}$ represents a divalent linking group; $Y^{02}$ represents a divalent linking group; $Y^{03}$ represents a single bond or a divalent linking group; n' represents an integer of 0 to 2; and $X^{01}$ to $X^{04}$ each independently represents a substrate interaction group.

14. The method according to claim 13, wherein the structural unit (ba0-3) is a structural unit represented by general formula (1) shown below:

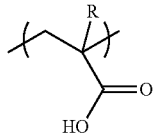

(1)

wherein R represents a hydrogen atom, an alkyl group of 1 to 5 carbon atoms or a halogenated alkyl group of 1 to 5 carbon atoms.

15. The method of according to claim 9, wherein:
the phase-separated structure is a $P_A$ matrix cylindrical structure;
the $P_A$ block is at least one block selected from the group consisting of a block composed of a structural unit represented by general formula (a0-1) shown below, a block of polystyrene, a block of poly(trimethylsilylstylene) and a block of poly(t-butylstyrene); and the $P_B$ block is at least one block selected from the group consisting of a block of poly(methyl methacrylate), and a block of polystyrene, wherein
the $P_B$ block is selectively removed from the structure containing a phase-separated structure:

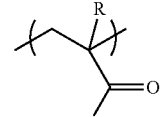
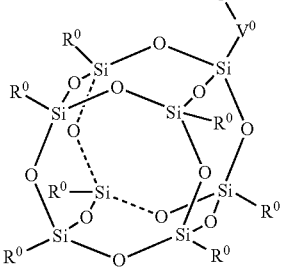

(a0-1)

wherein R represents a hydrogen atom, an alkyl group of 1 to 5 carbon atoms or a halogenated alkyl group of 1 to 5 carbon atoms; $V^0$ represents a divalent hydrocarbon group which may have a substituent; and $R^0$ represents a monovalent hydrocarbon group which may have a substituent, wherein the plurality of $R^0$ may be the same or different from each other.

16. The method according to claim 9, wherein:
the phase-separated structure is a lamellar structure;
the $P_A$ block is at least one block selected from the group consisting of a block composed of a structural unit represented by general formula (a0-1) shown below, a block of polystyrene, a block of poly(trimethylsilylstylene) and a block of poly(t-butylstyrene); and
the $P_B$ block is at least one block selected from the group consisting of a block of poly(methyl methacrylate), and a block of polystyrene, wherein
the $P_B$ block is selectively removed from the structure containing a phase-separated structure:

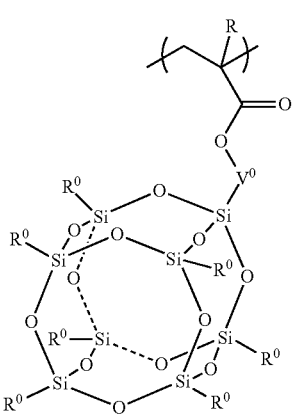

(a0-1)

wherein R represents a hydrogen atom, an alkyl group of 1 to 5 carbon atoms or a halogenated alkyl group of 1 to 5 carbon atoms; $V^0$ represents a divalent hydrocarbon group which may have a substituent; and $R^0$ represents a monovalent hydrocarbon group which may have a substituent, wherein the plurality of $R^0$ may be the same or different from each other.

17. The method of according to claim 9, wherein:

the phase-separated structure is a $P_B$ matrix cylindrical structure;

the $P_A$ block is at least one block selected from the group consisting of a block composed of a structural unit represented by general formula (a0-1) shown below, a block of polystyrene, a block of poly(trimethylsilylstylene) and a block of poly(t-butylstyrene); and the $P_B$ block is at least one block selected from the group consisting of a block of poly(methyl methacrylate), and a block of polystyrene, wherein the $P_B$ block is selectively removed from the structure containing a phase-separated structure:

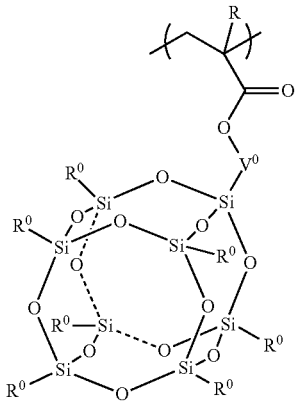

(a0-1)

wherein R represents a hydrogen atom, an alkyl group of 1 to 5 carbon atoms or a halogenated alkyl group of 1 to 5 carbon atoms; $V^0$ represents a divalent hydrocarbon group which may have a substituent; and $R^0$ represents a monovalent hydrocarbon group which may have a substituent, wherein the plurality of $R^0$ may be the same or different from each other.

* * * * *